(12) United States Patent
Tokunaga et al.

(10) Patent No.: US 9,583,634 B2
(45) Date of Patent: *Feb. 28, 2017

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventors: Hajime Tokunaga, Yokohama (JP); Takuya Handa, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/585,904

(22) Filed: Dec. 30, 2014

(65) Prior Publication Data

US 2015/0115262 A1 Apr. 30, 2015

Related U.S. Application Data

(63) Continuation of application No. 13/953,316, filed on Jul. 29, 2013, now Pat. No. 9,209,256.

(30) Foreign Application Priority Data

Aug. 2, 2012 (JP) ................... 2012-171786

(51) Int. Cl.
*H01L 29/04* (2006.01)
*H01L 31/036* (2006.01)
(Continued)

(52) U.S. Cl.
CPC .... *H01L 29/7869* (2013.01); *H01L 21/02472* (2013.01); *H01L 21/02483* (2013.01);
(Continued)

(58) Field of Classification Search
CPC .................. H01L 27/1214; H01L 29/4908
(Continued)

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Kamiya.T et al., "Carrier transport properties and electronic structures of amorphous oxide semiconductors: the present status", Solid State Physics, Sep. 1, 2009, vol. 44, No. 9, pp. 621-633, Agne Gijutsu Center.
(Continued)

*Primary Examiner* — Hoai V Pham
(74) *Attorney, Agent, or Firm* — Eric J. Robinson; Robinson Intellectual Property Law Office, P.C.

(57) ABSTRACT

To provide a semiconductor device which has transistor characteristics with little variation and includes an oxide semiconductor. The semiconductor device includes an insulating film over a conductive film and an oxide semiconductor film over the insulating film. The oxide semiconductor film includes a first oxide semiconductor layer, a second oxide semiconductor layer over the first oxide semiconductor layer, and a third oxide semiconductor layer over the second oxide semiconductor layer. The energy level of a bottom of a conduction band of the second oxide semiconductor layer is lower than those of the first and third oxide semiconductor layers. An end portion of the second oxide
(Continued)

semiconductor layer is positioned on an inner side than an end portion of the first oxide semiconductor layer.

34 Claims, 18 Drawing Sheets

(51) Int. Cl.
  H01L 29/786 (2006.01)
  H01L 29/24 (2006.01)
  H01L 21/02 (2006.01)
  H01L 29/66 (2006.01)
  H01L 27/146 (2006.01)

(52) U.S. Cl.
  CPC .. *H01L 21/02488* (2013.01); *H01L 21/02505* (2013.01); *H01L 21/02554* (2013.01); *H01L 21/02565* (2013.01); *H01L 27/14632* (2013.01); *H01L 27/14687* (2013.01); *H01L 29/24* (2013.01); *H01L 29/66969* (2013.01); *H01L 29/78693* (2013.01); *H01L 29/78696* (2013.01)

(58) Field of Classification Search
  USPC ........ 257/59, 60, 72, 347, E29.117, E29.273
  See application file for complete search history.

(56) References Cited

U.S. PATENT DOCUMENTS

| | | | |
|---|---|---|---|
| 6,146,928 A | 11/2000 | Ishiguro et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,910,490 B2 | 3/2011 | Akimoto et al. |
| 7,923,722 B2 | 4/2011 | Ryu et al. |
| 7,932,521 B2 | 4/2011 | Akimoto et al. |
| 7,994,500 B2 | 8/2011 | Kim et al. |
| 8,058,645 B2 | 11/2011 | Jeong et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,274,077 B2 | 9/2012 | Akimoto et al. |
| 8,274,078 B2 | 9/2012 | Itagaki et al. |
| 8,389,989 B2 | 3/2013 | Yamazaki et al. |
| 8,421,083 B2 | 4/2013 | Yamazaki et al. |
| 8,471,256 B2 | 6/2013 | Yamazaki et al. |
| 8,497,502 B2 | 7/2013 | Yaegashi |
| 8,692,252 B2 | 4/2014 | Takata et al. |
| 8,890,152 B2 | 11/2014 | Yamazaki et al. |
| 8,916,867 B2 | 12/2014 | Koezuka |
| 9,245,958 B2 | 1/2016 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308797 A1 | 12/2008 | Akimoto et al. |
| 2008/0308804 A1 | 12/2008 | Akimoto et al. |
| 2008/0308806 A1 | 12/2008 | Akimoto et al. |
| 2009/0068773 A1 | 3/2009 | Lai et al. |
| 2009/0073325 A1 | 3/2009 | Kuwabara et al. |
| 2009/0081826 A1 | 3/2009 | Cowdery-Corvan et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0206332 A1 | 8/2009 | Son et al. |
| 2009/0239335 A1 | 9/2009 | Akimoto et al. |
| 2009/0250693 A1 | 10/2009 | Jeong et al. |
| 2009/0278122 A1 | 11/2009 | Hosono et al. |
| 2009/0280600 A1 | 11/2009 | Hosono et al. |
| 2009/0321731 A1 | 12/2009 | Jeong et al. |
| 2010/0038641 A1 | 2/2010 | Imai |
| 2010/0065844 A1 | 3/2010 | Tokunaga |

(56) References Cited

U.S. PATENT DOCUMENTS

| | | |
|---|---|---|
| 2010/0092800 A1 | 4/2010 | Itagaki et al. |
| 2010/0109002 A1 | 5/2010 | Itagaki et al. |
| 2010/0176383 A1 | 7/2010 | Park et al. |
| 2010/0181565 A1 | 7/2010 | Sakata et al. |
| 2010/0301329 A1 | 12/2010 | Asano et al. |
| 2010/0320458 A1 | 12/2010 | Umeda et al. |
| 2010/0320459 A1 | 12/2010 | Umeda et al. |
| 2011/0073856 A1 | 3/2011 | Sato et al. |
| 2011/0089417 A1 | 4/2011 | Yamazaki et al. |
| 2011/0090204 A1 | 4/2011 | Yamazaki et al. |
| 2011/0127524 A1 | 6/2011 | Yamazaki et al. |
| 2011/0140100 A1 | 6/2011 | Takata et al. |
| 2011/0156026 A1 | 6/2011 | Yamazaki et al. |
| 2011/0193083 A1 | 8/2011 | Kim et al. |
| 2011/0215328 A1 | 9/2011 | Morosawa et al. |
| 2011/0240990 A1 | 10/2011 | Yamazaki |
| 2011/0240991 A1 | 10/2011 | Yamazaki |
| 2011/0240992 A1 | 10/2011 | Yamazaki |
| 2011/0240993 A1 | 10/2011 | Yamazaki |
| 2011/0240994 A1 | 10/2011 | Yamazaki |
| 2011/0240995 A1 | 10/2011 | Yamazaki |
| 2011/0248260 A1 | 10/2011 | Yamazaki |
| 2011/0298027 A1 | 12/2011 | Isobe et al. |
| 2012/0043541 A1 | 2/2012 | Godo et al. |
| 2012/0061662 A1 | 3/2012 | Yamazaki et al. |
| 2012/0119205 A1 | 5/2012 | Taniguchi et al. |
| 2012/0129288 A1 | 5/2012 | Kobayashi et al. |
| 2012/0132903 A1 | 5/2012 | Yamazaki et al. |
| 2012/0149147 A1 | 6/2012 | Yamazaki et al. |
| 2012/0153278 A1 | 6/2012 | Jeong et al. |
| 2012/0181534 A1 | 7/2012 | Hatano |
| 2012/0280227 A1 | 11/2012 | Wakana et al. |
| 2012/0305913 A1 | 12/2012 | Yamazaki et al. |
| 2012/0319102 A1 | 12/2012 | Yamazaki et al. |
| 2012/0319114 A1 | 12/2012 | Yamazaki et al. |
| 2012/0319183 A1 | 12/2012 | Yamazaki et al. |
| 2013/0009209 A1 | 1/2013 | Yamazaki |
| 2013/0009219 A1 | 1/2013 | Yamazaki et al. |
| 2013/0009220 A1 | 1/2013 | Yamazaki et al. |
| 2013/0082255 A1 | 4/2013 | Akimoto et al. |
| 2013/0087785 A1 | 4/2013 | Akimoto et al. |
| 2013/0320330 A1 | 12/2013 | Yamazaki |
| 2013/0320334 A1 | 12/2013 | Yamazaki et al. |
| 2013/0334523 A1 | 12/2013 | Yamazaki |
| 2013/0334533 A1 | 12/2013 | Yamazaki |
| 2014/0001465 A1 | 1/2014 | Yamazaki |
| 2014/0008647 A1 | 1/2014 | Yamazaki |
| 2014/0014947 A1 | 1/2014 | Yamazaki |
| 2014/0027743 A1 | 1/2014 | Nishido |
| 2014/0027762 A1 | 1/2014 | Tsurume et al. |
| 2014/0034945 A1* | 2/2014 | Tokunaga ............... H01L 29/24 257/43 |
| 2014/0042433 A1 | 2/2014 | Yamazaki |
| 2014/0042434 A1 | 2/2014 | Yamazaki |
| 2014/0042435 A1 | 2/2014 | Yamazaki |
| 2014/0042436 A1 | 2/2014 | Yamazaki |
| 2014/0042437 A1 | 2/2014 | Yamazaki |
| 2014/0042438 A1 | 2/2014 | Yamazaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-270617 A | 9/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2009-231613 A | 10/2009 |
| JP | 2010-016347 A | 1/2010 |
| JP | 2010-034534 A | 2/2010 |
| JP | 2010-067954 A | 3/2010 |
| JP | 2010-073881 A | 4/2010 |
| JP | 2010-177431 A | 8/2010 |
| JP | 2011-124360 A | 6/2011 |
| JP | 2011-155249 A | 8/2011 |
| JP | 2011-243745 A | 12/2011 |
| JP | 2012-160679 A | 8/2012 |
| WO | WO-2004/114391 | 12/2004 |
| WO | WO-2011/065329 | 6/2011 |

OTHER PUBLICATIONS

Kim.T et al., "Effect of the Ga Ratio on the Dielectric Function of Solution-processed InGaZnO Films", J. Korean Phys. Soc.(Journal of the Korean Physical Society), Dec. 1, 2011, vol. 59, No. 6, pp. 3396-3400.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m=3, 4, and 5), $InGaO_3(ZnO)_3$, $Ga_2O_3(ZnO)_m$ (m=7, 8, 9, and 16) in the $In_2O_3$—$ZnGa_2O_4$—ZnO Systems", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

(56) References Cited

OTHER PUBLICATIONS

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID digest '09: SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs", IDW '09: Proceedings of the 16th International Display Workshops, 2009, pp. 689-692.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZnO TFT", IMID '07 Digest, 2007, pp. 1249-1252.

Godo.H et al., "Temperature Dependence of Characteristics and Electronic Structure for Amorphous In—Ga—Zn—Oxide TFT", AM-FPD '09 Digest of Technical papers, Jul. 1, 2009, pp. 41-44.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—BO systems[A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett.(Physical Review Letters), May 4, 1981, vol. 46, No. 18, pp. 1216-1219.

(56) References Cited

OTHER PUBLICATIONS

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B. (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nakayama et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.

Nathan.A et al., "Amorphous Oxide TFTs: Progress and Issues", SID Digest '12 : SID International Symposium Digest of Technical Papers, Jun. 5, 2012, vol. 43, No. 1, pp. 1-4.

Ono.M et al., "Novel High Performance IGZO-TFT with High Mobility over 40 cm2/Vs and High Photostability Incorporated Oxygen Diffusion", IDW'11: Proceedings of the 16th International Display Workshops, Dec. 7, 2011, pp. 1689-1690.

* cited by examiner

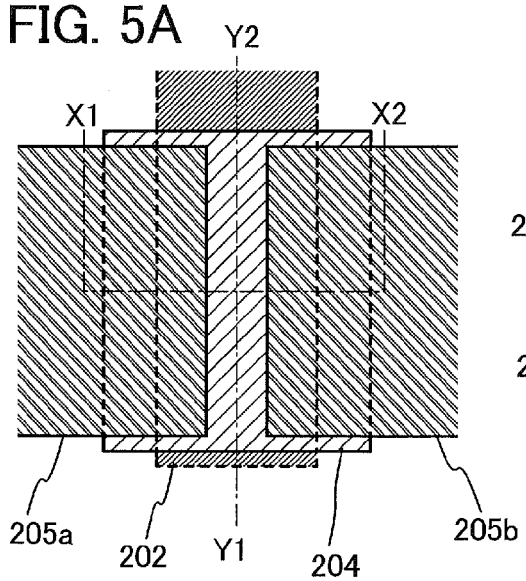
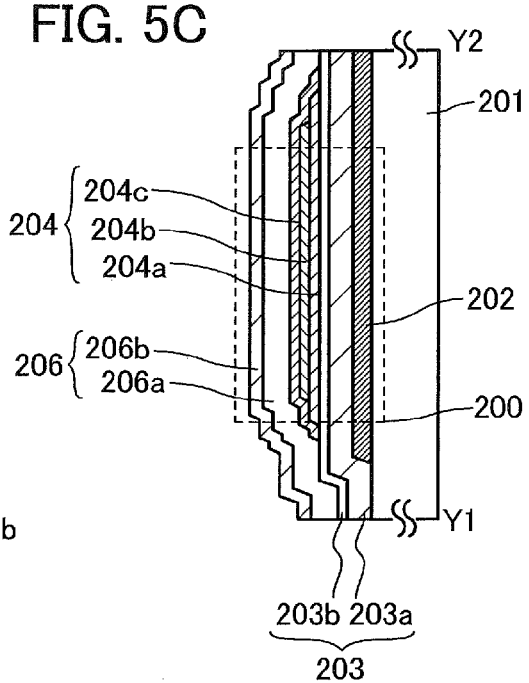
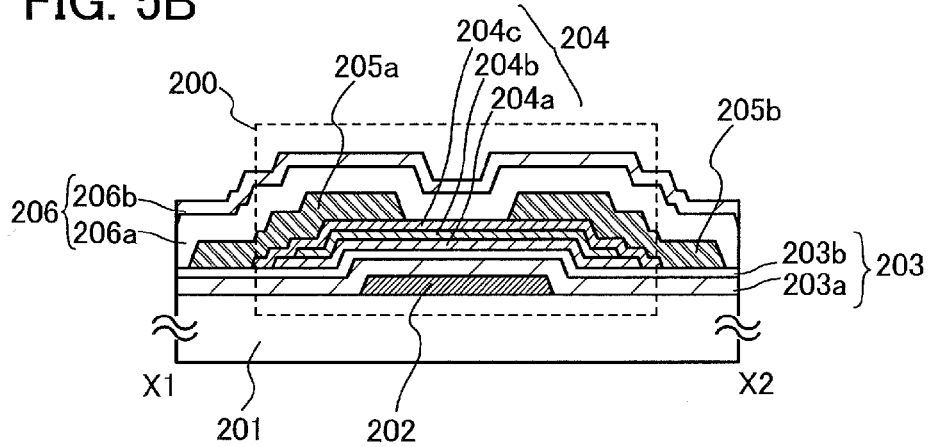
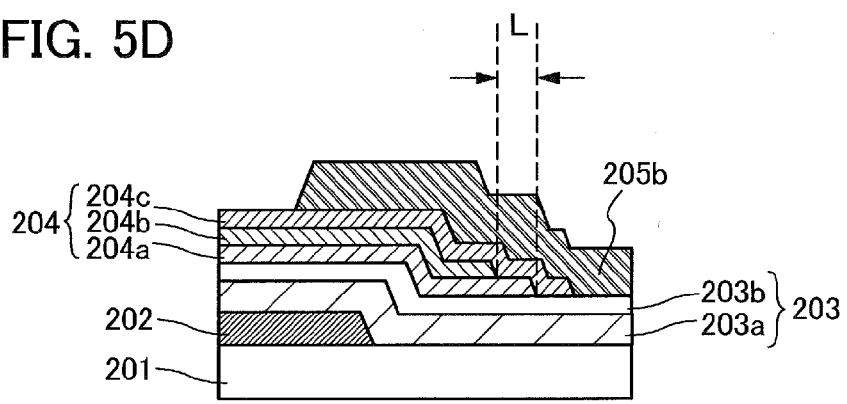

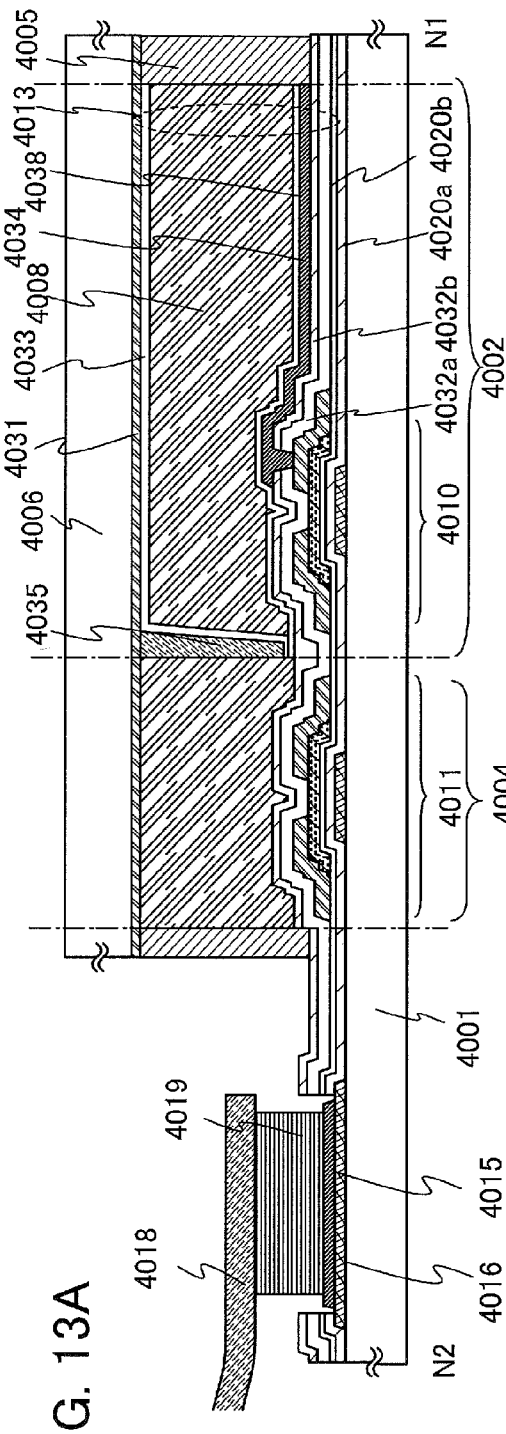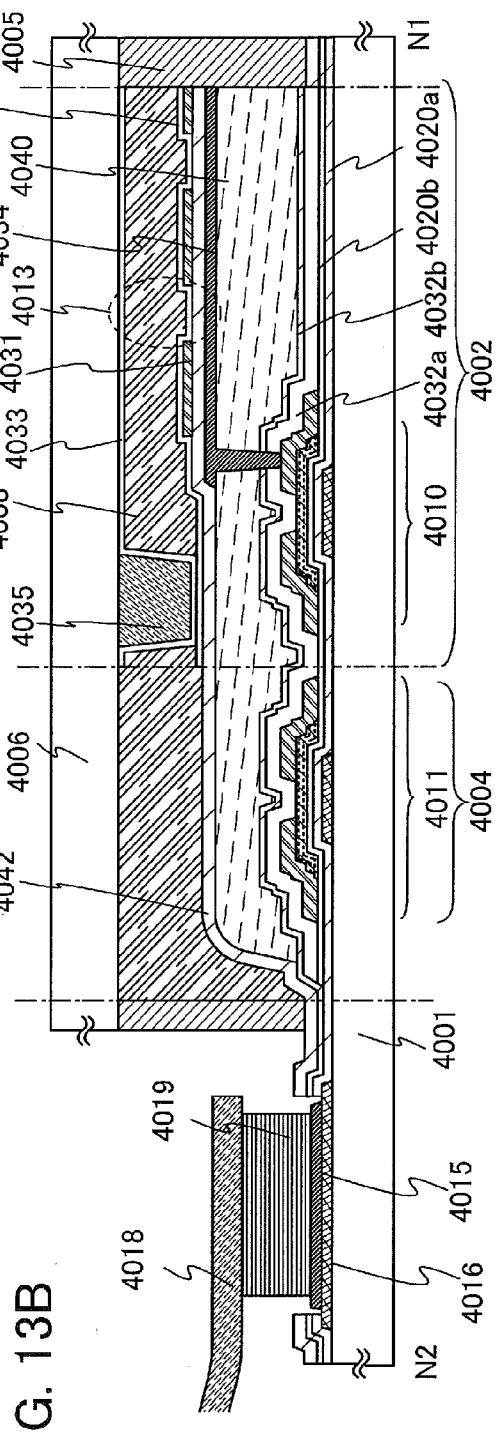

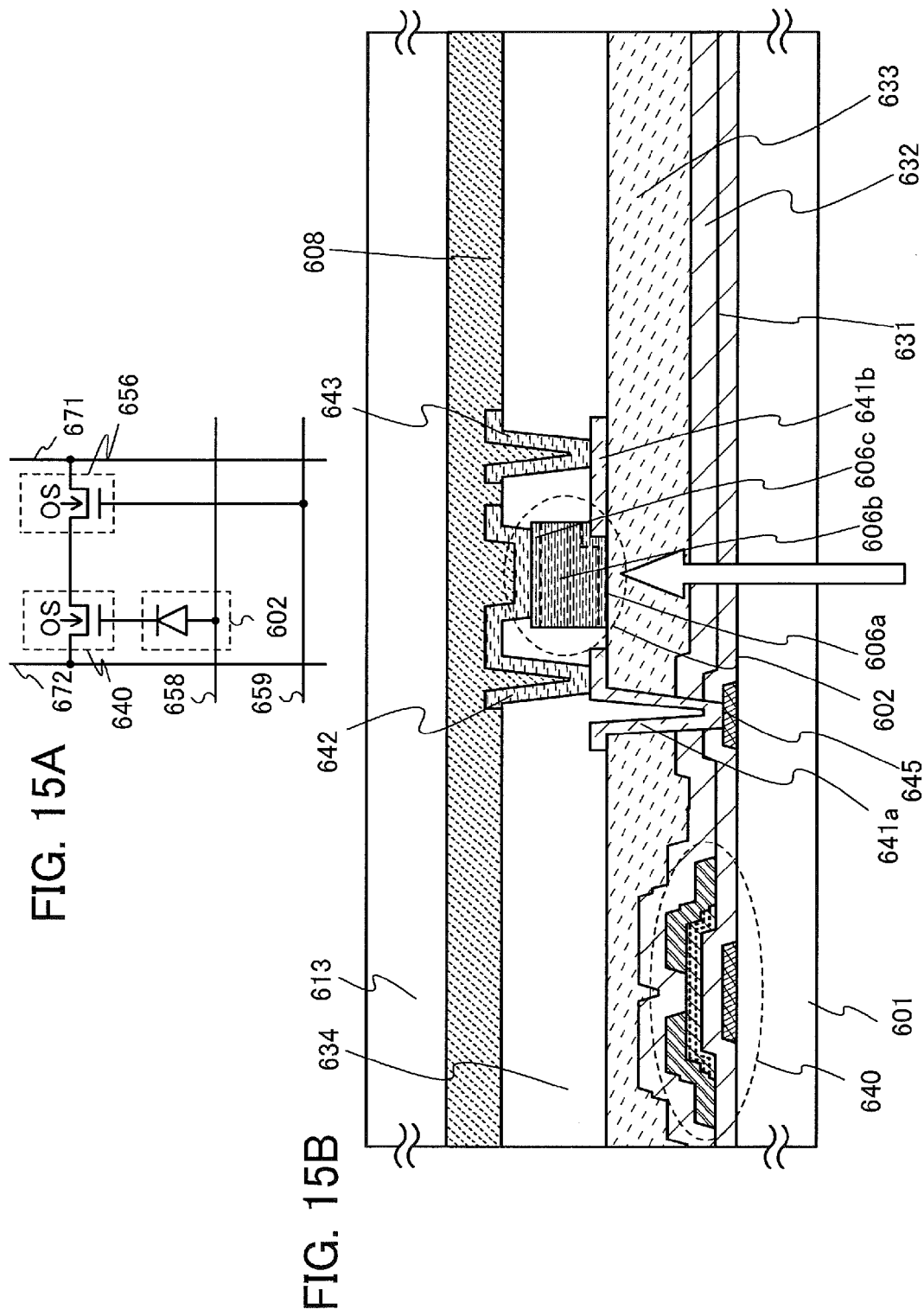

SEMICONDUCTOR DEVICE AND METHOD FOR MANUFACTURING THE SAME

BACKGROUND OF THE INVENTION

1. Field of the Invention

The present invention relates to a semiconductor device including an oxide semiconductor and a manufacturing method thereof.

In this specification, a semiconductor device generally means a device which can function by utilizing semiconductor characteristics, and an electrooptic device, a semiconductor circuit, and electronic equipment are all included in the category of semiconductor devices.

2. Description of the Related Art

Transistors using a semiconductor thin film which is formed over a substrate having an insulating surface are widely used in electronic devices such as integrated circuits (ICs) and image display devices (also simply referred to as display devices). A silicon-based semiconductor material is widely known as a material for a semiconductor thin film applicable to such a transistor. In recent years, an oxide semiconductor has attracted attention.

Examples of such a transistor include a transistor in which zinc oxide (ZnO) is used as an oxide semiconductor and a transistor in which $InGaO_3(ZnO)_m$ is used as an oxide semiconductor. A technique in which a switching element, such as a transistor, in which a channel formation region is formed in an oxide semiconductor film is used for manufacturing an active matrix display device has also been developed.

Patent Document 1 discloses a three-layer structure in which a first multi-component oxide semiconductor layer is provided over a substrate, a one-component oxide semiconductor layer is stacked over the first multi-component oxide semiconductor layer, and a second multi-component oxide semiconductor layer is stacked over the one-component oxide semiconductor layer.

Non-Patent Document 1 discloses a transistor including a stack of oxide semiconductors.

REFERENCE

Patent Document

[Patent Document 1] Japanese Published Patent Application No. 2011-155249

Non-Patent Document

[Non-Patent Document 1] Arokia Nathan et al., "Amorphous Oxide TFTs: Progress and Issues", SID 2012 Digest, pp. 1-4

SUMMARY OF THE INVENTION

In the case where a transistor including an oxide semiconductor film is formed, the following problems occur. Firstly, in the case where a silicon oxide film is used as a gate insulating film of a bottom-gate transistor, it is known that silicon in the silicon oxide film is diffused into an oxide semiconductor layer when the oxide semiconductor layer is formed over the gate insulating film. A region of the oxide semiconductor layer where silicon is diffused includes many trap states. For that reason, when the region is irradiated with light, a current path (channel) of the transistor is affected, so that characteristics of the transistor largely change. Such a degradation of the transistor is called gate-bias stress photodegradation. In order to suppress this gate-bias stress photodegradation, it is needed that a current path is not formed in the region of the oxide semiconductor layer where silicon is diffused. Thus, the oxide semiconductor film in contact with the gate insulating film is required to be formed using a material having a large bandgap and a small electron affinity.

Secondly, in the case where an oxide semiconductor film in contact with a protective film includes many oxygen vacancies, variation in transistor characteristics is increased and a problem such as a normally-on state of the transistor due to a negative shift of threshold voltage of the transistor (movement of the threshold voltage in a negative direction) arises. Therefore, it is required that oxygen vacancies are reduced in the oxide semiconductor film in contact with the protective film.

Thirdly, it is important for an oxide semiconductor film in which a current pass is formed to have large field-effect mobility, and a material having a small bandgap and a large electron affinity is required to be used.

In order to solve the above problems, an oxide semiconductor film having a structure in which three oxide semiconductor layers having different bandgaps are stacked can be used. Each oxide semiconductor layer has a specific function. That is, for the oxide semiconductor film, the following three oxide semiconductor layers having properties required for respective layers are stacked: an oxide semiconductor layer in contact with a gate insulating film, an oxide semiconductor layer in contact with an insulating film covering the oxide semiconductor film, and an oxide semiconductor layer in which a current path is mainly formed. In other words, the oxide semiconductor layer functioning as a current path of a transistor is sandwiched between oxide semiconductor layers having lower carrier density than the oxide semiconductor layer and functioning as buffer layers for stabilizing an interface between a channel and an insulating film. With such a structure, the channel can be separated from the interface between the oxide semiconductor layer and the insulating layer in contact with the oxide semiconductor layer, so that a buried channel can be formed. Thus, a transistor which is normally-off and has little variation in characteristics, high mobility, and high reliability can be provided.

As described above, it is considered that physical properties of a large bandgap and a small electron affinity, that is, physical properties which make it hard to form a current path are suitable for particularly the oxide semiconductor layer in contact with the gate insulating film.

However, an oxide semiconductor layer having such physical properties has a low etching rate by an etchant, and as a result, etching progresses in another oxide semiconductor layer stacked thereover in a lateral direction, so that the etching amount becomes extremely large. This causes a problem in that an oxide semiconductor layer in a lower layer, which has the above physical properties, and another oxide semiconductor layer stacked thereover have significantly different planar shapes. In this case, it is particularly difficult to process an oxide semiconductor film into a minute island-shaped pattern and manufacture a minute semiconductor device.

On the other hand, in the case where an oxide semiconductor film is formed by dry etching, the following problems arise. That is, in an oxide semiconductor layer functioning as a current path, oxygen vacancies are easily formed in the process into an island-shaped pattern by dry etching, and in particular, many defects occur at an end portion of the island-shaped pattern exposed to a dry etching atmosphere. Thus, conductivity of the end portion of the island-shaped pattern becomes n-type. When the end portion of the island-shaped pattern becomes n-type, the portion might function as a parasitic channel, which might cause an increase in variation in transistor characteristics and variation in transistor characteristics for long-term use. Occurrence of oxygen vacancies caused by such exposure to a dry etching atmosphere remarkably affects transistor characteristics, particularly, in an oxide semiconductor layer with a small bandgap in which a channel is formed.

In view of the above problems, an object of one embodiment of the present invention is to provide a semiconductor device which has transistor characteristics with little variation and includes an oxide semiconductor.

Another object is to provide a semiconductor device which is normally-off and includes an oxide semiconductor.

Another object is to provide a semiconductor device which has high field-effect mobility and includes an oxide semiconductor.

Another object is to provide a semiconductor device which is formed using a minute island-shaped pattern including an oxide semiconductor material.

Another object is to provide a method for manufacturing the semiconductor device according to any one of the above objects.

In a transistor including an oxide semiconductor film, an oxide semiconductor layer having a large bandgap and a small electron affinity, that is, physical properties which made it hard to form a current path, is provided as a first oxide semiconductor layer in contact with a gate insulating film. Further, an oxide semiconductor layer with little oxygen vacancies is provided as a third oxide semiconductor layer in contact with an insulating film which is placed over the transistor and protects the transistor. In addition, in order to obtain high mobility, a second oxide semiconductor layer having a small bandgap and a large electron affinity, which mainly functions as a channel formation region, is provided between the first oxide semiconductor layer and the third oxide semiconductor layer. In this manner, a structure in which carriers flow through a region which is apart from upper and lower insulating layers in contact with the oxide semiconductor film (a buried channel) can be formed. The second oxide semiconductor layer serves as the buried channel, which can achieve high field-effect mobility.

In manufacture of the above structure, when patterning is performed on the second oxide semiconductor layer and the third oxide semiconductor layer by wet etching, etching is performed so that an end portion of the second oxide semiconductor layer and an end portion of the third oxide semiconductor layer are positioned on a sufficiently inner side than an end portion of a photoresist film. Further, with the photoresist film, patterning is performed on the first oxide semiconductor layer by anisotropic dry etching. At this time, since the end portion of the second oxide semiconductor layer in which the channel is formed is not exposed to dry etching, the end portion does not become n-type; thus, a reduction in variation in transistor characteristics and suppression in variation in transistor characteristics for long-term use can be achieved.

That is, according to one embodiment of the present invention, a semiconductor device includes an insulating film over a conductive film and an oxide semiconductor film over the insulating film. The oxide semiconductor film includes a first oxide semiconductor layer, a second oxide semiconductor layer over the first oxide semiconductor layer, and a third oxide semiconductor layer over the second oxide semiconductor layer. The energy level of a bottom of a conduction band of the second oxide semiconductor layer is lower than those of the first and third oxide semiconductor layers, and an end portion of the second oxide semiconductor layer is positioned on an inner side than an end portion of the first oxide semiconductor layer.

In other words, the end portion of the first oxide semiconductor layer extends to the outside beyond the end portion of the second oxide semiconductor layer. Further, the end portion of the third oxide semiconductor layer is aligned or substantially aligned with the end portion of the second oxide semiconductor layer. Here, "the end portion of the third oxide semiconductor layer is substantially aligned with the end portion of the second oxide semiconductor layer" means that the end portion of the third oxide semiconductor layer and the end portion of the second oxide semiconductor layer are substantially aligned by the same wet etching treatment. Thus, the following cases are acceptable: the end portion of the third oxide semiconductor layer is positioned on a slightly inner side than the end portion of the second oxide semiconductor layer, or the end portion of the third oxide semiconductor layer is positioned on a slightly outer side than the end portion of the second oxide semiconductor layer, due to difference in etching rate caused by difference in a material between the second oxide semiconductor layer and the third oxide semiconductor layer.

Further, as another structure, the end portion of the third oxide semiconductor layer is positioned on an outer side than the end portion of the second oxide semiconductor layer and the end portion of the first oxide semiconductor layer. In this case, the end portion of the first oxide semiconductor layer and the end portion of the second oxide semiconductor layer are in contact with the third oxide semiconductor layer.

According to one embodiment of the present invention, a method for manufacturing a semiconductor device includes the following steps: forming an insulating film over a conductive film; forming a first oxide semiconductor layer over the insulating film; forming a second oxide semiconductor layer over the first oxide semiconductor layer; forming a third oxide semiconductor layer over the second oxide semiconductor layer; forming a photoresist film over the third oxide semiconductor layer; performing wet etching on the third oxide semiconductor layer and the second oxide semiconductor layer with the photoresist film used as a mask; and performing dry etching on the first oxide semiconductor layer with the photoresist film used as a mask. The wet etching is performed so that the end portion of the third oxide semiconductor layer and the end portion of the second oxide semiconductor layer are positioned on an inner side than an end portion of the photoresist film.

According to one embodiment of the present invention, a method for manufacturing a semiconductor device includes the following steps: forming an insulating film over a conductive film; forming a first oxide semiconductor layer over the insulating film; forming a second oxide semiconductor layer over the first oxide semiconductor layer; forming a photoresist film over the second oxide semiconductor layer; performing wet etching on the second oxide semiconductor layer with the photoresist film used as a mask; performing dry etching on the first oxide semiconductor layer with the photoresist film used as a mask; and forming a third oxide semiconductor layer over the second oxide semiconductor layer after the photoresist film is removed. The wet etching is performed so that an end portion of the second oxide semiconductor layer is on an inner side than an end portion of the photoresist film.

Here, it is preferable that the first and third oxide semiconductor layers include at least indium and gallium in an atomic ratio where an indium content be lower than or equal to a gallium content and the second oxide semiconductor layer include at least indium and gallium in an atomic ratio where an indium content be higher than a gallium content.

According to one embodiment of the present invention, a semiconductor device which has transistor characteristics with little variation and includes an oxide semiconductor can be provided.

According to one embodiment of the present invention, a semiconductor device which is normally-off and includes an oxide semiconductor can be provided.

According to one embodiment of the present invention, a semiconductor device which includes an oxide semiconductor and has high field-effect mobility can be provided.

According to one embodiment of the present invention, a semiconductor device including a minute island-shaped pattern including an oxide semiconductor material can be provided.

According to one embodiment of the present invention, a method for manufacturing the above semiconductor device can be provided.

BRIEF DESCRIPTION OF THE DRAWINGS

FIG. 5A is a plan view and FIGS. 5B to 5D are cross-sectional views according to one embodiment of a semiconductor device.

FIGS. 13A and 13B illustrate one embodiment of a semiconductor device.

FIGS. 15A and 15B illustrate one embodiment of a semiconductor device.

DETAILED DESCRIPTION OF THE INVENTION

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

Note that in each drawing described in this specification, the size, the film thickness, or the region of each component is exaggerated for clarity in some cases. Therefore, embodiments of the present invention are not limited to such scales.

Note that the ordinal numbers such as "first" and "second" in this specification and the like are used for convenience and do not denote the order of steps or the stacking order of layers. In addition, the ordinal numbers in this specification and the like do not denote particular names which specify the present invention.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

(Embodiment 1)

In this embodiment, one embodiment of a semiconductor device is described with reference to FIGS. 1A to 1D and FIG. 2. In this embodiment, a bottom-gate transistor including an oxide semiconductor layer is described as an example of the semiconductor device.

Figure 1A:
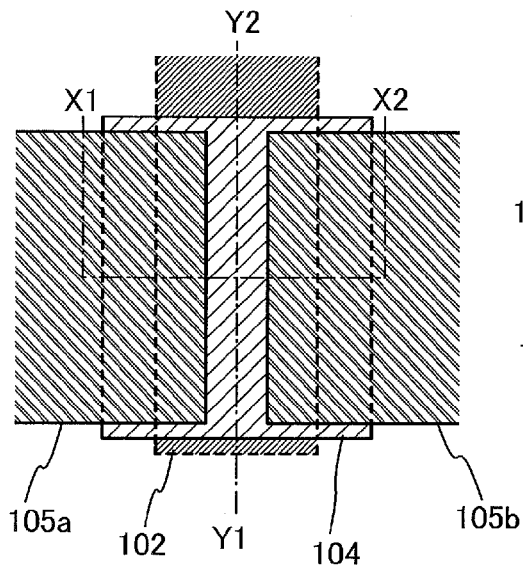
FIG. 1A is a plan view and FIGS. 1B to 1D are cross-sectional views according to one embodiment of a semiconductor device.
Figure 1C:
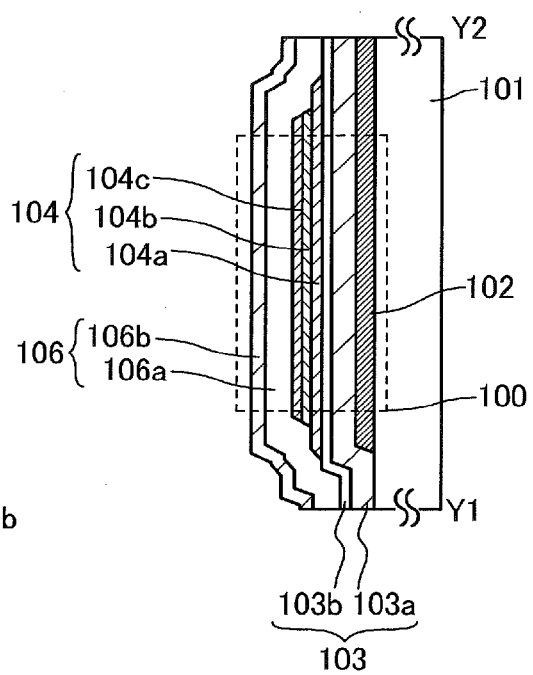
Figure 1B:
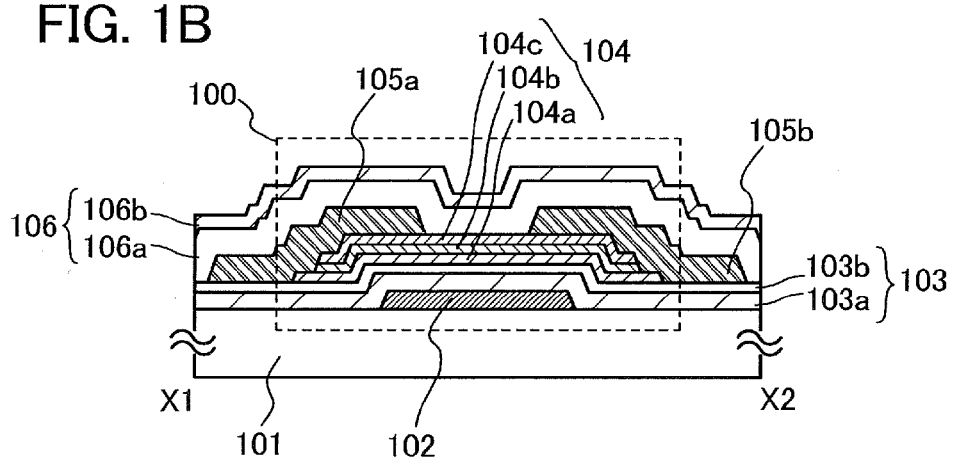

FIGS. 1A to 1D illustrate a structure example of a transistor 100. FIG. 1A is a plan view of the transistor 100, FIG. 1B is a cross-sectional view taken along line X1-X2 in FIG. 1A, and FIG. 1C is a cross-sectional view taken along line Y1-Y2 in FIG. 1A.

The transistor 100 illustrated in FIGS. 1A to 1D includes a first conductive film 102 functioning as a gate electrode over a substrate 101 having an insulating surface, a first insulating film 103 functioning as a gate insulating film over the first conductive film 102, an oxide semiconductor film 104 being in contact with the first insulating film 103 and overlapping with the first conductive film 102, and second conductive films 105a and 105b being electrically connected to the oxide semiconductor film 104 and functioning as a source electrode and a drain electrode. Further, a second insulating film 106 covering the second conductive films 105a and 105b and being in contact with the oxide semiconductor film 104 may be included as a component of the transistor 100. The channel length of the transistor 100 can be, for example, 1 µm or more.

In this embodiment, the first insulating film 103 has a stacked-layer structure of an insulating layer 103a in contact with the first conductive film 102 and an insulating layer 103b over the insulating layer 103a and in contact with the oxide semiconductor film 104. Further, the second insulating film 106 has a stacked-layer structure of an insulating layer 106a in contact with the second conductive films 105a and 105b and an insulating layer 106b over the insulating layer 106a.

The oxide semiconductor film 104 includes a first oxide semiconductor layer 104a in contact with the first insulating film 103, a second oxide semiconductor layer 104b on and in contact with the first oxide semiconductor layer 104a, and a third oxide semiconductor layer 104c on and in contact with the second oxide semiconductor layer 104b and in contact with the second conductive films 105a and 105b.

Figure 2:
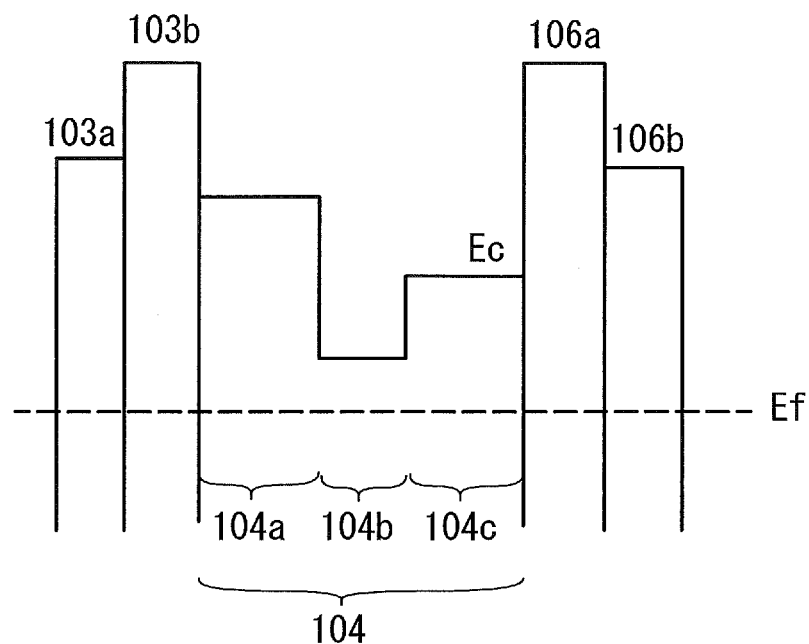
FIG. 2 is a band diagram illustrating one embodiment of an oxide semiconductor film.

FIG. 2 is an example of an energy band structure of the oxide semiconductor film 104, which shows the relation between the bottoms of the conduction band (Ec) and the Fermi level (Ef).

In the oxide semiconductor film 104, the second oxide semiconductor layer 104b which is sandwiched between the first oxide semiconductor layer 104a and the third oxide semiconductor layer 104c has higher conductivity σ (that is, a smaller bandgap) than the first oxide semiconductor layer 104a and the third oxide semiconductor layer 104c and functions as a channel.

The second oxide semiconductor layer 104b has higher carrier concentration than the first oxide semiconductor layer 104a and the third oxide semiconductor layer 104c. In addition, the Fermi level (Ef) of the second oxide semiconductor layer 104b is closer to the bottom (Ec) of the conduction band than those of the first and third oxide semiconductor layers 104a and 104c.

Materials, compositions, crystal structures, and the like of the first oxide semiconductor layer 104a and the third oxide semiconductor layer 104c are selected as appropriate so that the bottoms of the conduction band form a depression in the energy band diagram in which the second oxide semiconductor layer 104b is provided between the first oxide semiconductor layer 104a and the third oxide semiconductor layer 104c. For example, the first oxide semiconductor layer 104a and/or the third oxide semiconductor layer 104c are/is formed using a metal oxide which has smaller conductivity than the metal oxide contained in the second oxide semiconductor layer 104b. In this manner, the energy level of the bottom of the conduction band of the second oxide semiconductor layer 104b is made lower than those of the first and third oxide semiconductor layers 104a and 104c, so that an energy difference is provided between the bottoms of their conduction bands. Thus, a structure in which carriers flow through a region which is apart from the insulating layers 103b and 106a in contact with the oxide semiconductor film (buried channel) can be formed. The second oxide semiconductor layer 104b serves as the buried channel, which allows a reduction in interface scattering of carriers. Consequently, high field-effect mobility can be achieved.

In addition, the interface between the channel and the insulating layer in contact with the top layer or the bottom layer of the oxide semiconductor film 104 can be stabilized, so that the influence of a trap state which might be formed at the channel-side interface or the back-channel-side interface can be reduced. A reduction in the influence of a trap state at the channel-side interface prevents degradation, in particular, photodegradation such as negative-bias temperature stress photodegradation, of the transistor; thus, the transistor can have high reliability. A reduction in the influence of a trap state at the back-channel-side interface enables control of the threshold voltage of the transistor.

An energy difference (built-in potential) between the bottoms of the conduction bands of the first oxide semiconductor layer 104a and the second oxide semiconductor layer 104b or between the bottoms of the conduction bands of the third oxide semiconductor layer 104c and the second oxide semiconductor layer 104b is preferably greater than or equal to 0.05 eV, more preferably greater than or equal to 0.1 eV.

As a material of the first oxide semiconductor layer 104a, a material which can be represented as $M1_aM2_bM3_cO_x$ (a is a real number greater than or equal to 0 and less than or equal to 2, b is a real number greater than 0 and less than or equal to 5, c is a real number greater than or equal to 0 and less than or equal to 5, and x is an arbitrary real number) is used. Ga, Mg, Hf, Al, Zr, Sn, or the like can be used as the constituent element M2 to function as a stabilizer for reducing the number of oxygen vacancies in an oxide semiconductor. As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained. As the constituent element M1, indium or the like is used. As the constituent element M3, zinc or the like is used.

Typically, for the first oxide semiconductor layer 104a, a gallium oxide film, a gallium zinc oxide film, or a material film in which the content of the constituent element M2 is higher than the content of the constituent element M1 is used. For example, an In—Ga—Zn-based oxide film which is deposited using a sputtering target having any of atomic ratios of In:Ga:Zn=1:3:2, In:Ga:Zn=1:4:2, and In:Ga:Zn=1:5:4 is used. In forming the first oxide semiconductor layer 104a, deposition is preferably performed by a sputtering method in a mixed atmosphere containing more oxygen than a rare gas and preferably in an oxygen atmosphere (oxygen: 100%), and the resulting first oxide semiconductor layer 104a can also be referred to as an i-type oxide semiconductor layer. The i-type oxide semiconductor layer is a highly purified oxide semiconductor layer that contains impurities other than the main components of the oxide semiconductor layer as little as possible and is an i-type (intrinsic) semiconductor or is close thereto. This enables the Fermi level (Ef) to be at the same level as the intrinsic Fermi level (Ei).

The first oxide semiconductor layer 104a prevents capture of carriers at the interface between the channel and the insulating layer, so that photodegradation (e.g., negative-bias temperature stress photodegradation) of the transistor can be reduced, which enables the transistor to have high reliability.

In general, an oxide semiconductor film is mostly formed by a sputtering method. On the other hand, when the oxide semiconductor film is formed by sputtering, in some cases, an ionized rare gas element (e.g., argon) or an element ejected from a surface of a sputtering target flicks off a constituent element of a film, such as a gate insulating layer, on which the oxide semiconductor film is to be formed. The element flicked off from the film on which the oxide semiconductor film is to be formed might enter the oxide semiconductor film and function as an impurity element therein. In particular, a portion of the oxide semiconductor film, which is in the vicinity of the surface on which the oxide semiconductor film is formed, might have high concentration of the impurity element. Further, when the impurity element remains in the vicinity of the surface where the oxide semiconductor film is to be formed, the resistance of the oxide semiconductor film is increased, which causes the electrical characteristics of the transistor to be lowered.

However, since the first oxide semiconductor layer 104a is provided between the insulating layer 103b and the second oxide semiconductor layer 104b in which the channel is formed, a constituent element of the first insulating film 103 can be prevented from diffusing to the channel. That is, the first oxide semiconductor layer 104a may contain the constituent element (e.g., silicon) of the first insulating film 103 as an impurity. By including the first oxide semiconductor layer 104a, the transistor 100 can have more stabilized electrical characteristics; thus, a highly reliable semiconductor device can be provided.

For the second oxide semiconductor layer 104b, a material which can be represented as $M4_dM5_eM6_fO_x$ (d is a real number greater than 0 and less than or equal to 5, e is a real number greater than or equal to 0 and less than or equal to 3, f is a real number greater than 0 and less than or equal to 5, and x is an arbitrary positive number) is used. Ga, Mg, Hf, Al, Zr, Sn, or the like can be used as the constituent element M5 to function as a stabilizer for reducing the number of oxygen vacancies in an oxide semiconductor. As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be included. As the constituent element M4, indium or the like is used. As the constituent element M6, zinc or the like is used. Typically, a material film in which the content of the constituent element M4 is higher than the content of the constituent element M5 is used. For example, an In—Ga—Zn-based oxide film which is deposited using a sputtering target having an atomic ratio of In:Ga:Zn=3:1:2 is used. In forming the second oxide semiconductor layer, deposition can be performed by a sputtering method in a mixed atmosphere containing nitrogen or a mixed atmosphere containing dinitrogen monoxide. The resulting oxide semiconductor layer can have higher carrier density and higher conductivity σ than the first oxide semiconductor layer 104a and the third oxide semiconductor layer 104c.

Therefore, high field-effect mobility can be achieved in the transistor 100 in which the second oxide semiconductor layer 104b serves as the channel.

For the third oxide semiconductor layer 104c, a material which can be represented as $M7_gM8_hM9_iO_x$ (g is a real number greater than or equal to 0 and less than or equal to 2, h is a real number greater than 0 and less than or equal to 5, i is a real number greater than or equal to 0 and less than or equal to 5, and x is an arbitrary real number) is used. Ga, Mg, Hf, Al, Zr, Sn, or the like can be used as the constituent element M8 to function as a stabilizer for reducing the number of oxygen vacancies in an oxide semiconductor. As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be included. As the constituent element M7, indium or the like is used. As the constituent element M9, zinc or the like is used. Typically, a material film in which the content of the constituent element M7 is substantially equal to the content of the constituent element M8 is used. For example, an In—Ga—Zn-based oxide film which is deposited using a sputtering target having an atomic ratio of In:Ga:Zn=1:1:1 is used. In forming the third oxide semiconductor layer, deposition is preferably performed by a sputtering method in a mixed atmosphere containing more oxygen than a rare gas and preferably in an oxygen atmosphere (oxygen: 100%), and the resulting oxide semiconductor layer can also be referred to as an i-type oxide semiconductor layer.

The third oxide semiconductor layer 104c reduces the influence of a trap state at the back-channel-side interface of the transistor 100. For example, the third oxide semiconductor layer 104c can prevent diffusion of the constituent elements of the second conductive films 105a and 105b into the second oxide semiconductor layer 104b. That is, the third oxide semiconductor layer 104c might contain the constituent element (e.g., copper) of the second conductive films 105a and 105b, as an impurity. Since formation of a trap state in the channel of the transistor 100 can be prevented when the third oxide semiconductor layer 104c is provided, suppression of an increase in S value due to the trap state and/or control of the threshold voltage can be performed. When the threshold voltage is controlled with the third oxide semiconductor layer 104c, the transistor can be made normally off.

In the case where the conductivity of the second oxide semiconductor layer 104b serving as a channel formation region is increased by such a three-layer structure in the transistor, the distance between the second oxide semiconductor layer 104b and the drain electrode, that is, the thickness of the third oxide semiconductor layer 104c, becomes dominant, so that the channel length is shortened in appearance in the forward direction. Thus, the on-state characteristics of the transistor can be improved. Further, in the reverse direction, the third oxide semiconductor layer 104c is depleted, so that sufficiently low off-state current can be achieved.

Note that the materials of the first and second oxide semiconductor layers 104a and 104b are selected so that the energy level of the bottom of the conduction band of the second oxide semiconductor layer 104b is lower than that of the first oxide semiconductor layer 104a. The compositions of the above materials for each layer may be adjusted as appropriate. Further, the materials of the second and third oxide semiconductor layers 104b and 104c are selected so that the energy level of the bottom of the conduction band of the second oxide semiconductor layer 104b is lower than that of the third oxide semiconductor layer 104c. The compositions of the above materials for each layer may be adjusted as appropriate.

The thickness of the first oxide semiconductor layer 104a, which reduces the influence of a trap state at the channel-side interface and stabilizes electrical characteristics of the transistor, is preferably greater than or equal to 3 nm and less than or equal to 20 nm, more preferably greater than or equal to 5 nm and less than or equal to 10 nm. By forming the first oxide semiconductor layer 104a with the above thickness, even when the first oxide semiconductor layer 104a contains the constituent element of the first insulating film 103 as an impurity, the impurity can be prevented from reaching the second oxide semiconductor layer 104b functioning as the channel. The thickness of the second oxide semiconductor layer 104b functioning as the channel is preferably greater than or equal to 10 nm and less than or equal to 40 nm, more preferably greater than or equal to 15 nm and less than or equal to 30 nm. The thickness of the third oxide semiconductor layer 104c, which reduces the influence of a trap state at the back-channel-side interface and enables control of the threshold voltage, is preferably greater than or equal to 10 nm and less than or equal to 40 nm, more preferably greater than or equal to 15 nm and less than or equal to 30 nm.

Note that as described above, the thickness of the third oxide semiconductor layer 104c can be the substantial channel length of the transistor 100. Therefore, to achieve a normally-off transistor, it is preferable that the thickness of the third oxide semiconductor layer 104c be large. Further, when the thickness of the first oxide semiconductor layer 104a in contact with the first insulating film 103 is too large, current might flow through the first oxide semiconductor layer 104a or an interface thereof. Accordingly, it is preferable that the thickness of the first oxide semiconductor layer 104a be smaller than that of the second oxide semiconductor layer 104b, and the thickness of the third oxide semiconductor layer 104c be larger than or equal to that of the second oxide semiconductor layer 104b.

For the first to third oxide semiconductor layers 104a to 104c, oxide semiconductors which have different constituent elements or oxide semiconductors which have the same constituent elements but have different atomic ratios of the constituent elements may be used. Note that it is preferable that an oxide semiconductor which has high field-effect mobility be used for the second oxide semiconductor layer 104b functioning as the channel of the transistor 100.

For example, in the case where the first to third oxide semiconductor layers 104a to 104c are formed using an oxide semiconductors which contain indium and gallium, an oxide semiconductor having an atomic ratio where the indium content is higher than the gallium content is preferably used for the second oxide semiconductor layer 104b, and oxide semiconductors having an atomic ratio where the indium content is lower than or equal to the gallium content are preferably used for the first oxide semiconductor layer 104a and the third oxide semiconductor layer 104c.

In an oxide semiconductor, the s orbital of heavy metal mainly contributes to carrier transfer, and when the percentage of indium content in the oxide semiconductor is increased, overlaps of the s orbitals are likely to be increased. Accordingly, when the second oxide semiconductor layer 104b has an atomic ratio where the indium content is higher than the gallium content, it is possible that the second oxide semiconductor layer 104b has higher field-effect mobility than an oxide having an atomic ratio where the indium content is lower than or equal to the gallium content.

Further, as the ratio of the gallium content to the content of the other metal element(s) becomes higher in a metal oxide, the bandgap of the metal oxide is increased. Accordingly, when the first oxide semiconductor layer 104a and the third oxide semiconductor layer 104c each having an atomic ratio where the indium content is lower than or equal to the gallium content, the first oxide semiconductor layer 104a and the third oxide semiconductor layer 104c have larger bandgaps than the second oxide semiconductor layer 104b. This structure is preferable because the energy difference can be formed between the bottom of the conduction band of the second oxide semiconductor layer 104b and each of the bottoms of the conduction bands of the first oxide semiconductor layer 104a and the third oxide semiconductor layer 104c. Further, the formation energy of an oxygen vacancy is larger in gallium than in indium and thus an oxygen vacancy is less likely to occur in gallium. Therefore, a metal oxide having an atomic ratio where the indium content is lower than or equal to the gallium content has more stable characteristics than a metal oxide having an atomic ratio where the indium content is higher than the gallium content. Therefore, stabilization on the back channel side in the transistor 100 can be achieved. Note that gallium oxide or zinc gallium oxide may be used for the first oxide semiconductor layer 104a and/or the third oxide semiconductor layer 104c.

For example, in the case where an In—Ga—Zn-based oxide semiconductor is used for the first to third oxide semiconductor layers 104a to 104c, an In—Ga—Zn-based oxide having any of atomic ratios of In:Ga:Zn=1:1:1 (=1/3:1/3:1/3), In:Ga:Zn=1:3:2 (=1/6:3/6:2/6), In:Ga:Zn=2:4:3 (=2/9:4/9:3/9), and In:Ga:Zn=1:5:3 (=1/9:5/9:3/9); or a metal oxide having a composition which is in the neighborhood of any of the above compositions is preferably used for the first oxide semiconductor layer 104a or the third oxide semiconductor layer 104c. For the second oxide semiconductor layer 104b, an In—Ga—Zn-based oxide having any of atomic ratios of In:Ga:Zn=3:1:2 (=3/6:1/6:2/6), In:Ga:Zn=4:2:3 (=4/9:2/9:3/9), In:Ga:Zn=5:1:3 (=5/9:1/9:3/9), In:Ga:Zn=5:3:4 (=5/12:3/12:4/12), In:Ga:Zn=6:2:4 (=6/12:2/12:4/12), and In:Ga:Zn=7:1:3 (=7/11:1/11:3/11); or a metal oxide having a composition which is in the neighborhood of any of the above compositions is preferably used.

Note that for example, the expression "the composition of an oxide including In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$. For example, r may be 0.05.

In this embodiment, an In—Ga—Zn-based oxide having an atomic ratio of In:Ga:Zn=1:3:2 is used as the first oxide semiconductor layer 104a, an In—Ga—Zn-based oxide having an atomic ratio of In:Ga:Zn=3:1:2 is used as the second oxide semiconductor layer 104b, and an In—Ga—Zn-based oxide having an atomic ratio of In:Ga:Zn=1:1:1 is used as the third oxide semiconductor layer 104c.

Note that the oxide semiconductor which is applied to the oxide semiconductor film 104 is not limited thereto, and an oxide semiconductor with an appropriate composition may be used in accordance with needed electrical characteristics (e.g., field-effect mobility, threshold voltage, and variation). In order to obtain the needed electrical characteristics, the carrier concentration, the impurity concentration, the defect density, the atomic ratio between a metal element and oxygen, the interatomic distance, the density, and the like are preferably set to appropriate values.

Further, the second oxide semiconductor layer 104b has the same constituent elements as at least one of constituent elements of the first oxide semiconductor layer 104a and the third oxide semiconductor layer 104c in common. Thus, depending on constituent elements or compositions of materials or deposition conditions, an interface between the oxide semiconductor layers is unclear in some cases; however, it needs to be noted that clear solid lines are used in the drawings for convenience.

Next, an end portion of the oxide semiconductor film 104 is described with reference to FIG. 1D.

Figure 1D:
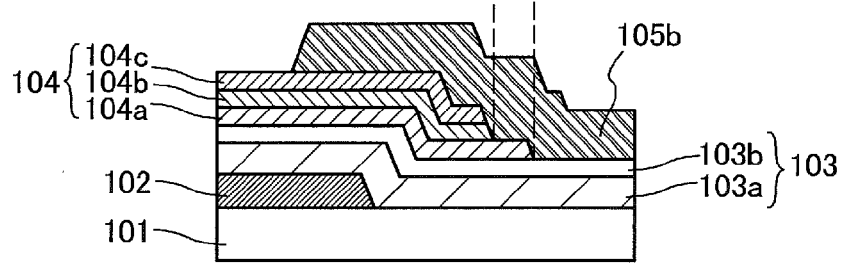

FIG. 1D is a diagram of an enlarged right end of the oxide semiconductor film 104 in the cross-sectional view illustrated in FIG. 1B. The oxide semiconductor film 104 is formed in which the first oxide semiconductor layer 104a, the second oxide semiconductor layer 104b, and the third oxide semiconductor layer 104c are stacked in this order over the insulating layer 103b forming an upper layer of the first insulating film 103. The oxide semiconductor film 104 is processed into an island-shaped pattern as illustrated in FIG. 1A. Here, at an end portion of the oxide semiconductor film 104, an end portion of the second oxide semiconductor layer 104b and an end portion of the third oxide semiconductor layer 104c are provided on an inner side than an end portion of the first oxide semiconductor layer 104a. In other words, the end portion of the first oxide semiconductor layer 104a extends to the outside beyond the end portion of the second oxide semiconductor layer 104b and the end portion of the third oxide semiconductor layer 104c. That is, as for the outer edge of the island-shaped pattern of the oxide semiconductor film 104, the end portion of the first oxide semiconductor layer 104a extends beyond the end portion of the second oxide semiconductor layer 104b and the end portion of the third oxide semiconductor layer 104c; thus, the upper surface of the first oxide semiconductor layer 104a is slightly exposed.

Note that the end portion of the second oxide semiconductor layer 104b and the end portion of the third oxide semiconductor layer 104c are not necessarily aligned as illustrated in FIG. 1D. The end portion of the second oxide semiconductor layer 104b may be positioned on an outer side than the end portion of the third oxide semiconductor layer, or the end portion of the second oxide semiconductor layer 104b may be positioned on an inner side than the end portion of the third oxide semiconductor layer 104c.

Further, when the distance between the end portion of the second oxide semiconductor layer 104b and the end portion of the first oxide semiconductor layer 104a is denoted as L, the distance L is preferably longer than or equal to the sum of thicknesses of the second oxide semiconductor layer 104b and the third oxide semiconductor layer 104c. As described above, when the distance between the end portion of the first oxide semiconductor layer 104a and the end portion of the second oxide semiconductor layer 104b is surely secured, generation of oxygen vacancies in the second oxide semiconductor layer 104b, which might occur in later-described dry etching of the first oxide semiconductor layer 104a, can be suppressed.

Since the end portion of the first oxide semiconductor layer 104a extends beyond the end portion of the second oxide semiconductor layer 104b and the end portion of the third oxide semiconductor layer 104c, a portion of the first oxide semiconductor layer 104a is exposed. The exposed portion does not necessarily have the same thickness as an unexposed portion of the first oxide semiconductor layer 104a. By etching the second oxide semiconductor layer 104b and the third oxide semiconductor layer 104c, the first oxide semiconductor layer 104a is also etched, so that the thickness of the exposed portion of the first oxide semiconductor layer 104a is smaller than that of the unexposed portion thereof in some cases.

The structures, methods, and the like described in this embodiment can be combined as appropriate with any of the other structures, methods, and the like described in the other embodiments.

(Embodiment 2)

In this embodiment, one embodiment of a method for manufacturing the transistor 100 described in Embodiment 1 is described with reference to FIGS. 3A to 3D and FIGS. 4A to 4C.

First, the first conductive film 102 is formed over the substrate 101 having an insulating surface. The first conductive film 102 is used as a gate electrode or a wiring.

There is no particular limitation on the substrate that can be used as the substrate 101 having an insulating surface as long as it has heat resistance high enough to withstand heat treatment performed later. For example, a glass substrate of barium borosilicate glass, aluminoborosilicate glass, or the like, a ceramic substrate, a quartz substrate, or a sapphire substrate can be used. Alternatively, a single crystal semiconductor substrate or a polycrystalline semiconductor substrate made of silicon, silicon carbide, or the like, a compound semiconductor substrate made of silicon germanium or the like, an SOI substrate, or the like can be used. Furthermore, any of these substrates provided with semiconductor elements may be used as the substrate 101. A base insulating layer may be formed over the substrate 101.

The first conductive film 102 can be formed using a metal material such as molybdenum, titanium, tantalum, tungsten, aluminum, copper, chromium, neodymium, or scandium, or an alloy material containing any of these materials as a main component. Alternatively, a semiconductor film typified by a polycrystalline silicon film doped with an impurity element such as phosphorus, or a silicide film such as a nickel silicide film may be used as the first conductive film 102. The first conductive film 102 may have either a single-layer structure or a stacked-layer structure. The first conductive film 102 may have a tapered shape with a taper angle of greater than or equal to 15° and less than or equal to 70° for example. Here, the taper angle refers to an angle formed between a side surface of a layer having a tapered shape and a bottom surface of the layer.

The material of the first conductive film 102 may be a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added.

Alternatively, as the material of the first conductive film 102, an In—Ga—Zn-based oxide containing nitrogen, an In—Sn-based oxide containing nitrogen, an In—Ga-based oxide containing nitrogen, an In—Zn-based oxide containing nitrogen, a Sn-based oxide containing nitrogen, an In-based oxide containing nitrogen, or a metal nitride film (such as an indium nitride film, a zinc nitride film, a tantalum nitride film, or a tungsten nitride film) may be used. These materials have a work function of 5 eV or more. Therefore, when the first conductive film 102 is formed using any of these materials, the threshold voltage of the transistor can be positive, so that the transistor can be a normally-off switching transistor.

Figure 3A:
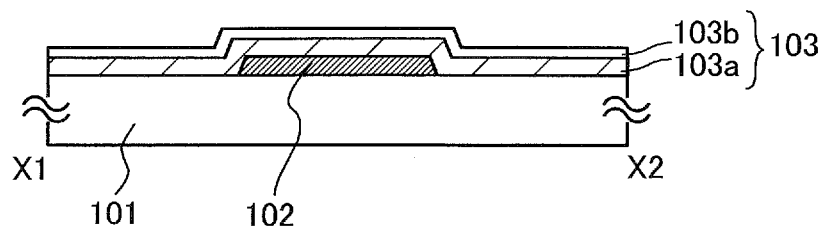
FIGS. 3A to 3D illustrate an example of a method for manufacturing a semiconductor device.

Next, the first insulating film 103 is formed so as to cover the first conductive film 102 (see FIG. 3A). As the first insulating film 103, a single layer or a stack of layers including at least one of the following films formed by a plasma CVD method, a sputtering method, or the like is used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

Note that it is preferable that a region which is included in the first insulating film 103 and is in contact with the first oxide semiconductor layer 104a formed later (in this embodiment, the insulating layer 103b) be formed using an oxide insulating layer and it is further preferable that the region include a region containing oxygen in excess of the stoichiometric composition (an oxygen-excess region). In order to provide the oxygen-excess region in the first insulating film 103, for example, the first insulating film 103 may be formed in an oxygen atmosphere. Alternatively, oxygen may be introduced into the formed first insulating film 103 to provide the oxygen-excess region. Oxygen can be introduced by an ion implantation method, an ion doping method, a plasma immersion ion implantation method, plasma treatment, or the like.

In this embodiment, a silicon nitride film is formed as the insulating layer 103a, and a silicon oxide film is formed as the insulating layer 103b.

Figure 3B:
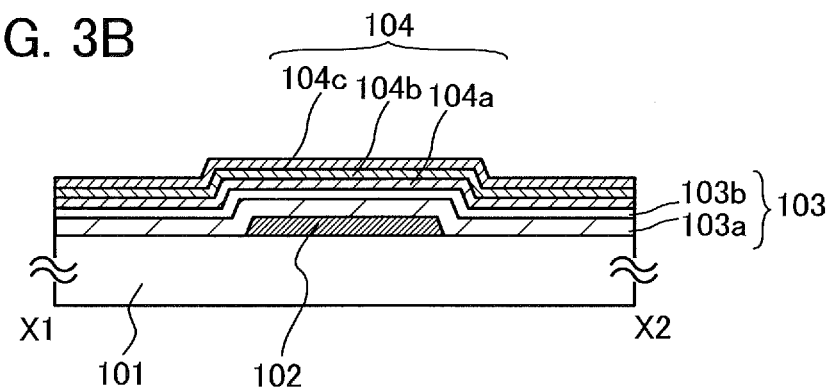

Next, the first oxide semiconductor layer 104a, the second oxide semiconductor layer 104b, and the third oxide semiconductor layer 104c are formed over the first insulating film 103 in this order (see FIG. 3B).

The first oxide semiconductor layer 104a, the second oxide semiconductor layer 104b, and the third oxide semiconductor layer 104c may be each an amorphous oxide semiconductor or a crystalline oxide semiconductor. However, it is preferable that the second oxide semiconductor layer 104b functioning as the channel of the transistor 100 be a crystalline oxide semiconductor. The crystalline oxide semiconductor may be obtained by performing heat treatment on an amorphous oxide semiconductor. The heat treatment for crystallizing the amorphous oxide semiconductor is performed at a temperature higher than or equal to 250° C. and lower than or equal to 700° C., preferably higher than or equal to 400° C., more preferably higher than or equal to 500° C., still more preferably higher than or equal to 550° C. The heat treatment can also serve as another heat treatment in the manufacturing process.

The oxide semiconductor layers each can be formed by a sputtering method, a molecular beam epitaxy (MBE) method, a CVD method, a pulse laser deposition method, an atomic layer deposition (ALD) method, or the like as appropriate.

Further, in the case where the oxide semiconductor film is formed by a sputtering method, the relative density (the fill rate) of a sputtering target which is used for forming the oxide semiconductor film is greater than or equal to 90% and less than or equal to 100%, preferably greater than or equal to 95% and less than or equal to 99.9%. This is because, with the use of the sputtering target with a high relative density, a dense oxide semiconductor film can be formed.

The sputtering target is preferably sintered in an inert gas atmosphere (a nitrogen atmosphere or a rare gas atmosphere), in vacuum, or in a high-pressure atmosphere. As a sintering method, an atmospheric sintering method, a pressure sintering method, or the like can be used as appropriate. A polycrystalline target obtained by any of these methods is used as a sputtering target. A hot pressing method, a hot isostatic pressing (HIP) method, a discharge plasma sintering method, or an impact method is preferably used as a pressure sintering method. The maximum temperature at which sintering is performed is selected depending on the sintering temperature of the sputtering target material, and it is preferably set to approximately 1000° C. to 2000° C., or more preferably, 1200° C. to 1500° C. The holding time of the maximum temperature is selected depending on the sputtering target material, and 0.5 hours to 3 hours is preferable.

As oxide semiconductors used for the first oxide semiconductor layer 104a, the second oxide semiconductor layer 104b, and the third oxide semiconductor layer 104c, the oxide semiconductors described in Embodiment 1 may be used as appropriate.

For example, in the case of forming an In—Ga—Zn-based oxide film as the oxide semiconductor layer, a target having an atomic ratio of In:Ga:Zn=3:1:2 or a target having an atomic ratio of In:Ga:Zn=1:1:1 is used as the sputtering target. In this embodiment, the first oxide semiconductor layer 104a is formed using a target having an atomic ratio of In:Ga:Zn=1:3:2. The second oxide semiconductor layer 104b is formed using a target having an atomic ratio of In:Ga:Zn=3:1:2. The third oxide semiconductor layer 104c is formed using a target having an atomic ratio of In:Ga:Zn=1:1:1.

To obtain a dense film, it is important to reduce impurities which remain in the deposition chamber. The back pressure (ultimate vacuum: degree of vacuum before introduction of a reaction gas) in the deposition chamber is set to be lower than or equal to $5 \times 10^{-3}$ Pa, preferably lower than or equal to $6 \times 10^{-5}$ Pa, and the pressure in deposition is set to be lower than 2 Pa, preferably lower than or equal to 0.4 Pa. When the back pressure is set to be low, impurities in the deposition chamber are reduced.

To obtain a dense film, it is also important to reduce impurities contained in a gas that is introduced into the deposition chamber, i.e., a gas used at the deposition. Further, it is important to increase the proportion of oxygen contained in the deposition gas and optimize power. By increasing the proportion of oxygen (the upper limit: 100% oxygen) in the deposition gas and optimizing the power, plasma damage in deposition can be alleviated. Thus, a dense film is easily obtained.

In particular, in the formation of the oxide semiconductor film, the hydrogen concentration in the oxide semiconductor film is preferably reduced as much as possible. In order to reduce the hydrogen concentration, for example, in the case where a sputtering method is used for the deposition, a high-purity rare gas (typically, argon), high-purity oxygen, or a high-purity mixed gas of oxygen and the rare gas from which impurities such as hydrogen, water, a hydroxyl group, or a hydride have been removed is used as appropriate as an atmosphere gas supplied to a deposition chamber of a sputtering apparatus.

The oxide semiconductor film is formed in such a manner that a sputtering gas from which hydrogen and moisture have been removed is introduced into the deposition chamber while moisture remaining therein is removed, whereby the hydrogen concentration in the formed oxide semiconductor film can be reduced. In order to remove the residual moisture in the deposition chamber, an entrapment vacuum pump, for example, a cryopump, an ion pump, or a titanium sublimation pump is preferably used. A turbo molecular pump provided with a cold trap may be alternatively used. Since a cryopump has a high capability in removing a compound including a hydrogen atom such as a hydrogen molecule and water ($H_2O$) (preferably, also a compound including a carbon atom), and the like, the concentration of an impurity contained in a film formed in the deposition chamber evacuated with the cryopump can be reduced.

Therefore, deposition is preferably performed while a quadrupole mass analyzer (hereinafter referred to as Q-mass) is operated continuously in order that the amount of moisture in the deposition chamber, or the like is monitored by the Q-mass before or in deposition of the oxide semiconductor film.

The first insulating film 103 and the oxide semiconductor film 104 are preferably formed in succession without exposure to the air. By forming the first insulating film 103 and the oxide semiconductor film 104 in succession without exposure to the air, attachment of hydrogen or a hydrogen compound (e.g., adsorption water) onto surface of the oxide semiconductor film can be prevented, and thus mixing of an impurity can be prevented.

To reduce the impurity concentration in the oxide semiconductor film, it is also effective to form the oxide semiconductor film while the substrate 101 is kept at high temperature. The temperature at which the substrate 101 is heated may be higher than or equal to 150° C. and lower than or equal to 450° C.; the substrate temperature is preferably higher than or equal to 200° C. and lower than or equal to 350° C. By heating the substrate at high temperature during the film formation, a crystalline oxide semiconductor film can be formed.

Further, the oxide semiconductor film is preferably subjected to heat treatment for removing excess hydrogen (including water and a hydroxyl group) contained in the film (for dehydration or dehydrogenation). The temperature of the heat treatment is higher than or equal to 300° C. and lower than or equal to 700° C., or lower than the strain point of the substrate. The heat treatment can be performed under reduced pressure, a nitrogen atmosphere, or the like. Hydrogen, which is an impurity imparting n-type conductivity, can be removed by the heat treatment.

Note that the heat treatment for the dehydration or dehydrogenation may be performed at any timing in the manufacturing process of the transistor as long as it is performed after the formation of the oxide semiconductor film. The heat treatment for dehydration or dehydrogenation may be performed a plurality of times, and may also serve as another heat treatment.

In the heat treatment, it is preferable that water, hydrogen, or the like be not contained in nitrogen or a rare gas such as helium, neon, or argon. The purity of nitrogen or the rare gas such as helium, neon, or argon which is introduced into the heat treatment apparatus is set to preferably 6N (99.9999%) or higher, further preferably 7N (99.99999%) or higher (that is, the impurity concentration is preferably 1 ppm or lower, more preferably 0.1 ppm or lower).

In addition, after the oxide semiconductor layers (or the oxide semiconductor film) are heated by the heat treatment, a high-purity oxygen gas, a high-purity dinitrogen gas, or ultra dry air (the moisture amount is less than or equal to 20 ppm (−55° C. by conversion into a dew point), preferably less than or equal to 1 ppm, more preferably less than or equal to 10 ppb, in the measurement with use of a dew point meter of a cavity ring down laser spectroscopy (CRDS) system) may be introduced into the same furnace while the heating temperature is being maintained or being gradually decreased. It is preferable that water, hydrogen, or the like be not contained in the oxygen gas or the dinitrogen monoxide gas. The purity of the oxygen gas or the dinitrogen monoxide gas which is introduced into the heat treatment apparatus is preferably 6N or more, more preferably 7N or more (i.e., the impurity concentration in the oxygen gas or the dinitrogen monoxide gas is preferably 1 ppm or lower, more preferably 0.1 ppm or lower). The oxygen gas or the dinitrogen monoxide gas acts to supply oxygen that is a main component of the oxide semiconductor and that has been reduced by the step of removing an impurity for the dehydration or dehydrogenation, so that the oxide semiconductor layers can have high purity and be i-type (intrinsic) oxide semiconductor layers.

Since there is a possibility that oxygen is also released and reduced by dehydration or dehydrogenation treatment, oxygen (including at least one of an oxygen radical, an oxygen atom, and an oxygen ion) may be introduced into the oxide semiconductor layers which have been subjected to the dehydration or dehydrogenation treatment to supply oxygen to the film.

Introduction (supply) of oxygen into the dehydrated or dehydrogenated oxide semiconductor layers enables the oxide semiconductor layers to be highly purified and to be i-type (intrinsic). Variation in electrical characteristics of a transistor having the highly-purified and i-type (intrinsic) oxide semiconductor is suppressed, and the transistor is electrically stable.

In the case where oxygen is introduced into the oxide semiconductor layers, oxygen may be directly introduced into the oxide semiconductor layers or may be introduced into the oxide semiconductor layers through an insulating layer formed in a later step. As the method for adding oxygen (containing at least one of an oxygen radical, an oxygen atom, and an oxygen ion), an ion implantation method, an ion doping method, a plasma immersion ion implantation method, plasma treatment, or the like can be used. A gas containing oxygen can be used for oxygen introducing treatment. As the gas containing oxygen, oxygen, dinitrogen monoxide, nitrogen dioxide, carbon dioxide, carbon monoxide, and the like can be used. Further, a rare gas may be contained in the gas containing oxygen in the oxygen introducing treatment.

For example, in the case where an oxygen ion is introduced into the oxide semiconductor layers by an ion implantation method, the dose can be greater than or equal to $1\times10^{13}$ ions/cm$^2$ and less than or equal to $5\times10^{16}$ ions/cm$^2$.

The timing of supply of oxygen to the oxide semiconductor layers is not particularly limited to the above as long as it is after the formation of the oxide semiconductor film. Oxygen may be introduced into the oxide semiconductor layers plural times.

Figure 3C:
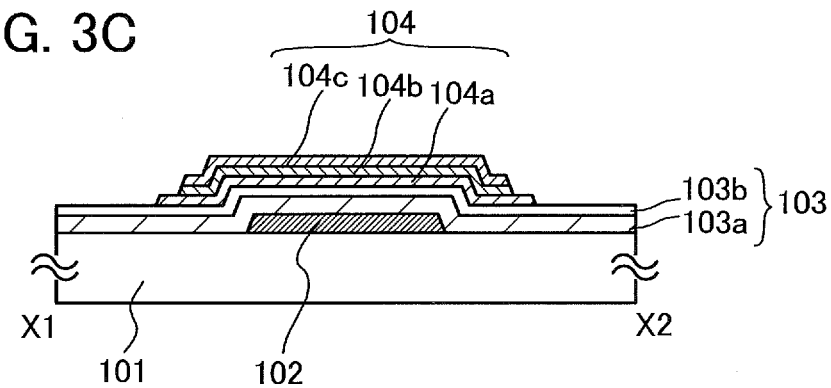

Next, the oxide semiconductor film 104 formed by stacking the first oxide semiconductor layer 104a, the second oxide semiconductor layer 104b, and the third oxide semiconductor layer 104c is processed into an island-shaped pattern by etching treatment using a photolithography method (see FIG. 3C).

This etching treatment step is described with reference to FIGS. 4A to 4C.

Figure 4A:
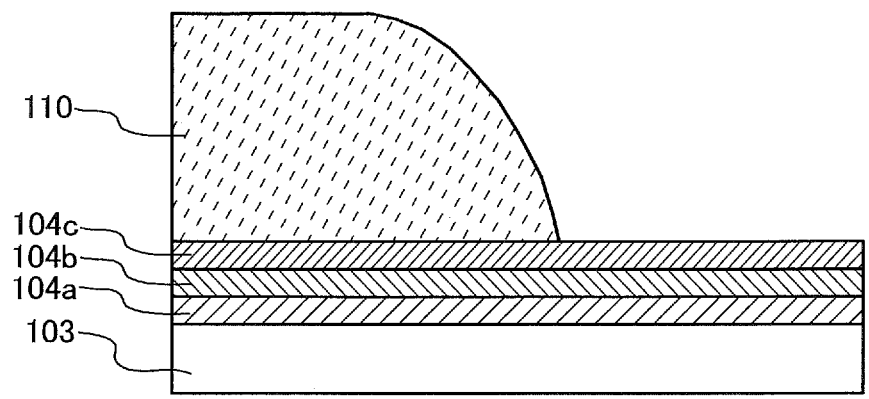
FIGS. 4A to 4C illustrate an example of a method for manufacturing the semiconductor device.

First, a photoresist film 110 is formed using a photosensitive organic resin material over the oxide semiconductor film 104 which is deposited over the first insulating film 103 and which includes the first oxide semiconductor layer 104a, the second oxide semiconductor layer 104b, and the third oxide semiconductor layer 104c (see FIG. 4A). The photoresist film 110 is shaped into a desired pattern because it is used as a mask for processing the oxide semiconductor film 104 into an island-shaped pattern. The photoresist film is shaped into a pattern by performing steps such as prebaking, light exposure using a photomask, development, and postbaking after a photoresist material is applied. For the photoresist film 110, a commercial material may be used and applied to have a thickness greater than or equal to 1 μm and less than or equal to 5 μm, for example.

Next, wet etching is performed on the third oxide semiconductor layer 104c and the second oxide semiconductor layer 104b using an etchant 111. As the etchant 111 for etching, for example, a mixed solution of phosphoric acid, acetic acid, and nitric acid, or the like can be used. Alternatively, ITO-07N (produced by KANTO CHEMICAL CO., INC.) may be used. Since the above-described photoresist film 110 functions as a mask here, the third oxide semiconductor layer 104c and the second oxide semiconductor layer 104b which are not covered with the photoresist film 110 are etched.

Figure 4B:
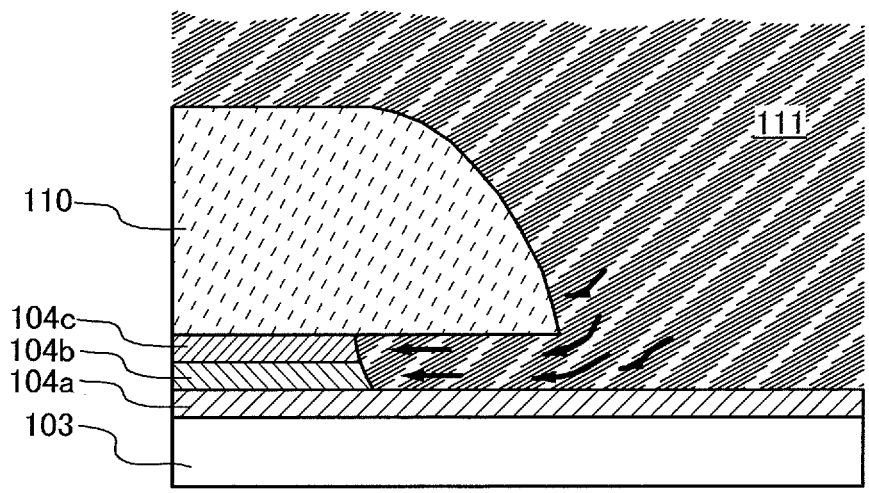
Figure 4C:
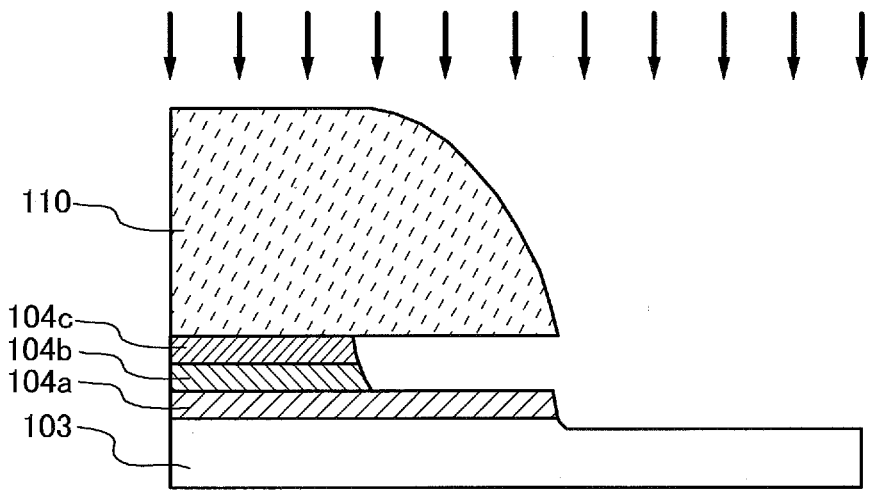
Figure 6A:
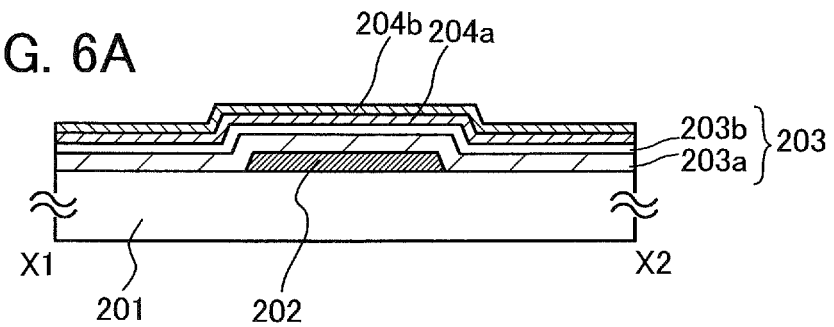
FIGS. 6A to 6D illustrate an example of a method for manufacturing a semiconductor device.
Figure 6B:
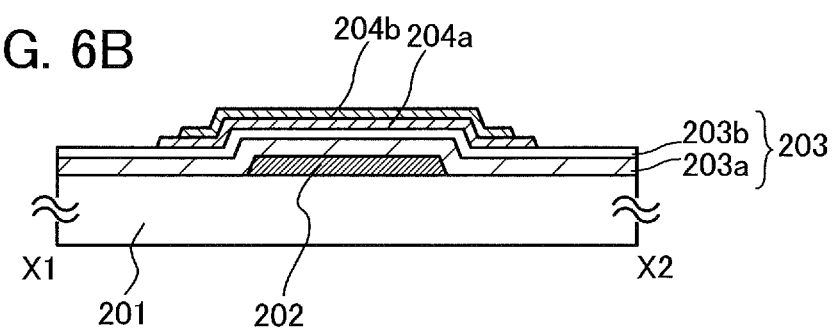
Figure 6C:
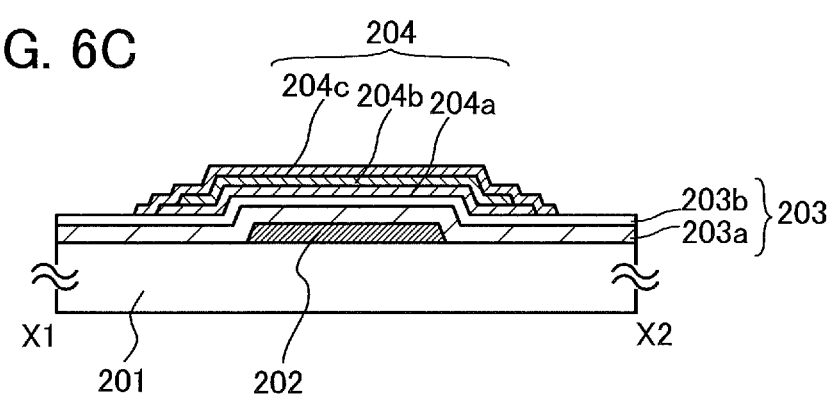
Figure 6D:
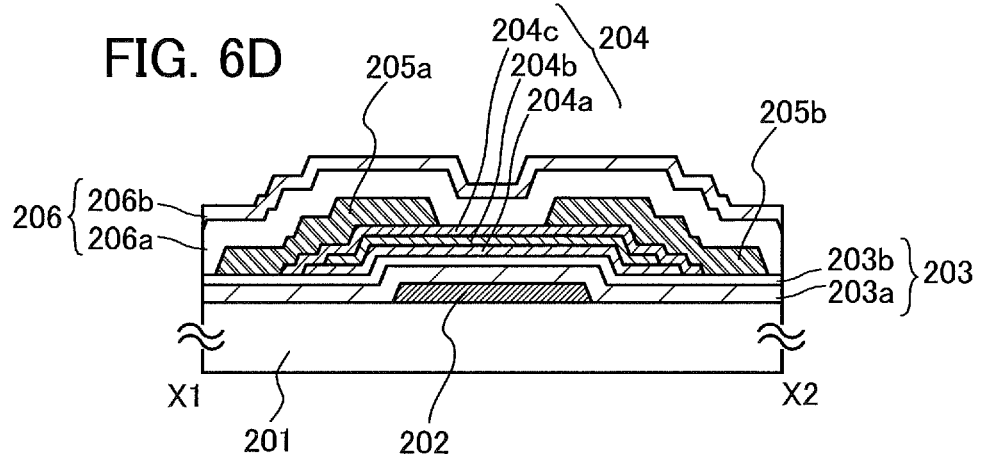

Since wet etching is isotropic etching, the etchant enters below the photoresist film 110 as the etching progresses, so that side surfaces of the third oxide semiconductor layer 104c and the second oxide semiconductor layer 104b are etched as illustrated in FIG. 4B.

At this time, the first oxide semiconductor layer 104a is hardly etched. This is because etching rate of an oxide semiconductor whose bandgap is large and electron affinity is small, which is suitable for the first oxide semiconductor layer 104a, by the etchant is extremely low as compared with the other two layers.

The side surfaces of the third oxide semiconductor layer 104c and the second oxide semiconductor layer 104b are etched until at least the end portions of the third oxide semiconductor layer 104c and the second oxide semiconductor layer 104b are positioned on the inner side than an end portion of the photoresist film 110. Further preferably, when the total thickness of the second oxide semiconductor layer 104b and the third oxide semiconductor layer 104c is denoted by T, the etching is performed until the end portions of the third oxide semiconductor layer 104c and the second oxide semiconductor layer 104b are positioned on the inner side than the end portion of the photoresist film 110 by T or more. As described above, when the distance between the end portions of the second oxide semiconductor layer 104b and the third oxide semiconductor layer 104c and the end portion of the photoresist film 110 is surely secured, generation of oxygen vacancies in the second oxide semiconductor layer 104b, which might occur in later-described dry etching of the first oxide semiconductor layer 104a, can be suppressed.

Next, without removing the photoresist film 110, dry etching is performed on the first oxide semiconductor layer 104a using the photoresist film 110 as a mask again. As the dry etching, an inductively coupled plasma (ICP) etching method may be used. In the case where an IGZO film is etched by an ICP etching method, the oxide semiconductor layer can be etched, for example, under the following etching conditions: the etching gas is $BCl_3$ (flow rate: 800 sccm), the ICP power is 0 W, the bias power is 2500 W, the pressure is 2.0 Pa, and the lower electrode temperature is 20° C.

Dry etching is highly anisotropic etching in general. Therefore, a portion of the first oxide semiconductor layer 104a which is not covered with the photoresist film 110 is etched as illustrated in FIG. 4C. On the other hand, since the first oxide semiconductor layer 104a positioned below the photoresist film 110 is hardly exposed to a dry etching atmosphere, it remains unetched.

Here, through the above-described wet etching step, the second oxide semiconductor layer 104b and the third oxide semiconductor layer 104c are positioned on the inner side than the end portion of the photoresist film 110. Accordingly, the end portion of the second oxide semiconductor layer 104b and the end portion of the third oxide semiconductor layer 104c are not exposed to a dry etching atmosphere. Thus, particularly at the end portion of the second oxide semiconductor layer 104b functioning as the channel formation region, generation of oxygen vacancies can be suppressed. In other words, at the end portion of the second oxide semiconductor layer 104b in the island-shaped pattern, a change of the conductivity to an n-type is prevented, and variation in transistor characteristics due to a parasitic channel generated by the change of the conductivity to an n-type can be suppressed.

Note that in this dry etching step, etching is performed excessively in general (referred to as over etching) so that a residue of the first oxide semiconductor layer 104a does not occur through the etching. Therefore, an upper surface of the first insulating film 103 is slightly removed in some cases. Due to over etching, side surfaces of the first oxide semiconductor layer 104a are removed slightly in some cases. Therefore, it is preferable that the end portion of the second oxide semiconductor layer 104b be positioned on a sufficiently inner side than the end portion of the photoresist film 110.

Further, depending on a material, thickness, or dry etching conditions of the photoresist film 110, a surface of the photoresist film 110 is removed little by little as dry etching progresses in some cases. Therefore, it is preferable that the end portion of the second oxide semiconductor layer 104b be positioned on the sufficiently inner side than the end portion of the photoresist film 110.

The photoresist film 110 is removed after the dry etching step, so that processing of the oxide semiconductor film 104 into an island-shaped pattern is completed.

Next, a conductive film is formed over the oxide semiconductor film 104 processed into an island shape and then processed to form the second conductive films 105a and 105b functioning as a source electrode and a drain electrode (further including a wiring formed using the same layer as the films).

For the second conductive films 105a and 105b, a metal film containing an element selected from Al, Cr, Cu, Ta, Ti, Mo, and W, a metal nitride film containing any of the above elements as a component (a titanium nitride film, a molybdenum nitride film, or a tungsten nitride film), or the like can be used, for example. Alternatively, a film of a high-melting-point metal such as Ti, Mo, or W or a metal nitride film of any of these elements (a titanium nitride film, a molybdenum nitride film, or a tungsten nitride film) may be stacked on one of or both a bottom side and a top side of a metal film of Al, Cu, or the like. Alternatively, the second conductive films 105a and 105b may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$), indium oxide-zinc oxide ($In_2O_3$—ZnO), or any of these metal oxide materials in which silicon oxide is contained can be used.

For the second conductive films 105a and 105b, a metal nitride film such as an In—Ga—Zn—O film containing nitrogen, an In—Sn—O film containing nitrogen, an In—Ga—O film containing nitrogen, an In—Zn—O film containing nitrogen, a Sn—O film containing nitrogen, or an In—O film containing nitrogen can be used. These films contain the same constituent elements as the oxide semiconductor film 104 and can therefore stabilize the interface with the oxide semiconductor film 104.

Figure 3D:
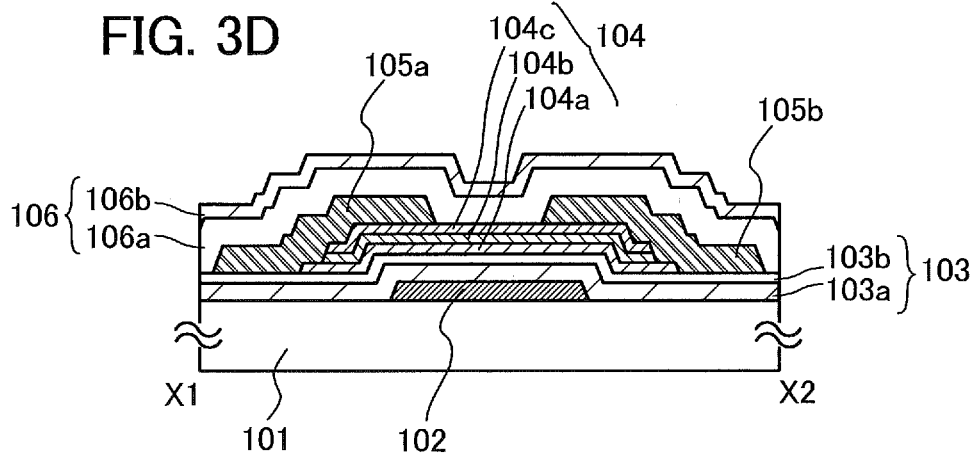

Next, the second insulating film 106 is formed to cover the second conductive films 105a and 105b and the exposed oxide semiconductor film 104 (see FIG. 3D).

The second insulating film 106 can be formed using a single layer or a stack of layers of one or more of the following films formed by a plasma CVD method or a sputtering method: a silicon oxide film, a gallium oxide film, an aluminum oxide film, a silicon nitride film, a silicon oxynitride film, an aluminum oxynitride film, a silicon nitride oxide film, and the like. Note that it is preferable that an oxide insulating layer be formed as the second insulating film 106 (in this embodiment, the insulating layer 106a) in contact with the oxide semiconductor film 104 because the oxide insulating layer can supply oxygen to the oxide semiconductor film 104.

For example, a silicon oxide film or a silicon oxynitride film may be formed under the following conditions: the substrate placed in a deposition chamber of a plasma CVD apparatus, which is vacuum-evacuated, is held at a temperature higher than or equal to 180° C. and lower than or equal to 400° C., preferably higher than or equal to 200° C. and lower than or equal to 370° C., the pressure in the deposition chamber is greater than or equal to 30 Pa and less than or equal to 250 Pa, preferably greater than or equal to 40 Pa and less than or equal to 200 Pa with introduction of a source gas into the deposition chamber, and high-frequency power is supplied to an electrode provided in the deposition chamber. Under the above conditions, an oxide insulating layer through which oxygen is diffused can be formed.

After the formation of the oxide insulating layer through which oxygen is diffused, a silicon oxide film or a silicon oxynitride film may be formed under the following conditions: the substrate placed in a deposition chamber of the plasma CVD apparatus, which is vacuum-evacuated, without exposure to the air is held at a temperature higher than or equal to 180° C. and lower than or equal to 250° C., preferably higher than or equal to 180° C. and lower than or equal to 230° C., the pressure in the deposition chamber is greater than or equal to 100 Pa and less than or equal to 250 Pa, preferably greater than or equal to 100 Pa and less than or equal to 200 Pa with introduction of a source gas into the deposition chamber, and high-frequency power higher than or equal to 0.17 W/cm$^2$ and lower than or equal to 0.5 W/cm$^2$, preferably higher than or equal to 0.26 W/cm$^2$ and lower than or equal to 0.35 W/cm$^2$ is supplied to an electrode provided in the deposition chamber. Under the above conditions, the decomposition efficiency of the source gas in plasma is enhanced, oxygen radicals are increased, and oxidation of the source gas is promoted; thus, the oxygen content in the formed silicon oxide film or silicon oxynitride film is in excess of that in the stoichiometric composition. However, the bonding strength of silicon and oxygen is weak in the above substrate temperature range; therefore, part of oxygen is released by heating. Thus, it is possible to form an oxide insulating layer which contains oxygen in a proportion higher than that of oxygen in the stoichiometric composition and from which part of oxygen is released by heating.

In this embodiment, a stack of the silicon oxide film through which oxygen is diffused and the silicon oxide film from which part of oxygen is released by heating, which are described above, is formed as the insulating layer 106a, and a silicon nitride film is formed as the insulating layer 106b.

The structure described in this embodiment includes oxide insulating layers (specifically, silicon oxide films) as the insulating layers (the insulating layer 103b and the insulating layer 106a) in contact with the oxide semiconductor film 104. Thus, oxygen can be supplied to the first oxide semiconductor layer 104a and the third oxide semiconductor layer 104c to fill oxygen vacancies in the oxide semiconductor layers. The structure also includes silicon nitride films as the insulating layers (the insulating layer 103a and the insulating layer 106b) provided on an outer side of the oxide insulating layers in contact with the oxide semiconductor film 104. The silicon nitride films can function as blocking films which prevent the entry of hydrogen or a compound containing hydrogen (e.g., water) into the oxide semiconductor film 104. Therefore, the reliability of a transistor including such a stacked-layer structure can be improved.

Heat treatment may be performed after the second insulating film 106 is formed. The temperature of the heat treatment is typically higher than or equal to 150° C. and lower than the strain point of the substrate, preferably higher than or equal to 200° C. and lower than or equal to 450° C., more preferably higher than or equal to 300° C. and lower than or equal to 450° C.

Through the above steps, the transistor 100 of this embodiment can be formed.

In the transistor described in this embodiment, the second oxide semiconductor layer 104b which functions as a current path (channel) of the transistor is sandwiched between the first oxide semiconductor layer 104a and the third oxide semiconductor layer 104c which have lower carrier densities than the second oxide semiconductor layer 104b. In this structure, the channel can be formed away from the interface with the insulating layer in contact with the oxide semiconductor film 104, i.e., a buried channel can be formed; thus, the field-effect mobility of the transistor can be improved. Further, this structure prevents formation of a trap state at the interface of the second oxide semiconductor layer 104b functioning as the channel, and thus enables the transistor to have high reliability.

The structures, methods, and the like described in this embodiment can be combined as appropriate with any of the structures, methods, and the like described in the other embodiments.

(Embodiment 3)

In this embodiment, one embodiment of a method for manufacturing a transistor 200, which has a structure different from those of the transistor 100 described in Embodiments 1 and 2, is described with reference to FIGS. 5A to 5D, FIGS. 6A to 6D, and FIGS. 7A to 7D.

The transistor 200 illustrated in FIGS. 5A to 5D is different from the transistor 100 described in Embodiments 1 and 2 in the shape of the third oxide semiconductor layer, but the other portions are the same. FIG. 5A is a plan view of the transistor 200, FIG. 5B is a cross-sectional view taken along line X1-X2 in FIG. 5A, and FIG. 5C is a cross-sectional view taken along line Y1-Y2 in FIG. 5A.

The transistor 200 includes, like the transistor 100, a first conductive film 202 functioning as a gate electrode over a substrate 201 having an insulating surface, a first insulating film 203 functioning as a gate insulating film over the first conductive film 202, an oxide semiconductor film 204 being in contact with the first insulating film 203 and overlapping with the first conductive film 202, and second conductive films 205a and 205b being electrically connected to the oxide semiconductor film 204 and functioning as a source electrode and a drain electrode. Further, a second insulating film 206 covering the second conductive films 205a and 205b and being in contact with the oxide semiconductor film 204 may be included as a component of the transistor 200. The channel length of the transistor 200 can be, for example, 1 μm or more.

In this embodiment, as in Embodiments 1 and 2, the first insulating film 203 has a stacked-layer structure of an insulating layer 203a in contact with the first conductive film 202 and an insulating layer 203b over the insulating layer 203a and in contact with the oxide semiconductor film 204. Further, the second insulating film 206 has a stacked-layer structure of an insulating layer 206a in contact with the second conductive films 205a and 205b and an insulating layer 206b over the insulating layer 206a.

The oxide semiconductor film 204 includes a first oxide semiconductor layer 204a in contact with the first insulating film 203, a second oxide semiconductor layer 204b on and in contact with the first oxide semiconductor layer 204a, and a third oxide semiconductor layer 204c on and in contact with the second oxide semiconductor layer 204b and in contact with the second conductive films 205a and 205b. The oxide semiconductor film 204 is processed into an island-shaped pattern as illustrated in FIG. 5A.

FIG. 5D is a diagram of an enlarged right end of the oxide semiconductor film 204 in the cross-sectional view illustrated in FIG. 5B. At an end portion of the oxide semiconductor film 204, an end portion of the second oxide semiconductor layer 204b is provided on an inner side than an end portion of the first oxide semiconductor layer 204a. In other words, the end portion of the first oxide semiconductor layer 204a extends to the outside beyond the end portion of the second oxide semiconductor layer 204b by a distance L.

Further, an end portion of the third oxide semiconductor layer 204c in this embodiment is positioned on an outer side than the end portion of the first oxide semiconductor layer 204a and the end portion of the second oxide semiconductor layer 204b. Thus, the end portion of the first oxide semiconductor layer 204a and the end portion of the second oxide semiconductor layer 204b are in contact with the third oxide semiconductor layer 204c. Since the first oxide semiconductor layer 204a extends beyond the second oxide semiconductor layer 204b, a surface of the first oxide semiconductor layer 204a is exposed. The exposed surface is also in contact with the third oxide semiconductor layer 204c.

That is, the second oxide semiconductor layer 204b functioning as a channel formation region is completely wrapped by the first oxide semiconductor layer 204a and the third oxide semiconductor layer 204c. In the transistor 100 described in Embodiments 1 and 2, the side surfaces of the second oxide semiconductor layer 104b are in contact with the second conductive films 105a and 105b. In contrast, in the transistor 200, the second oxide semiconductor layer 204b is not in contact with the second conductive films 205a and 205b, and the third oxide semiconductor layer 204c is provided between the second oxide semiconductor layer 204b and the second conductive film 205a and between the second oxide semiconductor layer 204b and the second conductive film 205b. Thus, in the transistor 200, the third oxide semiconductor layer 204c can be used as an offset because a current path between a source and a drain necessarily passes through the third oxide semiconductor layer 204c.

Next, a method for manufacturing the transistor 200 is described with reference to FIGS. 6A to 6D and FIGS. 7A to 7D.

First, the first conductive film 202 is formed over the substrate 201 having an insulating surface, and the first insulating film 203 is formed over the first conductive film 202. In this embodiment, the first insulating film 203 is formed using a stack of the insulating layer 203a and the insulating layer 203b formed thereover. The process up to this step is similar to that in the method for manufacturing the transistor 100 described in Embodiment 2, and the substrate 201, the first conductive film 202, and the first insulating film 203 can be formed using the same materials or the same methods as those in the method for manufacturing the transistor 100 described in Embodiment 2.

Next, an oxide semiconductor film is formed over the first insulating film 203. First, the first oxide semiconductor layer 204a and the second oxide semiconductor layer 204b are stacked over the first insulating film 203 in this order (see FIG. 6A). The first oxide semiconductor layer 204a and the second oxide semiconductor layer 204b can be formed using the material described in Embodiment 1 and the method described in Embodiment 2.

Figure 7A:
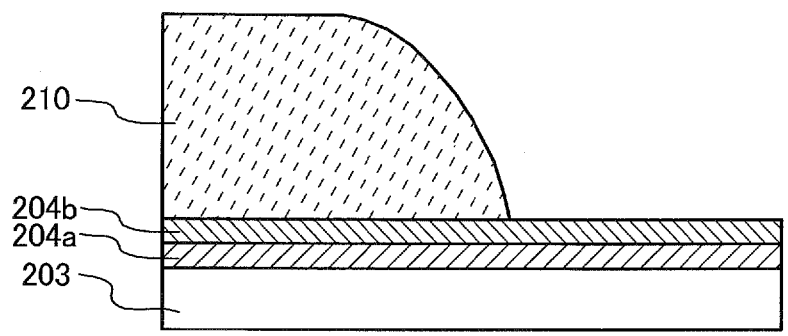
FIGS. 7A to 7D illustrate an example of a method for manufacturing the semiconductor device.

A photoresist film 210 is formed over the second oxide semiconductor layer 204b (see FIG. 7A). The photoresist film 210 is shaped into a desired pattern because it is used as a mask for processing the first oxide semiconductor layer 204a and the second oxide semiconductor layer 204b into an island-shaped pattern. The photoresist film is shaped into a pattern by performing steps such as prebaking, light exposure using a photomask, development, and postbaking after a photoresist material is applied.

Next, wet etching is performed on the second oxide semiconductor layer 204b using an etchant 211. As the etchant 211, for example, a mixed solution of phosphoric acid, acetic acid, and nitric acid, or the like can be used. Alternatively, ITO-07N (produced by KANTO CHEMICAL CO., INC.) may be used. Since the above-described photoresist film 210 functions as a mask here, the second oxide semiconductor layer 204b which is not covered with the photoresist film 210 is etched.

Figure 7B:
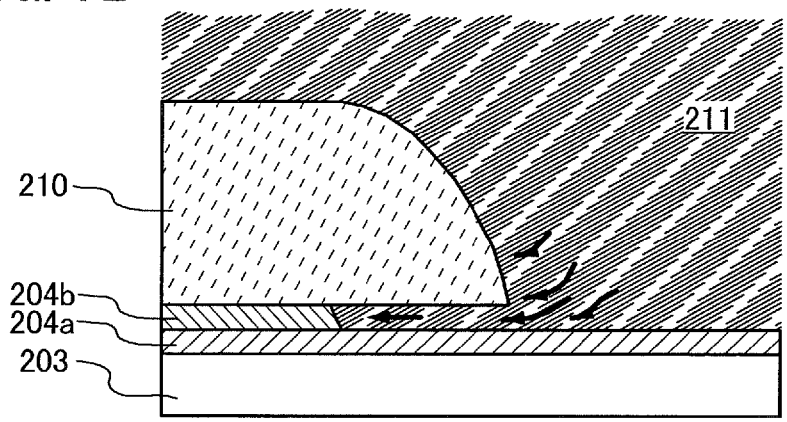

Since wet etching is isotropic etching, the etchant enters below the photoresist film 210 as the etching progresses, so that side surfaces of the second oxide semiconductor layer 204b are etched as illustrated in FIG. 7B.

At this time, the first oxide semiconductor layer 204a is hardly etched. This is because etching rate of an oxide semiconductor whose bandgap is large and electron affinity is small, which is suitable for the first oxide semiconductor layer 204a, by the etchant is extremely low as compared with the second oxide semiconductor layer 204b.

The side surfaces of the second oxide semiconductor layer 204b are etched until at least the end portion of the second oxide semiconductor layer 204b is positioned on the inner side than an end portion of the photoresist film 210. Further preferably, when the thickness of the second oxide semiconductor layer 204b is denoted by T, the etching is performed until the end portion of the second oxide semiconductor layer 204b is positioned on the inner side than the end portion of the photoresist film 210 by T or more. As described above, when the distance between the end portion of the second oxide semiconductor layer 204b and the end portion of photoresist film 210 is surely secured, generation of oxygen vacancies in the second oxide semiconductor layer 204b, which might occur in later-described dry etching of the first oxide semiconductor layer 204a, can be suppressed.

Next, without removing the photoresist film 210, dry etching is performed on the first oxide semiconductor layer 204a using the photoresist film 210 as a mask again. As the dry etching, an inductively coupled plasma (ICP) etching method may be used. In the case where an IGZO film is etched by an ICP etching method, the oxide semiconductor layer can be etched, for example, under the following etching conditions: the etching gas is $BCl_3$ (flow rate: 800 sccm), the ICP power is 0 W, the bias power is 2500 W, the pressure is 2.0 Pa, and the lower electrode temperature is 20° C.

Figure 7C:
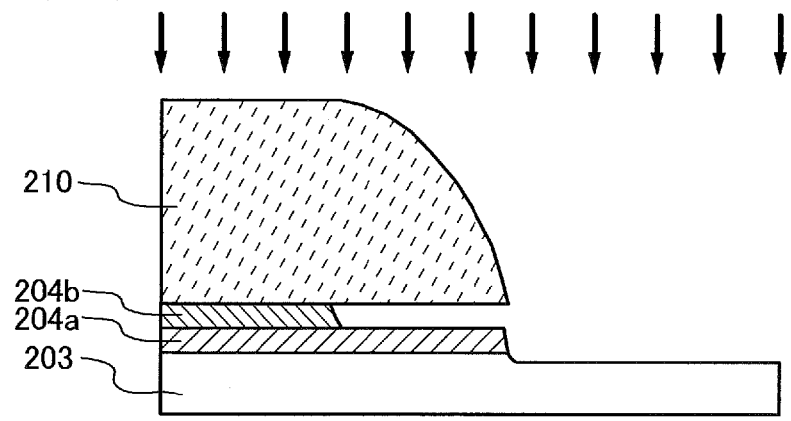
Figure 7D:
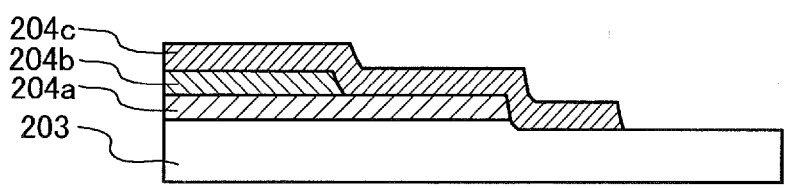

Dry etching is highly anisotropic etching in general. Therefore, a portion of the first oxide semiconductor layer 204a which is not covered with the photoresist film 210 is etched as illustrated in FIG. 7C. On the other hand, the first oxide semiconductor layer 204a positioned below the photoresist film 210 is hardly exposed to a dry etching atmosphere; thus, the first oxide semiconductor layer 204a remains unetched.

Here, through the above-described wet etching step, the second oxide semiconductor layer 204b is positioned on the inner side than the end portion of the photoresist film 210. Accordingly, the end portion of the second oxide semiconductor layer 204b is not exposed to a dry etching atmosphere. Thus, particularly at the end portion of the second oxide semiconductor layer 204b functioning as the channel formation region, generation of oxygen vacancies can be suppressed. In other words, at the end portion of the second oxide semiconductor layer 204b in the island-shaped pattern, a change of the conductivity to an n-type is prevented, and variation in transistor characteristics due to a parasitic channel generated by the change of the conductivity to an n-type can be suppressed.

Note that in this dry etching step, etching is performed excessively in general (referred to as over etching) so that a residue of the first oxide semiconductor layer 204a does not occur through the etching. Therefore, an upper surface of the first insulating film 203 is slightly removed in some cases. Due to over etching, side surfaces of the first oxide semiconductor layer 204a are removed slightly in some cases. Therefore, it is preferable that the end portion of the second oxide semiconductor layer 204b be positioned on a sufficiently inner side than the end portion of the photoresist film 210.

Further, depending on a material or thickness of the photoresist film 210, or dry etching conditions, a surface of the photoresist film 210 is removed little by little as dry etching progresses in some cases. Therefore, it is preferable that the end portion of the second oxide semiconductor layer 204b be positioned on the sufficiently inner side than the end portion of the photoresist film 210.

After the dry etching step, the photoresist film 210 is removed.

Then, the third oxide semiconductor layer 204c is formed. The third oxide semiconductor layer 204c can be formed using the same material or method as that of the third oxide semiconductor layer 104c described in Embodiment 2. The third oxide semiconductor layer 204c is processed into an island-shaped pattern by a photolithography method. Processing into the island-shaped pattern can be performed by a wet etching method or a dry etching method. In particular, a wet etching method is preferable because in such a case, oxygen vacancies are hardly formed at the end portion of the third oxide semiconductor layer 204c as compared with the case of using a dry etching method.

As a result, the oxide semiconductor film 204 is formed in which the end portion of the third oxide semiconductor layer 204c is positioned on an outer side than the end portion of the first oxide semiconductor layer 204a and the end portion of the second oxide semiconductor layer 204b. The end portion of the first oxide semiconductor layer 204a and the end portion of the second oxide semiconductor layer 204b are in contact with the third oxide semiconductor layer 204c. Since the first oxide semiconductor layer 204a extends beyond the second oxide semiconductor layer 204b, a surface of the first oxide semiconductor layer 204a is exposed. The exposed surface is also in contact with the third oxide semiconductor layer 204c.

Although not illustrated, the structure may be such that the island-shaped pattern of the processed third oxide semiconductor layer 204c is in contact with the end portion of the second oxide semiconductor layer 204b and is not in contact with the end portion of the first oxide semiconductor layer 204a. That is, the end portion of the third oxide semiconductor layer 204c may be positioned on the exposed surface of the first oxide semiconductor layer 204a. The exposed surface is formed due to the structure in which the third oxide semiconductor layer 204c extends beyond the second oxide semiconductor layer 204b.

After that, the second conductive films 205a and 205b and the second insulating film 206 including, for example, the insulating layer 206a and the insulating layer 206b are formed over the oxide semiconductor film 204. These processes are similar to those in the method for manufacturing the transistor 100 described in Embodiment 2, and the second conductive films 205a and 205b and the second insulating film 206 can be manufactured using the same materials or methods as those in the method for manufacturing the transistor 100 described in Embodiment 2.

Through the above steps, the transistor 200 of this embodiment can be formed.

In the transistor described in this embodiment, the second oxide semiconductor layer 204b which functions as a current path (channel) of the transistor is sandwiched between the first oxide semiconductor layer 204a and the third oxide semiconductor layer 204c which have lower carrier densities than the second oxide semiconductor layer 204b. In this structure, the channel can be formed away from the interface with the insulating layer in contact with the oxide semiconductor film 204, i.e., a buried channel can be formed; thus, the field-effect mobility of the transistor can be improved. Further, this structure prevents formation of a trap state at the interface of the second oxide semiconductor layer 204b functioning as the channel, and thus enables the transistor to have high reliability.

The structures, methods, and the like described in this embodiment can be combined as appropriate with any of the structures, methods, and the like described in the other embodiments.

(Embodiment 4)

In this embodiment, a semiconductor device having a structure different from the structures of the semiconductor devices described in Embodiments 1 to 3 is described with reference to FIGS. 8A and 8B. In this embodiment, bottom-gate transistors 300 and 320, which are different from the bottom-gate transistors described in Embodiments 1 to 3, are described as embodiments of the semiconductor device. Note that the same portions as Embodiments 1 to 3 or portions having functions similar to those of Embodiments 1 to 3 can be formed as in Embodiments 1 to 3, and also the same steps as Embodiments 1 to 3 or the steps similar to those of Embodiments 1 to 3 can be performed in a manner similar to those of Embodiments 1 to 3; therefore, repetitive description thereof is omitted. In addition, detailed description of the same portions is not repeated.

Figure 8A:
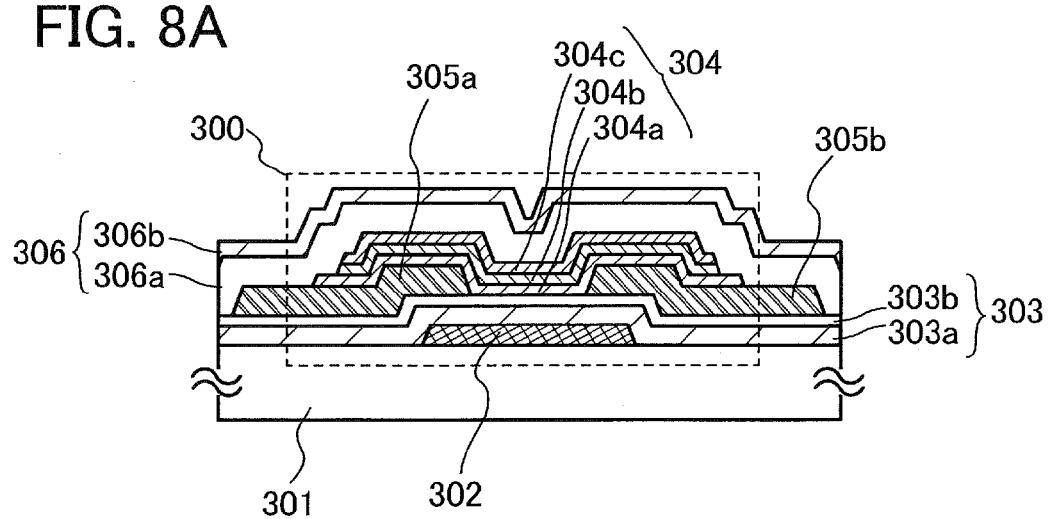
FIGS. 8A and 8B are cross-sectional views each illustrating one embodiment of a semiconductor device.

FIG. 8A is a cross-sectional view of the transistor 300.

The transistor 300 illustrated in FIG. 8A includes a first conductive film 302 functioning as a gate electrode over a substrate 301 having an insulating surface, a first insulating film 303 functioning as a gate insulating film over the first conductive film 302, second conductive films 305a and 305b functioning as a source electrode and a drain electrode over the first insulating film 303, and an oxide semiconductor film 304 electrically connected to the second conductive films 305a and 305b. A second insulating film 306 covering the oxide semiconductor film 304 may be provided as a component of the transistor 300. The channel length of the transistor 300 can be, for example, 1 μm or more.

In this embodiment, as in Embodiments 1 to 3, the first insulating film 303 has a stacked-layer structure of an insulating layer 303a in contact with the first conductive film 302 and an insulating layer 303b over the insulating layer 303a and in contact with the second conductive films 305a and 305b. Further, the second insulating film 306 has a stacked-layer structure of an insulating layer 306a in contact with the oxide semiconductor film 304 and an insulating layer 306b over the insulating layer 306a.

The oxide semiconductor film 304 includes a first oxide semiconductor layer 304a in contact with the second conductive films 305a and 305b, a second oxide semiconductor layer 304b on and in contact with the first oxide semiconductor layer 304a, and a third oxide semiconductor layer 304c on and in contact with the second oxide semiconductor layer 304b. The oxide semiconductor film 304 is processed into an island-shaped pattern.

Here, at an end portion of the oxide semiconductor film 304, an end portion of the second oxide semiconductor layer 304b and an end portion of the third oxide semiconductor layer 304c are provided on an inner side than an end portion of the first oxide semiconductor layer 304a. In other words, the end portion of the first oxide semiconductor layer 304a extends to the outside beyond the end portion of the second oxide semiconductor layer 304b and the end portion of the third oxide semiconductor layer 304c. That is, as for the outer edge of the island-shaped pattern of the oxide semiconductor film 304, the end portion of the first oxide semiconductor layer 304a extends beyond the end portion of the second oxide semiconductor layer 304b and the end portion of the third oxide semiconductor layer 304c; thus, the upper surface of the first oxide semiconductor layer 304a is slightly exposed. Such a structure can be formed by the method described in Embodiment 2.

Note that the end portion of the second oxide semiconductor layer 304b and the end portion of the third oxide semiconductor layer 304c are not necessarily aligned. The end portion of the second oxide semiconductor layer 304b may be positioned on an outer side than the end portion of the third oxide semiconductor layer 304c, and the end portion of the second oxide semiconductor layer 304b may be positioned on an inner side as compared with the end portion of the third oxide semiconductor layer 304c.

Further, when the distance between the end portion of the second oxide semiconductor layer 304b and the end portion of the first oxide semiconductor layer 304a is denoted as L, the distance L is preferably longer than or equal to the sum of thicknesses of the second oxide semiconductor layer 304b and the third oxide semiconductor layer 304c. As described above, when the distance between the end portion of the first oxide semiconductor layer 304a and the end portion of the second oxide semiconductor layer 304b is surely secured, generation of oxygen vacancies in the second oxide semiconductor layer 304b, which might occur in later-described dry etching of the first oxide semiconductor layer 304a, can be suppressed.

Since the end portion of the first oxide semiconductor layer 304a extends beyond the end portion of the second oxide semiconductor layer 304b and the end portion of the third oxide semiconductor layer 304c, a portion of the first oxide semiconductor layer 304a is exposed. The exposed portion does not necessarily have the same thickness as an unexposed portion of the first oxide semiconductor layer 304a. By etching the second oxide semiconductor layer 304b and the third oxide semiconductor layer 304c, the first oxide semiconductor layer 304a is also etched, so that the thickness of the exposed portion of the first oxide semiconductor layer 304a is smaller than that of the unexposed portion thereof in some cases.

Figure 8B:
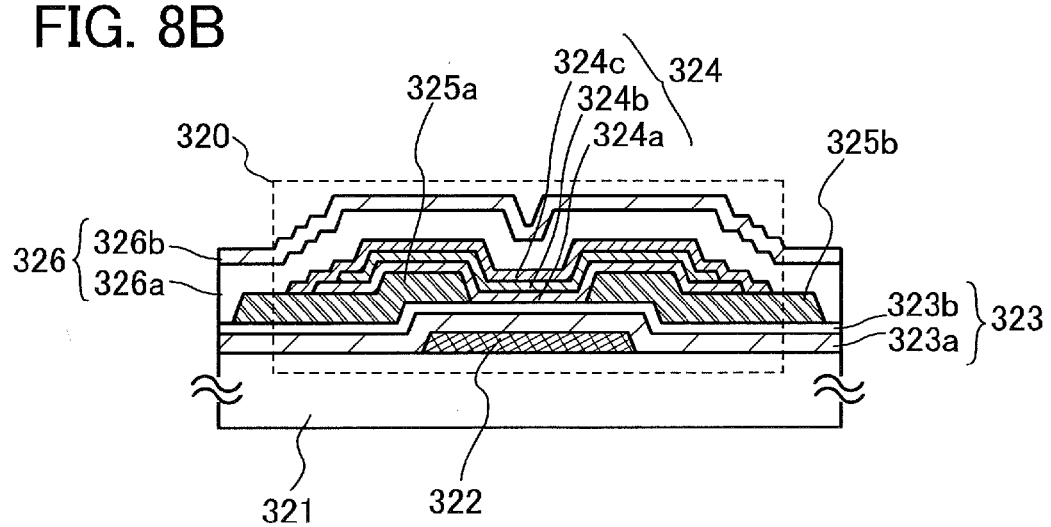

FIG. 8B is a cross-sectional view of the transistor 320.

The transistor 320 has the same structure as the above-described transistor 300 except the structure of the oxide semiconductor film. That is, the transistor 320 includes a first conductive film 322 functioning as a gate electrode over a substrate 321 having an insulating surface, a first insulating film 323 functioning as a gate insulating film over the first conductive film 322, second conductive films 325a and 325b functioning as a source electrode and a drain electrode over the first insulating film 323, and an oxide semiconductor film 324 electrically connected to the second conductive films 325a and 325b. A second insulating film 326 covering the oxide semiconductor film 324 may be provided as a component of the transistor 320. The channel length of the transistor 320 can be, for example, 1 μm or more.

The first insulating film 323 has a stacked-layer structure of an insulating layer 323a in contact with the first conductive film 322 and an insulating layer 323b over the insulating layer 323a and in contact with the second conductive films 325a and 325b. Further, the second insulating film 326 has a stacked-layer structure of an insulating layer 326a in contact with the oxide semiconductor film 324 and an insulating layer 326b over the insulating layer 326a.

The oxide semiconductor film 324 includes a first oxide semiconductor layer 324a in contact with the second conductive films 325a and 325b, a second oxide semiconductor layer 324b on and in contact with the first oxide semiconductor layer 324a, and a third oxide semiconductor layer 324c on and in contact with the second oxide semiconductor layer 324b. The oxide semiconductor film 324 is processed into an island-shaped pattern.

At an end portion of the oxide semiconductor film 324, an end portion of the second oxide semiconductor layer 324b is provided on an inner side than an end portion of the first oxide semiconductor layer 324a. In other words, the end portion of the first oxide semiconductor layer 324a extends to the outside beyond the end portion of the second oxide semiconductor layer 324b.

Further, an end portion of the third oxide semiconductor layer 324c is positioned on an outer side than the end portion of the first oxide semiconductor layer 324a and the end portion of the second oxide semiconductor layer 324b. Thus, the end portion of the first oxide semiconductor layer 324a and the end portion of the second oxide semiconductor layer 324b are in contact with the third oxide semiconductor layer 324c. Since the first oxide semiconductor layer 324a extends beyond the second oxide semiconductor layer 324b, a surface of the first oxide semiconductor layer 324a is exposed. The exposed surface is also in contact with the third oxide semiconductor layer 324c.

Although not illustrated, the structure may be such that the island-shaped pattern of the processed third oxide semiconductor layer 324c is in contact with the end portion of the second oxide semiconductor layer 324b and is not in contact with the end portion of the first oxide semiconductor layer 324a. That is, the end portion of the third oxide semiconductor layer 324c may be positioned on the exposed surface of the first oxide semiconductor layer 324a. The exposed surface is formed due to the structure in which the first oxide semiconductor layer 324a extends beyond the second oxide semiconductor layer 324b.

That is, the second oxide semiconductor layer 324b functioning as a channel formation region is completely wrapped by the first oxide semiconductor layer 324a and the third oxide semiconductor layer 324c. In the transistor 320, the second oxide semiconductor layer 324b is not in contact with the second conductive films 325a and 325b, and the first oxide semiconductor layer 324a is provided between the second oxide semiconductor layer 324b and the second conductive film 325a and between the second oxide semiconductor layer 324b and the second conductive film 325b. Thus, in the transistor 320, the first oxide semiconductor layer 324a can be used as an offset because a current path between a source and a drain necessarily passes through the first oxide semiconductor layer 324a.

The structures, methods, and the like described in this embodiment can be combined as appropriate with any of the other structures, methods, and the like described in the other embodiments.

(Embodiment 5)

In this embodiment, an example of an oxide semiconductor layer applicable to the transistors of Embodiments 1 to 4 is described with reference to FIGS. 9A to 9C, FIGS. 10A and 10B, and FIGS. 11A to 11C.

An oxide semiconductor layer is classified roughly into a single-crystal oxide semiconductor layer and a non-single-crystal oxide semiconductor layer. The non-single-crystal oxide semiconductor layer includes any of an amorphous oxide semiconductor layer, a microcrystalline oxide semiconductor layer, a polycrystalline oxide semiconductor layer, a c-axis aligned crystalline oxide semiconductor (CAAC-OS) film, and the like.

The amorphous oxide semiconductor layer has disordered atomic arrangement and no crystalline component. A typical example thereof is an oxide semiconductor layer in which no crystal part exists even in a microscopic region, and the whole of the layer is amorphous.

The microcrystalline oxide semiconductor layer includes a microcrystal (also referred to as nanocrystal) with a size greater than or equal to 1 nm and less than 10 nm, for example. Thus, the microcrystalline oxide semiconductor layer has a higher degree of atomic order than the amorphous oxide semiconductor layer. Hence, the density of defect states of the microcrystalline oxide semiconductor layer is lower than that of the amorphous oxide semiconductor layer.

The CAAC-OS film is one of oxide semiconductor layers including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor layer. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when $2\theta$ is around 56°. This peak is derived from the (110) plane of the $InGaZnO_4$ crystal. Here, analysis ($\phi$ scan) is performed under conditions where the sample is rotated around a normal vector of a sample surface as an axis ($\phi$ axis) with $2\theta$ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when $\phi$ scan is performed with $2\theta$ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ do not appear at around 36°.

In a transistor using the CAAC-OS film, change in electrical characteristics due to irradiation with visible light or ultraviolet light is small. Thus, the transistor has high reliability.

Note that an oxide semiconductor layer may be a stacked film including two or more films of an amorphous oxide semiconductor layer, a microcrystalline oxide semiconductor layer, and a CAAC-OS film, for example.

An example of a deposition model of the CAAC-OS film is described below. Note that the following model is just a consideration.

During deposition, fine sputtered particles fly from a target, and a film is formed such that the sputtered particles adhere onto the deposition-target substrate. When the temperature of the substrate is higher than or equal to 200° C., the sputtered particles are rearranged because the substrate is heated. Thus, a dense film is formed.

Figure 9A:
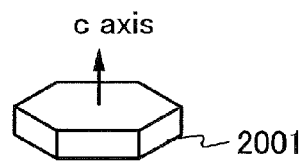
FIG. 9A is a schematic view of a flat-plate-like sputtered particle.
Figure 9B:
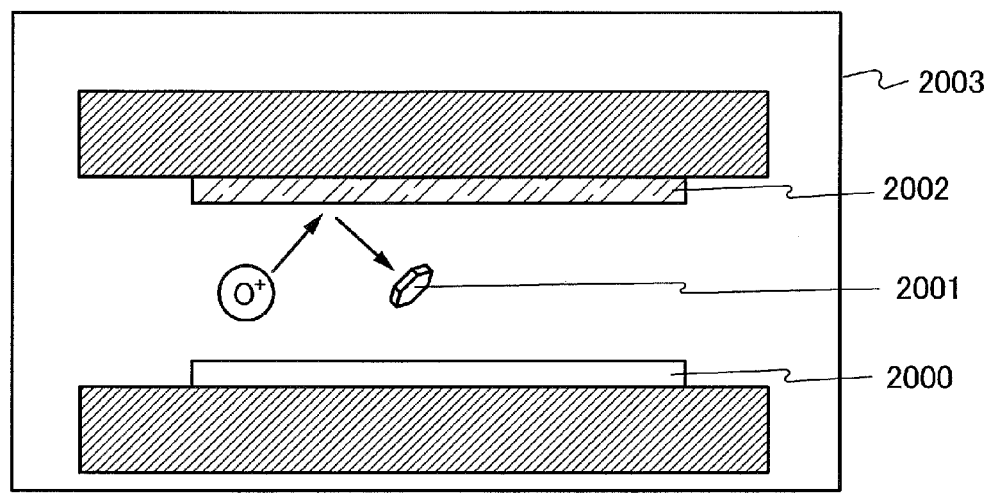
FIG. 9B illustrates a model of deposition.
Figure 9C:
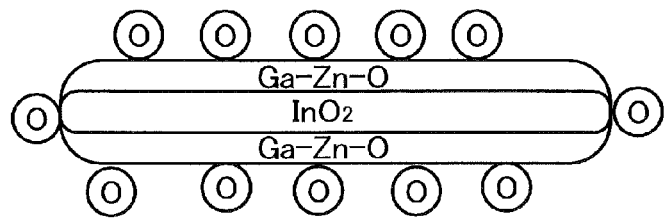
FIG. 9C is a model diagram illustrating a state of a flat-plate-like sputtered particle.

When ions collide with the surface of the sputtering target, a crystal region included in the sputtering target is cleaved along an a-b plane, and sputtered particles whose top and bottom surfaces are each aligned with a layer parallel to the a-b plane (flat-plate-like sputtered particle or pellet-like sputtered particle) are separated from the sputtering target. On the assumption that a crystal particle which is sputtered from the surface of a sputtering target 2002 and released is a flat-plate-like sputtered particle 2001 having c-axis alignment as illustrated in FIG. 9A, film formation can be schematically illustrated by a model diagram in FIG. 9B. The outermost surface of the flat-plate-like sputtered particle is preferably a (Ga or Zn)O plane as illustrated in FIG. 9C.

Figure 10A:
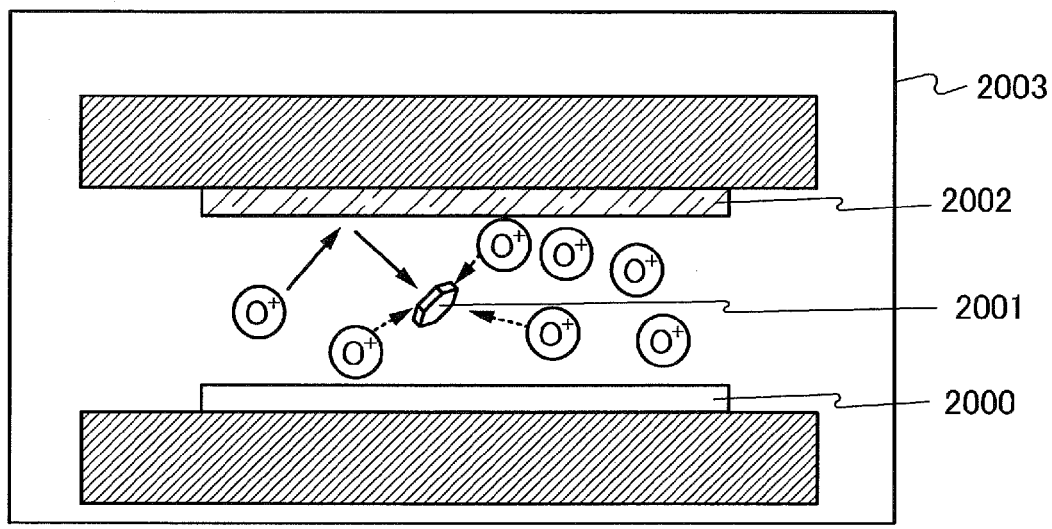
FIG. 10A illustrates a model of deposition and FIG. 10B is a model diagram illustrating a state where oxygen is released from a flat-plate-like sputtered particle.

In film formation, when the oxygen flow rate is high and the pressure inside a chamber 2003 is high, oxygen ions are attached to the flat-plate-like sputtered particle as illustrated in FIG. 10A, so that the flat-plate-like sputtered particle can have much oxygen on its surface. Another flat-plate-like sputtered particle is stacked thereover before the attached oxygen is released; thus, much oxygen can be contained in the film as illustrated in FIG. 11C. This adsorbed oxygen contributes to a reduction in oxygen vacancies in the oxide semiconductor.

Figure 10B:
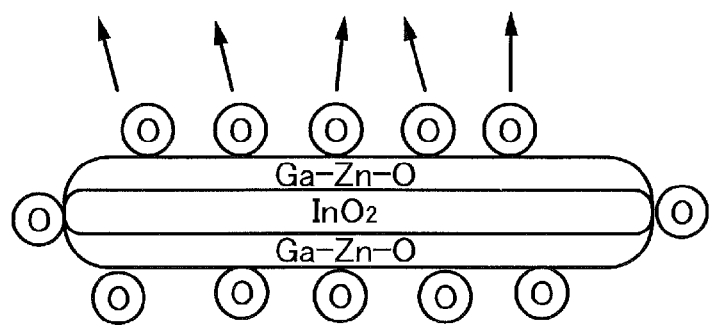

To form an oxide semiconductor film including a crystal region with c-axis alignment, the substrate temperature in film formation is preferably increased. However, when the substrate temperature is higher than 350° C., the adsorbed oxygen might be released as illustrated in FIG. 10B. Accordingly, the substrate temperature is set to be higher than or equal to 150° C. and lower than or equal to 350° C., preferably higher than or equal to 160° C. and lower than or equal to 230° C., and an oxygen gas is used alone as the deposition gas, whereby an oxide semiconductor film including a crystal region with c-axis alignment, i.e., a CAAC-OS film can be formed.

Figure 11A:
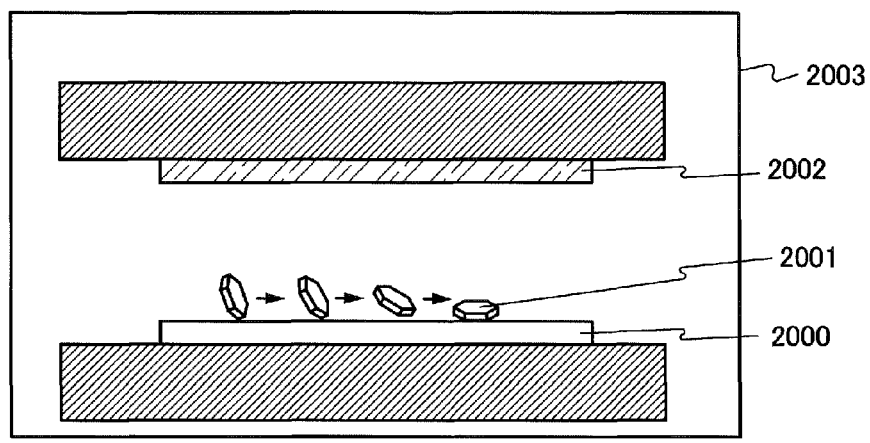
FIGS. 11A and 11B illustrate a model of deposition and FIG. 11C is a model diagram illustrating a state of flat-plate-like sputtered particles.
Figure 11B:
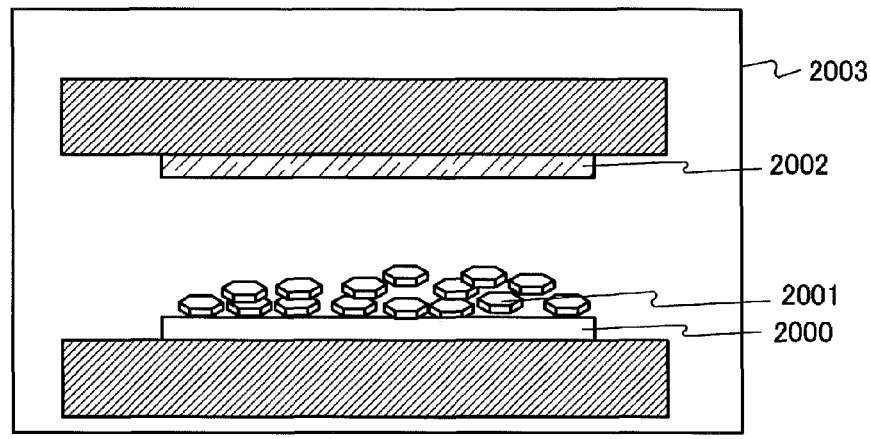
Figure 11C:
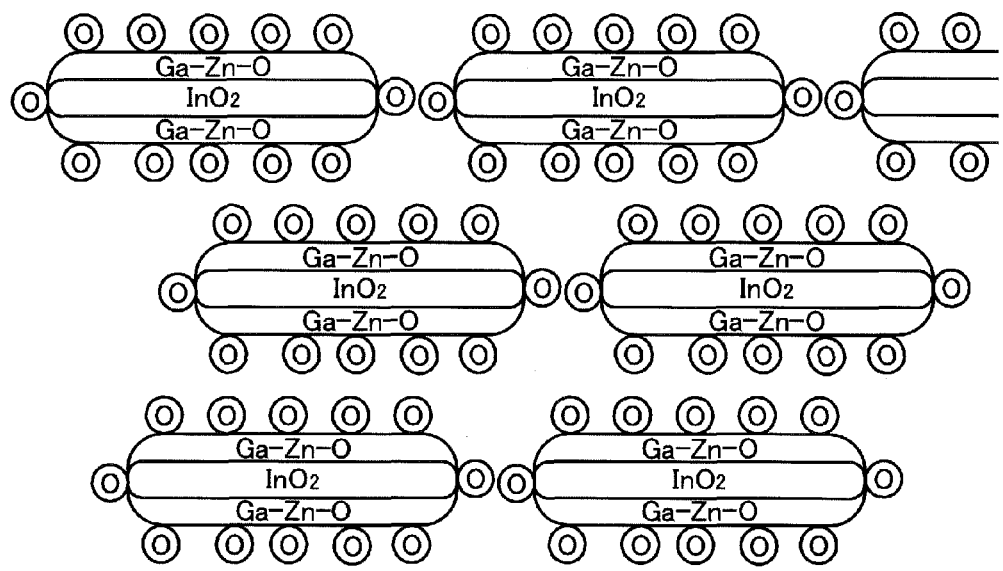

FIG. 11A illustrates a supposed model of a process in which one flat-plate-like sputtered particle reaches the surface of a substrate 2000 and is stabilized in film formation. As illustrated in FIG. 11A, the flat-plate-like sputtered particle reaches the substrate surface with its crystalline state maintained; thus, a CAAC-OS film is likely to be formed. Further, flat-plate-like sputtered particles are stacked as illustrated in FIG. 11B; thus, a CAAC-OS film is likely to be formed. Note that a CAAC-OS film is a film which contains much oxygen as illustrated in FIG. 11C and in which oxygen vacancies are reduced.

In the CAAC-OS film over the substrate 2000, a series of about 2 to 20 indium atoms exist in a lateral direction to form a layer including indium atoms. Note that in some cases, the layer has a series of 20 or more indium atoms; for example, the layer may have a series of 2 to 50 indium atoms, 2 to 100 indium atoms, or 2 to 500 indium atoms in a lateral direction.

Layers including indium atoms overlap with each other. The number of layers is greater than or equal to 1 and less than or equal to 20, greater than or equal to 1 and less than or equal to 10, or greater than or equal to 1 and less than or equal to 4.

As described above, a stack of the layers including indium atoms often appears to be a cluster including several indium atoms in a lateral direction and several layers in a longitudinal direction. This is because each of the sputtered particles has a flat-plate-like shape.

By increasing the temperature of the deposition-target substrate, migration of sputtered particles is likely to occur on a substrate surface. With this effect, a flat-plate-like sputtered particle reaches the substrate surface, moves slightly, and then is attached to the substrate surface with a flat plane (a-b plane) of the sputtered particle facing toward the substrate surface. Therefore, an oxide semiconductor film having a crystal region which is c-axis-aligned perpendicularly to the surface of the oxide semiconductor film is easily formed.

Further, heat treatment at a temperature higher than or equal to 200° C. may be performed after the deposition of the oxide semiconductor film, so that a denser film is obtained. However, in that case, oxygen vacancies might be generated when impurity elements (e.g., hydrogen and water) in the oxide semiconductor film are reduced. Therefore, before the heat treatment is performed, an insulating layer containing excess oxygen is preferably provided over or below the oxide semiconductor film, in which case oxygen vacancies in the oxide semiconductor film can be reduced by the heat treatment.

An oxide semiconductor film shortly after deposition is made dense; thus, a dense film which is thin and close to single crystal can be obtained. Since oxygen, hydrogen, or the like hardly diffuses within the film, a semiconductor device including the dense oxide semiconductor film can achieve improvement in reliability.

In an oxide semiconductor film included in a transistor of one embodiment of the present invention, first to third oxide semiconductor layers may have either an amorphous structure or a crystalline structure. Note that a CAAC-OS film is preferably used as the second oxide semiconductor layer functioning as a channel, in which case the density of states (DOS) attributed to an oxygen vacancy in the second oxide semiconductor layer can be reduced.

In the case where the second oxide semiconductor layer and the third oxide semiconductor layer which is formed on and in contact with the second oxide semiconductor layer are both CAAC-OS films, the crystal structure is preferably continuous between the second oxide semiconductor layer and the third oxide semiconductor layer. When the third oxide semiconductor layer is continuous with the second oxide semiconductor layer in terms of crystal structure, DOS is less likely to be formed at the interface between the two layers.

Note that all of the first to third oxide semiconductor layers may have an amorphous structure or may be CAAC-OS films. Note that, as described above, the first oxide semiconductor layer in contact with the first insulating film (gate insulating film) might contain a constituent element of the first insulating film as an impurity, in which case the first oxide semiconductor layer might become amorphous. Here, when the thickness of the first oxide semiconductor layer is greater than or equal to 3 nm and less than or equal to 20 nm, preferably greater than or equal to 5 nm and less than or equal to 10 nm, even when part of the first oxide semiconductor layer becomes amorphous owing to the impurity, influence upon the second oxide semiconductor layer can be reduced, so that the second oxide semiconductor layer including its interface with the first oxide semiconductor layer can be a CAAC-OS film.

The oxide semiconductor layer described in this embodiment can be applied to the semiconductor devices in Embodiments 1 to 4.

(Embodiment 6)

A semiconductor device having a display function (also referred to as a display device) can be manufactured using any of the transistors described in Embodiments 1 to 5. Further, part or all of the driver circuitry which includes the transistor can be formed over a substrate where a pixel portion is formed, whereby a system-on-panel can be formed.

Figure 12A:
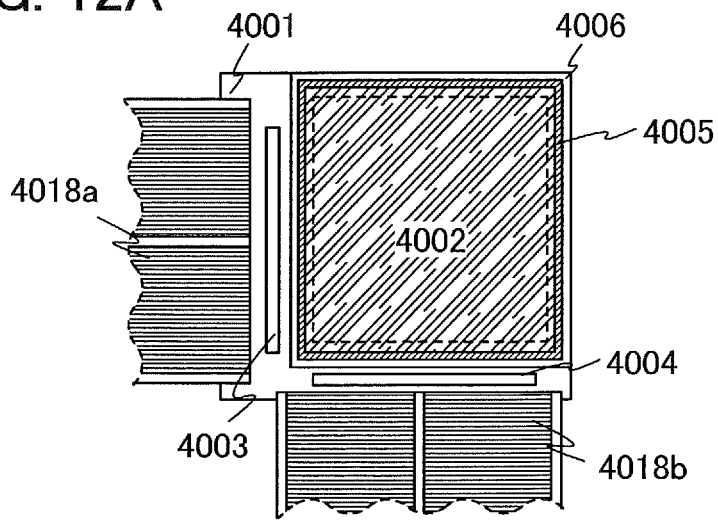
FIGS. 12A to 12C each illustrate one embodiment of a semiconductor device.

In FIG. 12A, a sealant 4005 is provided so as to surround a pixel portion 4002 provided over a substrate 4001, and the pixel portion 4002 is sealed with a substrate 4006. In FIG. 12A, a scan line driver circuit 4004 and a signal line driver circuit 4003 which are each formed using a single crystal semiconductor film or a polycrystalline semiconductor film over an IC chip or a substrate separately prepared are mounted on the substrate 4001, in a region that is different from the region surrounded by the sealant 4005. Various signals and potentials are supplied to the pixel portion 4002 through the signal line driver circuit 4003 and the scan line driver circuit 4004 from flexible printed circuits (FPCs) 4018a and 4018b.

Figure 12B:
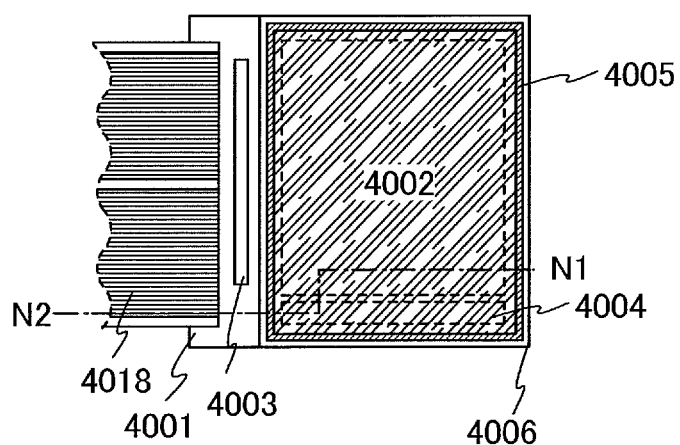
Figure 12C:
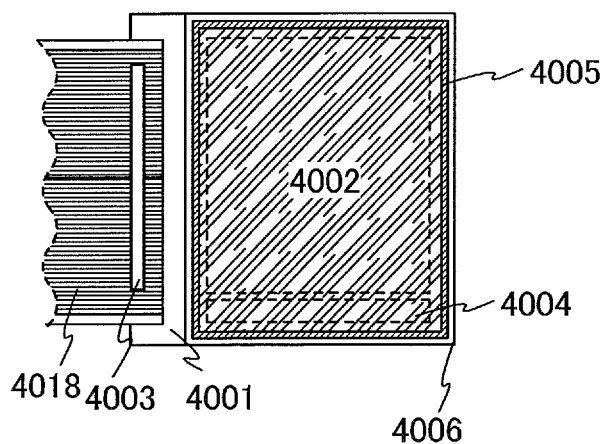

In FIGS. 12B and 12C, the sealant 4005 is provided to surround the pixel portion 4002 and the scan line driver circuit 4004 which are provided over the substrate 4001. The substrate 4006 is provided over the pixel portion 4002 and the scan line driver circuit 4004. Consequently, the pixel portion 4002 and the scan line driver circuit 4004 are sealed together with a display element by the substrate 4001, the sealant 4005, and the substrate 4006. In FIGS. 12B and 12C, the signal line driver circuit 4003 which is formed using a single crystal semiconductor film or a polycrystalline semiconductor film over an IC chip or a substrate separately prepared is mounted on the substrate 4001, in a region that is different from the region surrounded by the sealant 4005. In FIGS. 12B and 12C, various signals and potentials are supplied to the pixel portion 4002 through the signal line driver circuit 4003 and the scan line driver circuit 4004 from an FPC 4018.

Although FIGS. 12B and 12C each illustrate an example in which the signal line driver circuit 4003 is formed separately and mounted on the substrate 4001, one embodiment of the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method, or the like can be used. FIG. 12A shows an example in which the signal line driver circuit 4003 and the scan line driver circuit 4004 are mounted by a COG method. FIG. 12B shows an example in which the signal line driver circuit 4003 is mounted by a COG method. FIG. 12C shows an example in which the signal line driver circuit 4003 is mounted by a TAB method.

Note that the display device includes in its category a panel in which the display element is sealed, and a module in which an IC including a controller or the like is mounted on the panel. Specifically, a display device in this specification means an image display device, a display device, or a light source (including a lighting device). Furthermore, the display device also includes the following modules in its category: a module to which a connector such as an FPC or a TCP is attached; a module having a TCP at the tip of which a printed wiring board is provided; and a module in which an integrated circuit (IC) is directly mounted on a display element by a COG method.

The pixel portion and the scan line driver circuit provided over the substrate include a plurality of transistors, and any of the transistors described in Embodiments 1 to 5 can be applied thereto.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by current or voltage, and specifically includes an inorganic electroluminescent (EL) element, an organic EL element, and the like. Furthermore, a display medium whose contrast is changed by an electric effect, such as an electrophoretic display device (electronic paper), can be used.

Embodiments of the semiconductor device are described with reference to FIGS. 12A to 12C and FIGS. 13A and 13B. FIGS. 13A and 13B correspond to cross-sectional views along line N1-N2 in FIG. 12B. Examples of a liquid crystal display device using a liquid crystal element as a display element are illustrated in FIGS. 13A and 13B.

A liquid crystal display device can employ a vertical electric field mode or a horizontal electric field mode. FIG. 13A illustrates an example in which a vertical electric field mode is employed, and FIG. 13B illustrates and example in which a fringe field switching (FFS) mode, which is one of horizontal electric field modes, is employed.

Note that a transistor 4010 provided in the pixel portion 4002 is electrically connected to a display element to form a display panel. A variety of display elements can be used as the display element as long as display can be performed.

As illustrated in FIGS. 13A and 13B, the semiconductor device includes a connection terminal electrode 4015 and a terminal electrode 4016. The connection terminal electrode 4015 and the terminal electrode 4016 are electrically connected to a terminal included in the FPC 4018 or 4018b through an anisotropic conductive film 4019.

The connection terminal electrode 4015 is formed from the same conductive layer as a first electrode layer 4034. The terminal electrode 4016 is formed from the same conductive layer as gate electrode layers of the transistor 4010 and a transistor 4011.

The pixel portion 4002 and the scan line driver circuit 4004 provided over the substrate 4001 include a plurality of transistors. FIGS. 13A and 13B illustrate the transistor 4010 included in the pixel portion 4002 and the transistor 4011 included in the scan line driver circuit 4004. In FIGS. 13A and 13B, an insulating layer 4032a and an insulating layer 4032b are provided over the transistors 4010 and 4011.

In FIG. 13B, a planarization insulating layer 4040 is provided over the insulating layer 4032b, and an insulating layer 4042 is provided between the first electrode layer 4034 and the second electrode layer 4031.

Any of the transistors described in Embodiments 1 to 5 can be applied to the transistor 4010 and the transistor 4011. In this embodiment, an example in which a transistor having a structure similar to that of the transistor 100 described in Embodiment 1 is used is described. The transistors 4010 and 4011 are bottom-gate transistors.

The transistors 4010 and 4011 each include a stacked-layer structure of gate insulating layers 4020a and 4020b. In FIG. 13A, the gate insulating layers 4020a and 4020b of the transistors 4010 and 4011 and the insulating layers 4032a and 4032b provided over the transistors 4010 and 4011 extend below the sealant 4005 to cover an end portion of the connection terminal electrode 4015. In FIG. 13B, the gate insulating layer 4020a and the insulating layer 4032b extend below the sealant 4005 to cover the end portion of the connection terminal electrode 4015, and the insulating layer 4032b covers side surfaces of the gate insulating layer 4020b and the insulating layer 4032a. It is preferable to apply of a film (e.g., a silicon nitride film) having a blocking property against hydrogen or a compound containing hydrogen (e.g., water) to each of the gate insulating layer 4020a and the insulating layer 4032b because the film can prevent the entry of hydrogen or a compound containing hydrogen from the air or the like, resulting in an improvement in the reliability of the semiconductor device.

In each of the transistors 4010 and 4011, a second oxide semiconductor layer which functions as a current path (channel) is sandwiched between a first oxide semiconductor layer and a third oxide semiconductor layer which have lower conductivity than the second oxide semiconductor layer. Accordingly, each of the transistors 4010 and 4011 is a buried-channel transistor in which a current path is formed away from the interface with the insulating layer, and therefore has high field-effect mobility.

Moreover, a conductive layer may be provided so as to overlap with a channel formation region in the oxide semiconductor layer of the transistor 4011 for the driver circuit. When the conductive layer is provided so as to overlap with the channel formation region in the oxide semiconductor layer, the amount of change in the threshold voltage of the transistor 4011 can be further reduced. The conductive layer may have the same potential as or a potential different from that of a gate electrode layer of the transistor 4011, and can function as a second gate electrode layer. The potential of the conductive layer may be GND, 0 V, or in a floating state.

In addition, the conductive layer has a function of blocking an external electric field, that is, a function of preventing an external electric field (particularly, a function of preventing static electricity) from affecting the inside (a circuit portion including a transistor). A blocking function of the conductive layer can prevent variation in the electrical characteristics of the transistor due to an influence of an external electric field such as static electricity.

In FIGS. 13A and 13B, a liquid crystal element 4013 includes the first electrode layer 4034, the second electrode layer 4031, and a liquid crystal layer 4008. Note that insulating layers 4033 and 4038 functioning as alignment films are provided so that the liquid crystal layer 4008 is positioned therebetween.

In FIG. 13A, the second electrode layer 4031 is provided on the substrate 4006 side, and the first electrode layer 4034 and the second electrode layer 4031 are stacked with the liquid crystal layer 4008 provided therebetween. In FIG. 13B, the second electrode layer 4031 having an opening pattern is provided below the liquid crystal layer 4008, and the first electrode layer 4034 having a flat plate shape is provided below the second electrode layer 4031 with the insulating layer 4042 provided therebetween. In FIG. 13B, the second electrode layer 4031 having an opening pattern includes a bent portion or a comb-shaped portion. An arrangement of the first electrode layer 4034 and the second electrode layer 4031, which complies with both conditions that they have the same shape and they completely overlap with each other, is avoided in order to generate an electric field between the electrodes. Note that a structure may be employed in which the second electrode layer 4031 having a flat plate shape is formed on and in contact with the planarization insulating layer 4040, and the first electrode layer 4034 having an opening pattern and serving as a pixel electrode is formed over the second electrode layer 4031 with the insulating layer 4042 provided therebetween.

The first electrode layer 4034 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or graphene.

Alternatively, the first electrode layer 4034 and the second electrode layer 4031 can be formed using one or more materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy of any of these metals; and a nitride of any of these metals.

A conductive composition containing a conductive high molecule (also referred to as a conductive polymer) can be used for the first electrode layer 4034 and the second electrode layer 4031. As the conductive high molecule, what is called a π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

A spacer 4035 is a columnar spacer obtained by selective etching of an insulating layer and is provided in order to control the thickness of the liquid crystal layer 4008 (a cell gap). Alternatively, a spherical spacer may be used.

In the case where a liquid crystal element is used as the display element, a thermotropic liquid crystal, a ferroelectric liquid crystal, an anti-ferroelectric liquid crystal, or the like can be used. These liquid crystal materials may be a low molecular compound or a high molecular compound. Such a liquid crystal material (liquid crystal composition) exhibits a cholesteric phase, a smectic phase, a cubic phase, a chiral nematic phase, an isotropic phase, or the like depending on conditions.

Alternatively, a liquid crystal composition exhibiting a blue phase for which an alignment film is unnecessary may be used for the liquid crystal layer 4008. In this case, the liquid crystal layer 4008 is in contact with the first electrode layer 4034 and the second electrode layer 4031. A blue phase is one of liquid crystal phases, which is generated just before a cholesteric phase changes into an isotropic phase while temperature of cholesteric liquid crystal is increased. The blue phase can be exhibited using a liquid crystal composition which is a mixture of a liquid crystal and a chiral material. In order to increase the temperature range where the blue phase is exhibited, a liquid crystal layer may be formed by adding a polymerizable monomer, a polymerization initiator, and the like to a liquid crystal composition exhibiting a blue phase and by performing polymer stabilization treatment. The liquid crystal composition exhibiting a blue phase has a short response time, and has optical isotropy, which contributes to the exclusion of the alignment process and reduction of viewing angle dependence. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased.

The specific resistivity of the liquid crystal material is greater than or equal to $1 \times 10^9$ Ω·cm, preferably greater than or equal to $1 \times 10^{11}$ Ω·cm, more preferably greater than or equal to 1×10$^{12}$ Ω·cm. Note that the specific resistivity in this specification is measured at 20° C.

The size of a storage capacitor formed in the liquid crystal display device is set considering the leakage current of the transistor provided in the pixel portion or the like so that charge can be held for a predetermined period. The size of the storage capacitor may be set considering the off-state current of a transistor or the like. By using a transistor including an oxide semiconductor layer, which is disclosed in this specification, it is enough to provide a storage capacitor having a capacitance that is ⅓ or less, preferably ⅕ or less of liquid crystal capacitance of each pixel.

In the transistor including an oxide semiconductor layer, which is disclosed in this specification, the current in an off state (off-state current) can be made small. Accordingly, an electric signal such as an image signal can be held for a longer period and a writing interval can be set longer. Accordingly, the frequency of refresh operation can be reduced, which leads to an effect of suppressing power consumption.

The transistor including an oxide semiconductor layer, which is disclosed in this specification, can have high field-effect mobility; thus, the transistor can operate at high speed. For example, when such a transistor is used for a liquid crystal display device, a switching transistor in a pixel portion and a driver transistor in a driver circuit portion can be formed over one substrate. In addition, by using such a transistor in a pixel portion, a high-quality image can be provided.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an anti-ferroelectric liquid crystal (AFLC) mode, or the like can be used.

A normally black liquid crystal display device such as a transmissive liquid crystal display device utilizing a vertical alignment (VA) mode may be used. Some examples are given as the vertical alignment mode. For example, a multi-domain vertical alignment (MVA) mode, a patterned vertical alignment (PVA) mode, or an advanced super view (ASV) mode can be used. Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. Note that one embodiment of the disclosed invention is not limited to the application to a display device for color display; the disclosed invention can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element. In this embodiment, an organic EL element is used as a light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

In order to extract light emitted from the light-emitting element, at least one of the pair of electrodes has a light-transmitting property. A transistor and a light-emitting element are formed over a substrate. The light-emitting element can have a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side, and a light-emitting element having any of these emission structures can be used.

Figures 14A, 14B:
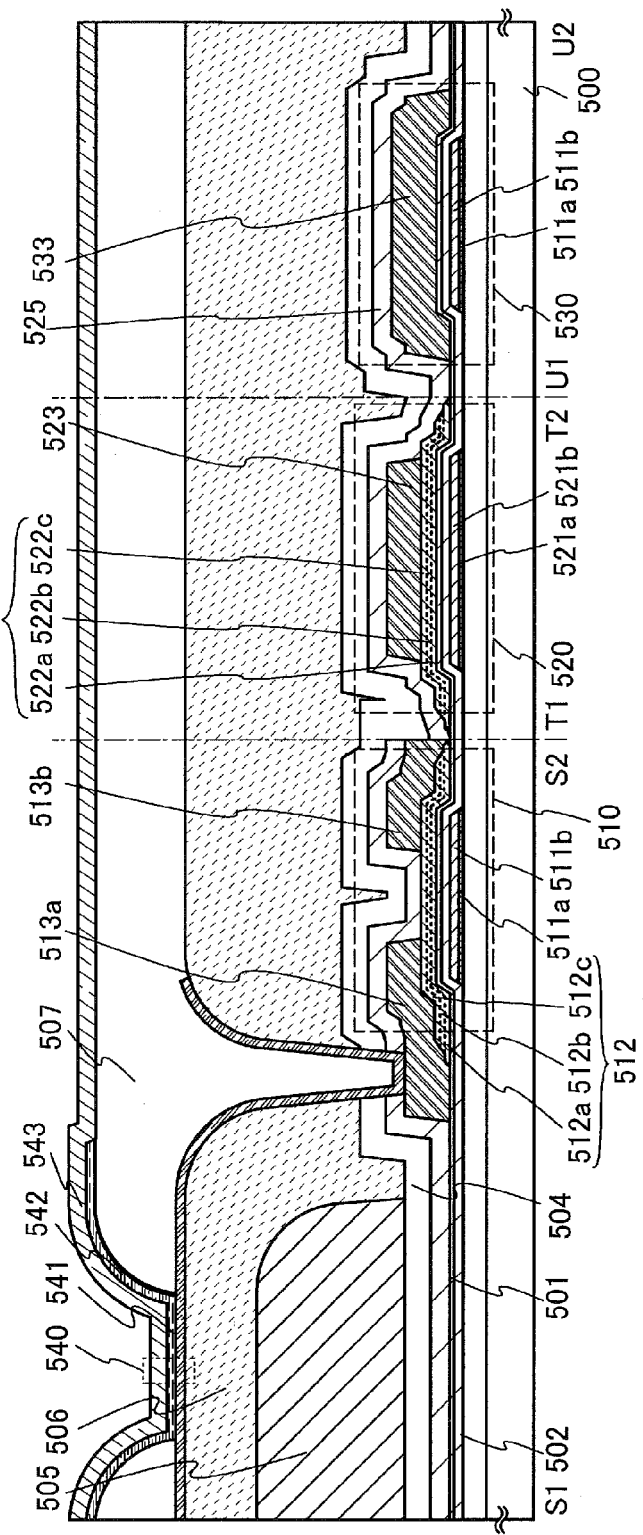
FIGS. 14A and 14B illustrate one embodiment of a semiconductor device.

FIGS. 14A and 14B illustrate an example of a light-emitting device using a light-emitting element as a display element.

FIG. 14A is a plan view of the light-emitting device, and FIG. 14B is a cross-sectional view taken along dashed-dotted lines S1-S2, T1-T2, and U1-U2 in FIG. 14A. Note that an electroluminescent layer 542 and a second electrode layer 543 are not illustrated in the plan view in FIG. 14A.

The light-emitting device illustrated in FIGS. 14A and 14B includes, over a substrate 500, a transistor 510, a capacitor 520, and a wiring layer intersection 530. The transistor 510 is electrically connected to a light-emitting element 540. Note that FIGS. 14A and 14B illustrate a bottom-emission light-emitting device in which light from the light-emitting element 540 is extracted through the substrate 500.

Any of the transistors described in Embodiments 1 to 5 can be applied to the transistor 510. In this embodiment, an example in which a transistor having a structure similar to that of the transistor 100 described in Embodiment 1 is used is described. The transistor 510 is a bottom-gate transistor.

The transistor 510 includes gate electrode layers 511a and 511b; gate insulating layers 501 and 502; an oxide semiconductor film 512 including a first oxide semiconductor layer 512a, a second oxide semiconductor layer 512b, and a third oxide semiconductor layer 512c; and conductive layers 513a and 513b serving as a source electrode layer and a drain electrode layer. In addition, an insulating layer 525 is formed over the transistor 510.

The capacitor 520 includes conductive layers 521a and 521b; the gate insulating layers 501 and 502; an oxide semiconductor film 522 including a first oxide semiconductor layer 522a, a second oxide semiconductor layer 522b, and a third oxide semiconductor layer 522c; and a conductive layer 523. The gate insulating layers 501 and 502 and the oxide semiconductor film 522 are sandwiched between the conductive layer 523 and the conductive layers 521a and 521b, whereby the capacitor is formed.

The wiring layer intersection 530 is an intersection of a conductive layer 533 and the gate electrode layers 511a and 511b. The conductive layer 533 and the gate electrode layers 511a and 511b intersect with each other with the gate insulating layers 501 and 502 provided therebetween.

In this embodiment, a 30-nm-thick titanium film is used as each of the gate electrode layer 511a and the conductive layer 521a, and a 200-nm-thick copper film is used as each of the gate electrode layer 511b and the conductive layer 521b. Thus, the gate electrode layer has a stacked-layer structure of the titanium film and the copper film.

In the transistor 510, a second oxide semiconductor layer which functions as a current path (channel) is sandwiched between a first oxide semiconductor layer and a third oxide semiconductor layer which have lower conductivity than the second oxide semiconductor layer. Accordingly, the transistor 510 is a buried-channel transistor in which a current path is formed away from the interface with the insulating layer, and therefore has high field-effect mobility.

An interlayer insulating layer 504 is formed over the transistor 510, the capacitor 520, and the wiring layer intersection 530. Over the interlayer insulating layer 504, a color filter layer 505 is provided in a region overlapping with the light-emitting element 540. An insulating layer 506 functioning as a planarization insulating layer is provided over the interlayer insulating layer 504 and the color filter layer 505.

The light-emitting element 540 having a stacked-layer structure in which a first electrode layer 541, the electroluminescent layer 542, and the second electrode layer 543 are stacked in this order is provided over the insulating layer 506. The first electrode layer 541 and the conductive layer 513a are in contact with each other in an opening formed in the insulating layer 506 and the interlayer insulating layer 504, which reaches the conductive layer 513a; thus the light-emitting element 540 and the transistor 510 are electrically connected to each other. Note that a partition 507 is provided so as to cover part of the first electrode layer 541 and the opening.

Further, a 1500-nm-thick photosensitive acrylic film and a 1500-nm-thick photosensitive polyimide film can be used as the insulating layer 506 and the partition 507, respectively.

As the color filter layer 505, for example, a chromatic color light-transmitting resin can be used. As the chromatic color light-transmitting resin, a photosensitive organic resin or a non-photosensitive organic resin can be used. A photosensitive organic resin layer is preferably used, in which case the number of resist masks can be reduced, which results in the simplification of the process.

Chromatic colors are all colors except achromatic colors such as black, gray, and white. The color filter layer is formed using a material which transmits only light of the chromatic colors. As chromatic color, red, green, blue, or the like can be used. Alternatively, cyan, magenta, yellow, or the like may also be used. "Transmitting only light of a chromatic color" means that light passing through the color filter layer has a peak at a wavelength of the light of the chromatic color. The thickness of the color filter layer may be controlled as appropriate in consideration of the relationship between the concentration of the coloring material to be included and the transmittance of light. For example, the color filter layer 505 may have a thickness greater than or equal to 1500 nm and less than or equal to 2000 nm.

The partition 507 can be formed using an organic insulating material or an inorganic insulating material. It is particularly preferable that the partition 507 be formed using a photosensitive resin material to have an opening over the first electrode layer 541. A sidewall of the opening is preferably formed as a tilted surface with continuous curvature.

The electroluminescent layer 542 may be formed using either a single layer or a stack of a plurality of layers.

A protective film may be formed over the second electrode layer 543 and the partition 507 in order to prevent entry of oxygen, hydrogen, moisture, carbon dioxide, or the like into the light-emitting element 540. As the protective film, a silicon nitride film, a silicon nitride oxide film, a DLC film, or the like can be formed.

Further, the light-emitting element 540 may be covered with a layer containing an organic compound deposited by an evaporation method so that oxygen, hydrogen, moisture, carbon dioxide, or the like do not enter the light-emitting element 540.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Further, an electrophoretic display device (also referred to as an electrophoretic display or an electronic paper) in which electronic ink is driven can be provided as the display device. The electrophoretic display device has advantages of having high readability which is equivalent to normal paper and lower power consumption than other display devices, and being thin and lightweight.

An electrophoretic display device can have various modes. An electrophoretic display device includes a plurality of microcapsules dispersed in a solvent, and each microcapsule contains first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

A dispersion of the above microcapsules in a solvent is referred to as electronic ink. Furthermore, by the use of a color filter or particles that have a pigment, color display is also possible.

The insulating layer 506 functioning as a planarization insulating layer can be formed using an organic material having heat resistance, such as an acrylic resin, polyimide, a benzocyclobutene-based resin, polyamide, or an epoxy resin. Other than such organic materials, it is also possible to use a low-dielectric constant material (low-k material) such as a siloxane-based resin, phosphosilicate glass (PSG), or borophosphosilicate glass (BPSG). Note that the insulating layer 506 may be formed by stacking a plurality of insulating layers formed using any of these materials.

There is no particular limitation on the method of forming the insulating layer 506; the following method can be used depending on the material: a sputtering method, spin coating, dipping, spray coating, a droplet discharge method (such as an inkjet method), screen printing, offset printing, or the like.

Materials similar to those of the first electrode layer 4034 and the second electrode layer 4031 illustrated in FIG. 13A or FIG. 13B can be used for the first electrode layer 541 and the second electrode layer 543.

In this embodiment, since the light-emitting device illustrated in FIGS. 14A and 14B has a bottom-emission structure, the first electrode layer 541 has a light-transmitting property and the second electrode layer 543 has a light-reflecting property. Accordingly, in the case of using a metal film as the first electrode layer 541, the film is preferably made thin enough to secure a light-transmitting property; and in the case of using a light-transmitting conductive layer as the second electrode layer 543, a light-reflecting conductive layer is preferably stacked therewith.

A protection circuit for protecting the driver circuit may be provided. The protection circuit is preferably formed using a nonlinear element.

By using any of the transistors described in Embodiments 1 to 5 as described above, the semiconductor device can have a variety of functions.

The structures, methods, and the like described in this embodiment can be combined as appropriate with any of the structures, methods, and the like described in the other embodiments.

(Embodiment 7)

A semiconductor device having an image sensor function of reading data on an object can be manufactured using any of the transistors described in Embodiments 1 to 5.

An example of a semiconductor device having an image sensor function is illustrated in FIG. 15A. FIG. 15A illustrates an equivalent circuit of a photo sensor, and FIG. 15B is a cross-sectional view illustrating part of the photo sensor.

One electrode of a photodiode 602 is electrically connected to a photodiode reset signal line 658, and the other electrode of the photodiode 602 is electrically connected to a gate of a transistor 640. One of a source and a drain of the transistor 640 is electrically connected to a photosensor reference signal line 672, and the other of the source and the drain of the transistor 640 is electrically connected to one of a source and a drain of a transistor 656. A gate of the transistor 656 is electrically connected to a gate signal line 659, and the other of the source and the drain of the transistor 656 is electrically connected to a photosensor output signal line 671.

Note that in the circuit diagram of FIG. 15A, a transistor using an oxide semiconductor layer is denoted by a symbol "OS" so that it can be identified as a transistor including an oxide semiconductor layer. In FIG. 15A, any of the transistors using oxide semiconductor layers which are described in Embodiments 1 to 5 can be used as the transistor 640 and the transistor 656. In this embodiment, an example in which a transistor having a structure similar to that of the transistor 100 described in Embodiment 1 is used is described. The transistor 640 is a bottom-gate transistor.

FIG. 15B is a cross-sectional view of the photodiode 602 and the transistor 640 in the photosensor. The photodiode 602 functioning as a sensor and the transistor 640 are provided over a substrate 601 (element substrate) having an insulating surface. A substrate 613 is provided over the photodiode 602 and the transistor 640 with the use of an adhesive layer 608.

An insulating layer 632, an interlayer insulating layer 633, and an interlayer insulating layer 634 are provided over the transistor 640. The photodiode 602 includes an electrode layer 641b formed over the interlayer insulating layer 633, a first semiconductor film 606a, a second semiconductor film 606b, and a third semiconductor film 606c which are stacked over the electrode layer 641b in this order, an electrode layer 642 which is provided over the interlayer insulating layer 634 and electrically connected to the electrode layer 641b through the first to third semiconductor films, and an electrode layer 641a which is provided in the same layer as the electrode layer 641b and electrically connected to the electrode layer 642.

The electrode layer 641b is electrically connected to a conductive layer 643 formed over the interlayer insulating layer 634, and the electrode layer 642 is electrically connected to a conductive layer 645 through the electrode layer 641a. The conductive layer 645 is electrically connected to a gate electrode layer of the transistor 640, and the photodiode 602 is electrically connected to the transistor 640.

Here, a pin photodiode in which a semiconductor film having p-type conductivity as the first semiconductor film 606a, a high-resistance semiconductor film (i-type semiconductor film) as the second semiconductor film 606b, and a semiconductor film having n-type conductivity as the third semiconductor film 606c are stacked is illustrated as an example.

The first semiconductor film 606a is a p-type semiconductor film and can be formed using an amorphous silicon film containing an impurity element imparting p-type conductivity. The first semiconductor film 606a is formed by a plasma CVD method with the use of a semiconductor source gas containing an impurity element belonging to Group 13 (e.g., boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced into the amorphous silicon film by a diffusion method or an ion implantation method. Heating or the like may be conducted after introducing the impurity element by an ion implantation method or the like in order to diffuse the impurity element. In this case, as a method of forming the amorphous silicon film, an LPCVD method, a vapor deposition method, a sputtering method, or the like may be used.

The first semiconductor film 606a is preferably formed to have a thickness greater than or equal to 10 nm and less than or equal to 50 nm.

The second semiconductor film 606b is an i-type semiconductor film (intrinsic semiconductor film) and is formed using an amorphous silicon film. As for formation of the second semiconductor film 606b, an amorphous silicon film is formed by a plasma CVD method with the use of a semiconductor source gas. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor film 606b may be formed by an LPCVD method, a vapor deposition method, a sputtering method, or the like. The second semiconductor film 606b is preferably formed to have a thickness greater than or equal to 200 nm and less than or equal to 1000 nm.

The third semiconductor film 606c is an n-type semiconductor film and is formed using an amorphous silicon film containing an impurity element imparting n-type conductivity. The third semiconductor film 606c is formed by a plasma CVD method with the use of a semiconductor source gas containing an impurity element belonging to Group 15 (e.g., phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced into the amorphous silicon film by a diffusion method or an ion implantation method. Heating or the like may be conducted after introducing the impurity element by an ion implantation method or the like in order to diffuse the impurity element. In this case, as a method of forming the amorphous silicon film, an LPCVD method, a vapor deposition method, a sputtering method, or the like may be used. The third semiconductor film 606c is preferably formed to have a thickness greater than or equal to 20 nm and less than or equal to 200 nm.

The first semiconductor film 606a, the second semiconductor film 606b, and the third semiconductor film 606c are not necessarily formed using an amorphous semiconductor, and may be formed using a polycrystalline semiconductor or a microcrystalline semiconductor (semi-amorphous semiconductor: SAS).

The mobility of holes generated by the photoelectric effect is lower than the mobility of electrons. Therefore, a pin photodiode has better characteristics when a surface on the p-type semiconductor film side is used as a light-receiving plane. Here, an example in which light received by the photodiode 602 from a surface of the substrate 601, over which the pin photodiode is formed, is converted into electric signals is described. Further, light from the semiconductor film having the conductivity type opposite to that of the semiconductor film on the light-receiving plane is disturbance light; therefore, the electrode layer is preferably formed using a light-blocking conductive layer. A surface on the n-type semiconductor film side can alternatively be used as the light-receiving plane.

In the transistor 640, a second oxide semiconductor layer which functions as a current path (channel) is sandwiched between a first oxide semiconductor layer and a third oxide semiconductor layer which have lower conductivity than the second oxide semiconductor layer. Accordingly, the transistor 640 is a buried-channel transistor in which a current path is formed away from the interface with the insulating layer, and therefore has high field-effect mobility.

With the use of an insulating material, the insulating layer 632, the interlayer insulating layer 633, and the interlayer insulating layer 634 can be formed, depending on the material, using a sputtering method, a plasma CVD method, spin coating, dipping, spray coating, a droplet discharge method (such as an inkjet method), screen printing, offset printing, or the like.

For reduction of surface roughness, an insulating layer functioning as a planarization insulating layer is preferably used as each of the interlayer insulating layers 633 and 634. For the interlayer insulating layers 633 and 634, for example, an organic insulating material having heat resistance, such as polyimide, an acrylic resin, a benzocyclobutene-based resin, polyamide, or an epoxy resin, can be used. Other than such organic insulating materials, it is possible to use a single layer or stacked layers of a low-dielectric constant material (a low-k material), a siloxane-based resin, phosphosilicate glass (PSG), borophosphosilicate glass (BPSG), or the like.

With detection of light that enters the photodiode 602, data on an object can be read. Note that a light source such as a backlight can be used at the time of reading information on an object.

The structures, methods, and the like described in this embodiment can be combined as appropriate with any of the structures, methods, and the like described in the other embodiments.

(Embodiment 8)

A semiconductor device disclosed in this specification can be applied to a variety of electronic devices (including game machines). Examples of electronic devices include a television set (also referred to as a television or a television receiver), a monitor of a computer or the like, cameras such as a digital camera and a digital video camera, a digital photo frame, a mobile phone, a portable game machine, a portable information terminal, an audio reproducing device, a game machine (e.g., a pachinko machine or a slot machine), a game console, and the like. Specific examples of these electronic devices are illustrated in FIGS. 16A to 16C.

Figure 16A:
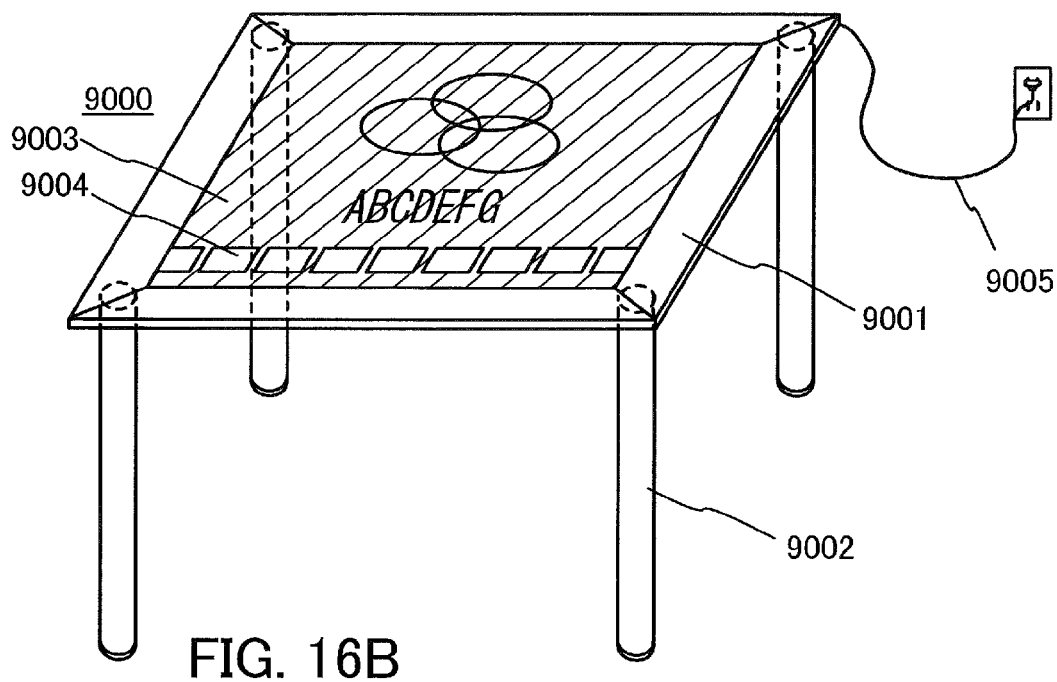
FIGS. 16A to 16C illustrate electronic devices.
Figure 16B:
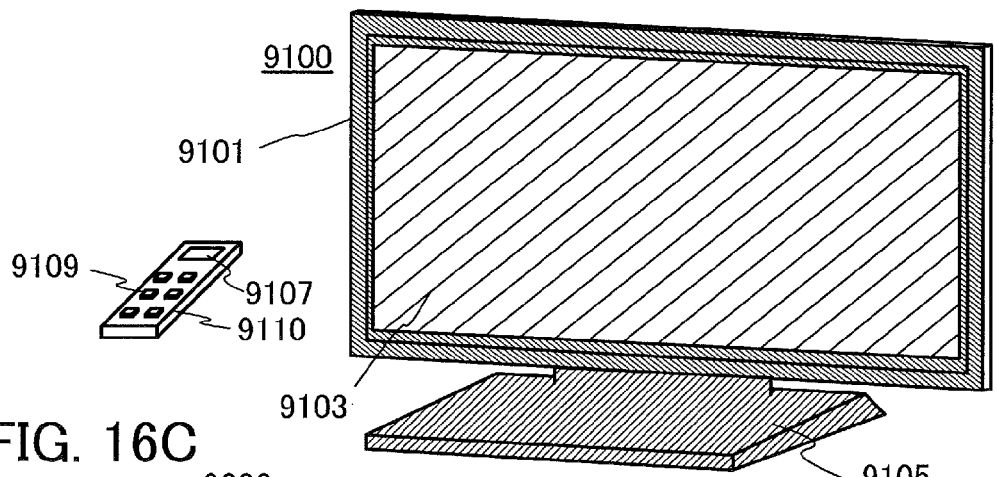
Figure 16C:
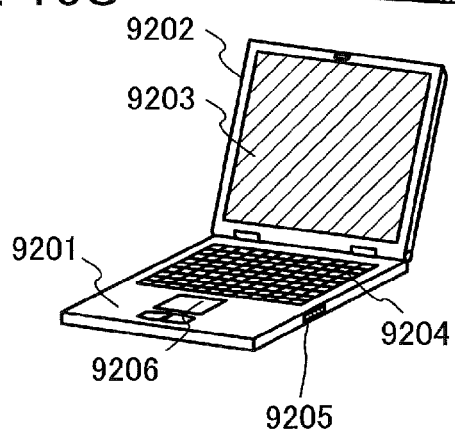

FIG. 16A illustrates a table 9000 having a display portion. In the table 9000, a display portion 9003 is incorporated in a housing 9001 and an image can be displayed on the display portion 9003. Note that the housing 9001 is supported by four leg portions 9002. Further, a power cord 9005 for supplying power is provided for the housing 9001.

The semiconductor device described in any of the above embodiments can be used for the display portion 9003, so that the electronic device can have high reliability.

The display portion 9003 has a touch-input function. When a user touches displayed buttons 9004 which are displayed on the display portion 9003 of the table 9000 with his/her finger or the like, the user can carry out operation of the screen and input of information. Further, when the table is capable of communicating with other home appliances or controlling the home appliances, the table 9000 may function as a control device which controls the home appliances by operation on the screen. For example, with the use of the semiconductor device having an image sensor function described in Embodiment 7, the display portion 9003 can have a touch-input function.

Further, the screen of the display portion 9003 can be placed perpendicular to a floor with a hinge provided for the housing 9001; thus, the table 9000 can also be used as a television set. When a television set having a large screen is set in a small room, an open space is reduced; however, when a display portion is incorporated in a table, a space in the room can be efficiently used.

FIG. 16B illustrates a television set 9100. In the television set 9100, a display portion 9103 is incorporated in a housing

9101 and an image can be displayed on the display portion 9103. Note that the housing 9101 is supported by a stand 9105 here.

The television set 9100 can be operated with an operation switch of the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

The television set 9100 illustrated in FIG. 16B is provided with a receiver, a modem, and the like. With the use of the receiver, the television set 9100 can receive general TV broadcasts. Moreover, when the television set 9100 is connected to a communication network with or without wires via the modem, one-way (from a sender to a receiver) or two-way (between a sender and a receiver or between receivers) information communication can be performed.

The semiconductor device described in any of the above embodiments can be used for the display portions 9103 and 9107, so that the television set and the remote controller can have high reliability.

FIG. 16C illustrates a computer which includes a main body 9201, a housing 9202, a display portion 9203, a keyboard 9204, an external connection port 9205, a pointing device 9206, and the like.

The semiconductor device described in any of the above embodiments can be used for the display portion 9203, so that the computer can have high reliability.

Figure 17A:
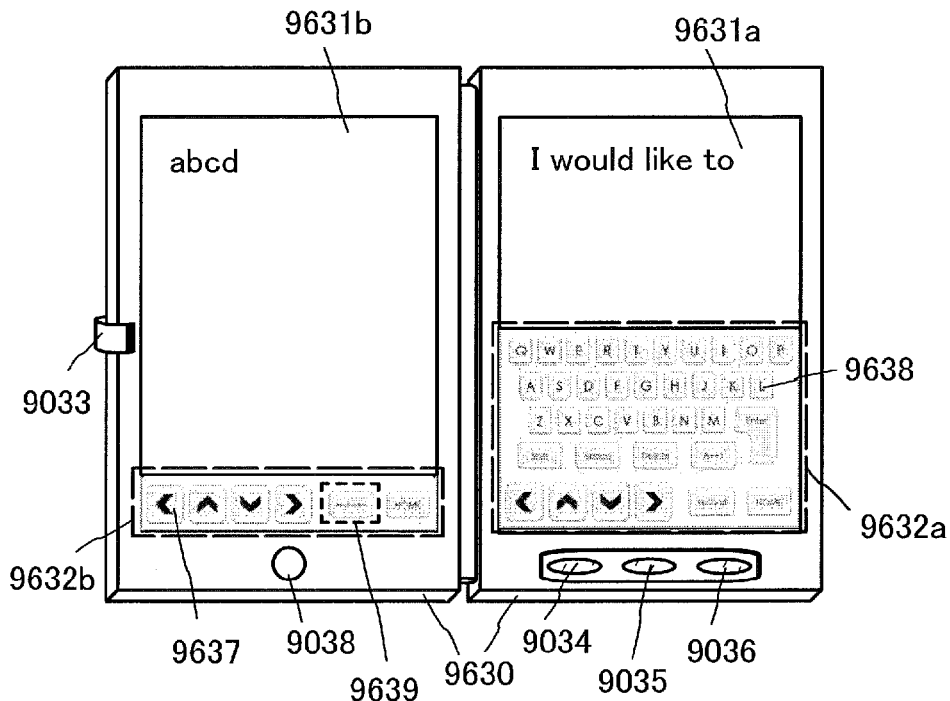
FIGS. 17A to 17C illustrate an electronic device.
Figure 17B:
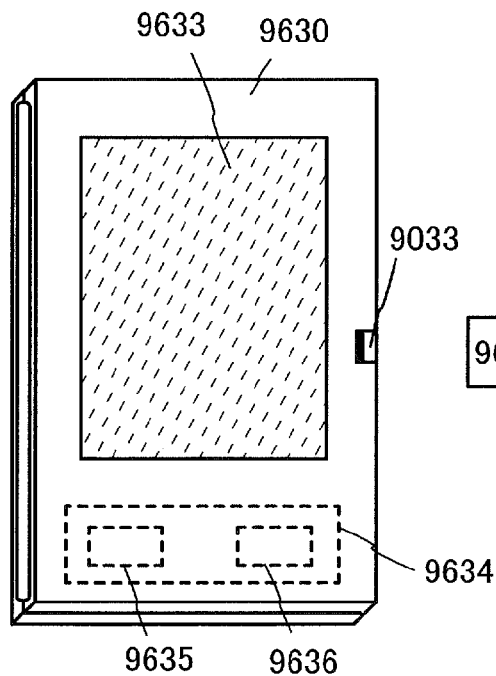

FIGS. 17A and 17B illustrate a tablet terminal that can be folded. The tablet terminal is opened in FIG. 17A. The tablet terminal includes a housing 9630, a display portion 9631*a*, a display portion 9631*b*, a display mode switch 9034, a power switch 9035, a power saver switch 9036, a clasp 9033, and an operation switch 9038.

The semiconductor device described in any of the above embodiments can be used for the display portion 9631*a* and the display portion 9631*b*, so that the tablet terminal can have high reliability.

Part of the display portion 9631*a* can be a touch panel region 9632*a*, and data can be input by touching operation keys 9638 that are displayed. Although a structure in which a half region in the display portion 9631*a* has only a display function and the other half region also has a touch panel function is shown as an example, the display portion 9631*a* is not limited to the structure. The whole display portion 9631*a* may have a touch panel function. For example, all the area of the display portion 9631*a* can display keyboard buttons and serve as a touch panel while the display portion 9631*b* can be used as a display screen.

Like the display portion 9631*a*, part of the display portion 9631*b* can be a touch panel region 9632*b*. When a keyboard display switching button 9639 displayed on the touch panel is touched with a finger, a stylus, or the like, a keyboard can be displayed on the display portion 9631*b*.

Touch input can be performed concurrently on the touch panel regions 9632*a* and 9632*b*.

The display mode switch 9034 can switch the display between portrait mode, landscape mode, and the like, and between monochrome display and color display, for example. The power saver switch 9036 can control display luminance in accordance with the amount of external light in use of the tablet terminal detected by an optical sensor incorporated in the tablet terminal. In addition to the optical sensor, another detection device including a sensor for detecting inclination, such as a gyroscope or an acceleration sensor, may be incorporated in the tablet terminal.

Although the display portion 9631*a* and the display portion 9631*b* have the same display area in FIG. 17A, one embodiment of the present invention is not limited to this example. The display portion 9631*a* and the display portion 9631*b* may have different areas or different display quality. For example, one of them may be a display panel that can display higher-definition images than the other.

The tablet terminal is closed in FIG. 17B. The tablet terminal includes the housing 9630, a solar cell 9633, and a charge and discharge control circuit 9634. Note that FIG. 17B shows an example in which the charge and discharge control circuit 9634 includes a battery 9635 and a DCDC converter 9636.

Since the tablet terminal is foldable, the housing 9630 can be closed when the tablet terminal is not used. Thus, the display portion 9631*a* and the display portion 9631*b* can be protected, which makes it possible to provide a tablet terminal with excellent durability and excellent reliability for long-term use.

The tablet terminal illustrated in FIGS. 17A and 17B can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs).

The solar cell 9633 provided on a surface of the tablet terminal can supply power to the touch panel, the display portion, a video signal processing portion, or the like. Note that the solar cell 9633 can be provided on one or both surfaces of the housing 9630 and the battery 9635 can be charged efficiently. The use of a lithium ion battery as the battery 9635 is advantageous in downsizing or the like.

Figure 17C:
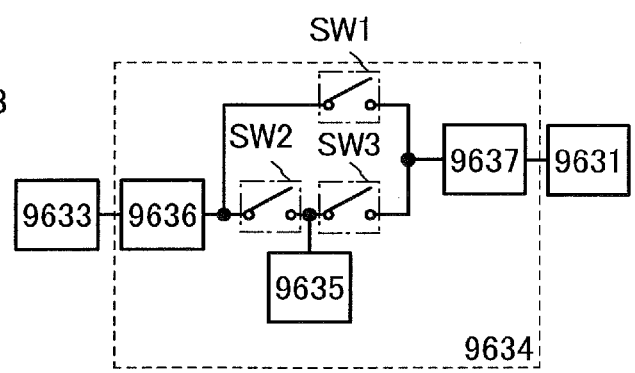

The structure and operation of the charge and discharge control circuit 9634 illustrated in FIG. 17B are described with reference to a block diagram of FIG. 17C. FIG. 17C illustrates the solar cell 9633, the battery 9635, the DCDC converter 9636, a converter 9637, switches SW1 to SW3, and a display portion 9631. The battery 9635, the DCDC converter 9636, the converter 9637, and the switches SW1 to SW3 correspond to the charge and discharge control circuit 9634 in FIG. 17B.

First, an example of the operation in the case where power is generated by the solar cell 9633 using external light is described. The voltage of power generated by the solar cell is stepped up or down by the DCDC converter 9636 so that the power has a voltage for charging the battery 9635. Then, when the power from the solar cell 9633 is used for the operation of the display portion 9631, the switch SW1 is turned on and the voltage of the power is stepped up or down by the converter 9637 so as to be a voltage needed for the display portion 9631. In addition, when display on the display portion 9631 is not performed, the switch SW1 is turned off and the switch SW2 is turned on so that the battery 9635 may be charged.

Here, the solar cell 9633 is shown as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module that transmits and receives power wirelessly (without contact) to charge the battery or with a combination of other charging means.

The structures, methods, and the like described in this embodiment can be combined as appropriate with any of the structures, methods, and the like described in the other embodiments.

Example 1

Figure 18A:
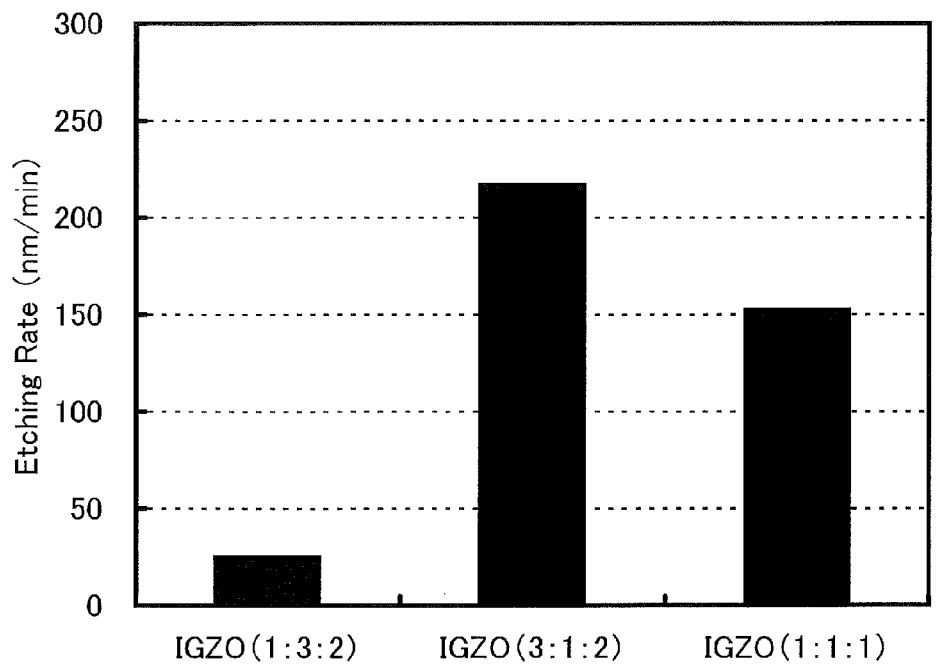
FIGS. 18A and 18B show etching rates of oxide semiconductor films in wet etching treatments.
Figure 18B:
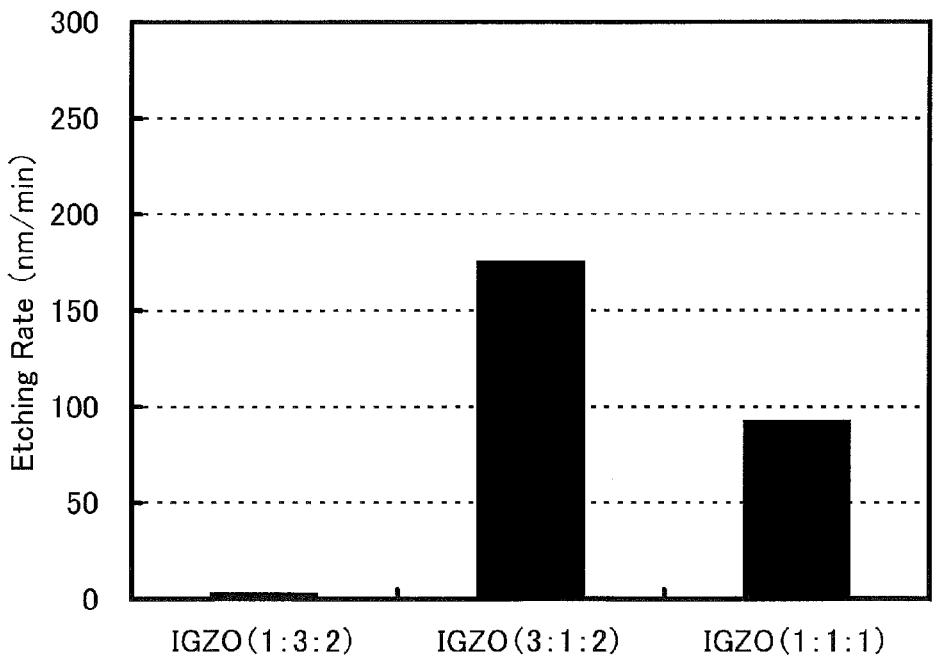

In this example, etching rates in wet etching treatments on In—Ga—Zn-based oxide films are shown. FIGS. 18A and 18B show etching rates of three kinds of In—Ga—Zn-based oxide films having different compositions: an IGZO film deposited using a sputtering target having an atomic ratio of In:Ga:Zn=1:3:2 (hereinafter referred to as IGZO (1:3:2) for convenience); an IGZO film deposited using a sputtering target having an atomic ratio of In:Ga:Zn=3:1:2 (hereinafter referred to as IGZO (3:1:2) for convenience); and an IGZO film deposited using a sputtering target having an atomic ratio of In:Ga:Zn=1:1:1 (hereinafter referred to as IGZO (1:1:1) for convenience).

FIG. 18A shows respective etching rates (unit: nm/min) of the IGZO films in the case where the IGZO films were deposited under a condition that the deposition gas ratio of $O_2$/Ar was set to 50%. Wet etching was performed using ITO-07 (produced by KANTO CHEMICAL CO., INC.) as an etchant at a chemical solution temperature of 60° C.

Consequently, the etching rate of IGZO (1:3:2) was 25.6 nm/min and thus confirmed to be much lower than the etching rate of IGZO (3:1:2) of 152.8 nm/min and the etching rate of IGZO (1:1:1) of 217.3 nm/min.

FIG. 18B shows respective etching rates (unit: nm/min) of the IGZO films in the case where the IGZO films were deposited under a condition that the deposition gas ratio of $O_2$/Ar was set to 100%. In the same way as the above, wet etching was performed using ITO-07 (produced by KANTO CHEMICAL CO., INC.) as an etchant at a chemical solution temperature of 60° C.

Consequently, the etching rate of IGZO (1:3:2) was 3.0 nm/min and thus confirmed to be much lower than the etching rate of IGZO (3:1:2) of 92.5 nm/min and the etching rate of IGZO (1:1:1) of 175.2 nm/min.

Thus, in the case where IGZO (1:3:2) is used for a first-layer oxide semiconductor layer, IGZO (3:1:2) is used for a second-layer oxide semiconductor layer functioning as a channel formation region, and IGZO (1:1:1) is used for a third-layer oxide semiconductor layer when an oxide semiconductor film having a stacked-layer structure included in a transistor is formed, the second-layer and third-layer oxide semiconductor layers can be selectively removed by wet etching. It was confirmed that by utilizing this property, a method for manufacturing a semiconductor device according to the present invention can be implemented and the semiconductor device can be manufactured.

This application is based on Japanese Patent Application serial no. 2012-171786 filed with Japan Patent Office on Aug. 2, 2012, the entire contents of which are hereby incorporated by reference.

What is claimed is:

1. A semiconductor device comprising:
 a first oxide semiconductor layer;
 a second oxide semiconductor layer over the first oxide semiconductor layer; and
 a third oxide semiconductor layer over the second oxide semiconductor layer,
 wherein an energy level of a bottom of a conduction band of the second oxide semiconductor layer is lower than an energy level of a bottom of a conduction band of the first oxide semiconductor layer by 0.05 eV or more, and
 wherein the energy level of the bottom of the conduction band of the second oxide semiconductor layer is lower than an energy level of a bottom of a conduction band of the third oxide semiconductor layer.

2. The semiconductor device according to claim 1,
 wherein the first oxide semiconductor layer and the third oxide semiconductor layer comprise at least indium and gallium in an atomic ratio where an indium content is lower than or equal to a gallium content, and
 wherein the second oxide semiconductor layer comprises at least indium and gallium in an atomic ratio where an indium content is higher than a gallium content.

3. The semiconductor device according to claim 1,
 wherein InaM2bZncOx (a is a real number greater than or equal to 0 and less than or equal to 2, b is a real number greater than 0 and less than or equal to 5, c is a real number greater than or equal to 0 and less than or equal to 5, and x is an arbitrary real number) is used for the first oxide semiconductor layer, and
 wherein M2 is Ga, Mg, Hf, Al, Zr, Sn, or lanthanoid.

4. The semiconductor device according to claim 1,
 wherein a material represented as IndM5eZnfOx (d is a real number greater than 0 and less than or equal to 5, e is a real number greater than or equal to 0 and less than or equal to 3, f is a real number greater than 0 and less than or equal to 5, and x is an arbitrary positive number) is used for the second oxide semiconductor layer, and
 wherein M5 is Ga, Mg, Hf, Al, Zr, Sn, or lanthanoid.

5. The semiconductor device according to claim 1,
 wherein a material represented as IngM8hZniOx (g is a real number greater than or equal to 0 and less than or equal to 2, h is a real number greater than 0 and less than or equal to 5, i is a real number greater than or equal to 0 and less than or equal to 5, and x is an arbitrary real number) is used for the third oxide semiconductor layer, and
 wherein M8 is Ga, Mg, Hf, Al, Zr, Sn, or lanthanoid.

6. The semiconductor device according to claim 1,
 wherein an end portion of the first oxide semiconductor layer and an end portion of the second oxide semiconductor layer are in contact with the third oxide semiconductor layer.

7. The semiconductor device according to claim 1,
 wherein the semiconductor device further comprises a first insulating layer and a second insulating layer over the first insulating layer,
 wherein the first oxide semiconductor layer is provided over the second insulating layer, and
 wherein an energy level of a bottom of a conduction band of the first insulating layer is lower than an energy level of a bottom of a conduction band of the second insulating layer.

8. The semiconductor device according to claim 1,
 wherein the semiconductor device further comprises a third insulating layer over the third oxide semiconductor layer and a fourth insulating layer over the third insulating layer, and
 wherein an energy level of a bottom of a conduction band of the third insulating layer is higher than an energy level of a bottom of a conduction band of the fourth insulating layer.

9. An electronic device comprising the semiconductor device according to claim 1.

10. A semiconductor device comprising:
a first oxide semiconductor layer;
a second oxide semiconductor layer over the first oxide semiconductor layer; and
a third oxide semiconductor layer over the second oxide semiconductor layer,
wherein an energy level of a bottom of a conduction band of the second oxide semiconductor layer is lower than an energy level of a bottom of a conduction band of the first oxide semiconductor layer, and
wherein the energy level of the bottom of the conduction band of the second oxide semiconductor layer is lower than an energy level of a bottom of a conduction band of the third oxide semiconductor layer by 0.05 eV or more.

11. The semiconductor device according to claim 10,
wherein the first oxide semiconductor layer and the third oxide semiconductor layer comprise at least indium and gallium in an atomic ratio where an indium content is lower than or equal to a gallium content, and
wherein the second oxide semiconductor layer comprises at least indium and gallium in an atomic ratio where an indium content is higher than a gallium content.

12. The semiconductor device according to claim 10,
wherein $In_aM2_bZn_cO_x$ (a is a real number greater than or equal to 0 and less than or equal to 2, b is a real number greater than 0 and less than or equal to 5, c is a real number greater than or equal to 0 and less than or equal to 5, and x is an arbitrary real number) is used for the first oxide semiconductor layer, and
wherein M2 is Ga, Mg, Hf, Al, Zr, Sn, or lanthanoid.

13. The semiconductor device according to claim 10,
wherein a material represented as $In_dM5_eZn_fO_x$ (d is a real number greater than 0 and less than or equal to 5, e is a real number greater than or equal to 0 and less than or equal to 3, f is a real number greater than 0 and less than or equal to 5, and x is an arbitrary positive number) is used for the second oxide semiconductor layer, and
wherein M5 is Ga, Mg, Hf, Al, Zr, Sn, or lanthanoid.

14. The semiconductor device according to claim 10,
wherein a material represented as $In_gM8_hZn_iO_x$ (g is a real number greater than or equal to 0 and less than or equal to 2, h is a real number greater than 0 and less than or equal to 5, i is a real number greater than or equal to 0 and less than or equal to 5, and x is an arbitrary real number) is used for the third oxide semiconductor layer, and
wherein M8 is Ga, Mg, Hf, Al, Zr, Sn, or lanthanoid.

15. The semiconductor device according to claim 10,
wherein an end portion of the first oxide semiconductor layer and an end portion of the second oxide semiconductor layer are in contact with the third oxide semiconductor layer.

16. The semiconductor device according to claim 10,
wherein the semiconductor device further comprises a first insulating layer and a second insulating layer over the first insulating layer,
wherein the first oxide semiconductor layer is provided over the second insulating layer, and
wherein an energy level of a bottom of a conduction band of the first insulating layer is lower than an energy level of a bottom of a conduction band of the second insulating layer.

17. The semiconductor device according to claim 10,
wherein the semiconductor device further comprises a third insulating layer over the third oxide semiconductor layer and a fourth insulating layer over the third insulating layer, and
wherein an energy level of a bottom of a conduction band of the third insulating layer is higher than an energy level of a bottom of a conduction band of the fourth insulating layer.

18. An electronic device comprising the semiconductor device according to claim 10.

19. A semiconductor device comprising:
a first oxide semiconductor layer;
a second oxide semiconductor layer over the first oxide semiconductor layer; and
a third oxide semiconductor layer over the second oxide semiconductor layer, the third oxide semiconductor layer being in contact with an end portion of the second oxide semiconductor layer,
wherein an energy level of a bottom of a conduction band of the second oxide semiconductor layer is lower than an energy level of a bottom of a conduction band of the first oxide semiconductor layer by 0.05 eV or more, and
wherein the energy level of the bottom of the conduction band of the second oxide semiconductor layer is lower than an energy level of a bottom of a conduction band of the third oxide semiconductor layer.

20. The semiconductor device according to claim 19,
wherein the first oxide semiconductor layer and the third oxide semiconductor layer comprise at least indium and gallium in an atomic ratio where an indium content is lower than or equal to a gallium content, and
wherein the second oxide semiconductor layer comprises at least indium and gallium in an atomic ratio where an indium content is higher than a gallium content.

21. The semiconductor device according to claim 19,
wherein $In_aM2_bZn_cO_x$ (a is a real number greater than or equal to 0 and less than or equal to 2, b is a real number greater than 0 and less than or equal to 5, c is a real number greater than or equal to 0 and less than or equal to 5, and x is an arbitrary real number) is used for the first oxide semiconductor layer, and
wherein M2 is Ga, Mg, Hf, Al, Zr, Sn, or lanthanoid.

22. The semiconductor device according to claim 19,
wherein a material represented as $In_dM5_eZn_fO_x$ (d is a real number greater than 0 and less than or equal to 5, e is a real number greater than or equal to 0 and less than or equal to 3, f is a real number greater than 0 and less than or equal to 5, and x is an arbitrary positive number) is used for the second oxide semiconductor layer, and
wherein M5 is Ga, Mg, Hf, Al, Zr, Sn, or lanthanoid.

23. The semiconductor device according to claim 19,
wherein a material represented as $In_gM8_hZn_iO_x$ (g is a real number greater than or equal to 0 and less than or equal to 2, h is a real number greater than 0 and less than or equal to 5, i is a real number greater than or equal to 0 and less than or equal to 5, and x is an arbitrary real number) is used for the third oxide semiconductor layer, and
wherein M8 is Ga, Mg, Hf, Al, Zr, Sn, or lanthanoid.

24. The semiconductor device according to claim 19,
wherein the semiconductor device further comprises a first insulating layer and a second insulating layer over the first insulating layer,
wherein the first oxide semiconductor layer is provided over the second insulating layer, and wherein an energy level of a bottom of a conduction band of the first insulating layer is lower than an energy level of a bottom of a conduction band of the second insulating layer.

25. The semiconductor device according to claim 19, wherein the semiconductor device further comprises a third insulating layer over the third oxide semiconductor layer and a fourth insulating layer over the third insulating layer, and
wherein an energy level of a bottom of a conduction band of the third insulating layer is higher than an energy level of a bottom of a conduction band of the fourth insulating layer.

26. An electronic device comprising the semiconductor device according to claim 19.

27. A semiconductor device comprising:
a first oxide semiconductor layer;
a second oxide semiconductor layer over the first oxide semiconductor layer; and
a third oxide semiconductor layer over the second oxide semiconductor layer, the third oxide semiconductor layer being in contact with an end portion of the second oxide semiconductor layer,
wherein an energy level of a bottom of a conduction band of the second oxide semiconductor layer is lower than an energy level of a bottom of a conduction band of the first oxide semiconductor layer, and
wherein the energy level of the bottom of the conduction band of the second oxide semiconductor layer is lower than an energy level of a bottom of a conduction band of the third oxide semiconductor layer by 0.05 eV or more.

28. The semiconductor device according to claim 27, wherein the first oxide semiconductor layer and the third oxide semiconductor layer comprise at least indium and gallium in an atomic ratio where an indium content is lower than or equal to a gallium content, and
wherein the second oxide semiconductor layer comprises at least indium and gallium in an atomic ratio where an indium content is higher than a gallium content.

29. The semiconductor device according to claim 27, wherein InaM2bZncOx (a is a real number greater than or equal to 0 and less than or equal to 2, b is a real number greater than 0 and less than or equal to 5, c is a real number greater than or equal to 0 and less than or equal to 5, and x is an arbitrary real number) is used for the first oxide semiconductor layer, and
wherein M2 is Ga, Mg, Hf, Al, Zr, Sn, or lanthanoid.

30. The semiconductor device according to claim 27, wherein a material represented as IndM5eZnfOx (d is a real number greater than 0 and less than or equal to 5, e is a real number greater than or equal to 0 and less than or equal to 3, f is a real number greater than 0 and less than or equal to 5, and x is an arbitrary positive number) is used for the second oxide semiconductor layer, and
wherein M5 is Ga, Mg, Hf, Al, Zr, Sn, or lanthanoid.

31. The semiconductor device according to claim 27, wherein a material represented as IngM8hZniOx (g is a real number greater than or equal to 0 and less than or equal to 2, h is a real number greater than 0 and less than or equal to 5, i is a real number greater than or equal to 0 and less than or equal to 5, and x is an arbitrary real number) is used for the third oxide semiconductor layer, and
wherein M8 is Ga, Mg, Hf, Al, Zr, Sn, or lanthanoid.

32. The semiconductor device according to claim 27, wherein the semiconductor device further comprises a first insulating layer and a second insulating layer over the first insulating layer,
wherein the first oxide semiconductor layer is provided over the second insulating layer, and
wherein an energy level of a bottom of a conduction band of the first insulating layer is lower than an energy level of a bottom of a conduction band of the second insulating layer.

33. The semiconductor device according to claim 27, wherein the semiconductor device further comprises a third insulating layer over the third oxide semiconductor layer and a fourth insulating layer over the third insulating layer, and
wherein an energy level of a bottom of a conduction band of the third insulating layer is higher than an energy level of a bottom of a conduction band of the fourth insulating layer.

34. An electronic device comprising the semiconductor device according to claim 27.

* * * * *

UNITED STATES PATENT AND TRADEMARK OFFICE
CERTIFICATE OF CORRECTION

PATENT NO.        : 9,583,634 B2  
APPLICATION NO.   : 14/585904  
DATED             : February 28, 2017  
INVENTOR(S)       : Hajime Tokunaga et al.

Page 1 of 1

It is certified that error appears in the above-identified patent and that said Letters Patent is hereby corrected as shown below:

In the Claims

In Claim 22, at Column 50, Line 52, "AI," should be --Al,--.

Signed and Sealed this
Thirtieth Day of May, 2017

Michelle K. Lee
*Director of the United States Patent and Trademark Office*